United States Patent
Hatakeyama et al.

(10) Patent No.: US 11,150,557 B2
(45) Date of Patent: Oct. 19, 2021

(54) PATTERN FORMING METHOD, METHOD FOR MANUFACTURING ELECTRONIC DEVICE, MONOMER FOR PRODUCING RESIN FOR SEMICONDUCTOR DEVICE MANUFACTURING PROCESS, RESIN, METHOD FOR PRODUCING RESIN, ACTINIC RAY-SENSITIVE OR RADIATION-SENSITIVE RESIN COMPOSITION, AND ACTINIC RAY-SENSITIVE OR RADIATION-SENSITIVE FILM

(71) Applicant: FUJIFILM Corporation, Tokyo (JP)

(72) Inventors: Naoya Hatakeyama, Shizuoka (JP); Akiyoshi Goto, Shizuoka (JP); Yasunori Yonekuta, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 611 days.

(21) Appl. No.: 16/014,161

(22) Filed: Jun. 21, 2018

(65) Prior Publication Data
US 2018/0299776 A1    Oct. 18, 2018

Related U.S. Application Data

(63) Continuation of application No. PCT/JP2016/083433, filed on Nov. 10, 2016.

(30) Foreign Application Priority Data

Dec. 22, 2015  (JP) .............................. JP2015-250484
May 18, 2016  (JP) .............................. JP2016-099628

(51) Int. Cl.
*G03F 7/038*    (2006.01)
*C08F 30/04*    (2006.01)
*G03F 7/075*    (2006.01)
*G03F 7/039*    (2006.01)
*G03F 7/32*    (2006.01)
*G03F 7/20*    (2006.01)

(52) U.S. Cl.
CPC .............. *G03F 7/038* (2013.01); *C08F 30/04* (2013.01); *G03F 7/039* (2013.01); *G03F 7/0397* (2013.01); *G03F 7/075* (2013.01); *G03F 7/0758* (2013.01); *G03F 7/20* (2013.01); *G03F 7/32* (2013.01); *G03F 7/325* (2013.01)

(58) Field of Classification Search
CPC ........ G03F 7/038; G03F 7/039; G03F 7/0397; G03F 7/075; G03F 7/0758; G03F 7/32; G03F 7/325; C08F 30/08
See application file for complete search history.

(56) References Cited

U.S. PATENT DOCUMENTS

| | | | |
|---|---|---|---|
| 4,701,342 | A | 10/1987 | Novembre et al. |
| 2007/0065750 | A1 | 3/2007 | Schwab et al. |
| 2008/0131815 | A1 | 6/2008 | Kim et al. |
| 2012/0244474 | A1 | 9/2012 | Asakawa et al. |
| 2013/0023638 | A1 | 1/2013 | Furukawa et al. |
| 2018/0120706 | A1* | 5/2018 | Shirakawa .............. G03F 7/325 |

FOREIGN PATENT DOCUMENTS

| | | | |
|---|---|---|---|
| JP | 62-235943 | A | 10/1987 |
| JP | 2004-115460 | A | 4/2004 |
| JP | 2008-138203 | A | 6/2008 |
| JP | 2008-523220 | A | 7/2008 |
| JP | 2013-256658 | A | 12/2013 |
| WO | 2011/039847 | A1 | 4/2011 |
| WO | 2011/125630 | A1 | 10/2011 |
| WO | WO-2016208300 | A1 * | 12/2016 ............ C08F 212/14 |

OTHER PUBLICATIONS

Machine translation of Description of Description JPWO2016208300A1 which is a translation of the description of WO 2016/208300 A1 obtained from European Patent Office on Dec. 18, 2020, 10097 pages. (Year: 2020).*
Communication dated Dec. 5, 2019, issued by the Korean Intellectual Property Office in counterpart Korean Patent Application No. 10-2018-7017476.
Communication dated Aug. 24, 2020, issued by the Korean Intellectual Property Office in Korean Application No. 10-2018-7017476.
Communication dated Mar. 24, 2020 from the Taiwanese Patent Office in counterpart application No. 105140786.
Communication dated Jun. 23, 2020, issued by the Korean Intellectual Property Office in corresponding Korean Application No. 10-2018-7017476.
Search Report dated Feb. 7, 2017, issued by the International Searching Authority in International Application No. PCT/JP2016/083433 (PCT/ISA/210).
Written Opinion dated Feb. 7, 2017, issued by the International Searching Authority in International Application No. PCT/JP2016/083433 (PCT/ISA/237).
Office Action dated Jul. 16, 2019 by the Japanese Patent Office in counterpart Japanese Patent Application No. 2017-557784.

* cited by examiner

*Primary Examiner* — Cynthia Hamilton
(74) *Attorney, Agent, or Firm* — Sughrue Mion, PLLC

(57) ABSTRACT

Provided are a pattern forming method including a film forming step of forming a film using a resin composition containing a resin (A) obtained from a monomer having a silicon atom, the monomer having a turbidity of 1 ppm or less based on JIS K0101:1998 using formazin as a reference material and an integrating sphere measurement system as a measurement system, in which the pattern forming method is capable of remarkably improving scum defect performance, particularly in formation of an ultrafine pattern (for example, a line-and-space pattern having a line width of 50 nm or less, or a hole pattern having a hole diameter of 50 nm or less); and a method for manufacturing an electronic device, using the pattern forming method.

13 Claims, No Drawings

PATTERN FORMING METHOD, METHOD FOR MANUFACTURING ELECTRONIC DEVICE, MONOMER FOR PRODUCING RESIN FOR SEMICONDUCTOR DEVICE MANUFACTURING PROCESS, RESIN, METHOD FOR PRODUCING RESIN, ACTINIC RAY-SENSITIVE OR RADIATION-SENSITIVE RESIN COMPOSITION, AND ACTINIC RAY-SENSITIVE OR RADIATION-SENSITIVE FILM

CROSS REFERENCE TO RELATED APPLICATION

This is a continuation of International Application No. PCT/JP2016/083433 filed on Nov. 10, 2016, and claims priorities from Japanese Patent Application No. 2015-250484 filed on Dec. 22, 2015, and from Japanese Patent Application No. 2016-099628 filed on May 18, 2016, the entire disclosures of which are incorporated therein by reference.

BACKGROUND OF THE INVENTION

1. Field of the Invention

The present invention relates to a pattern forming method, a method for manufacturing an electronic device, a monomer for producing a resin for a semiconductor device manufacturing process, a resin, a method for producing a resin, an actinic ray-sensitive or radiation-sensitive resin composition, and an actinic ray-sensitive or radiation-sensitive film.

2. Description of the Related Art

In processes for manufacturing a semiconductor device such as an IC in the related art, fine processing by lithography using an actinic ray-sensitive or radiation-sensitive resin composition and the like has been carried out, and pattern forming methods using various resins have been proposed.

For example, resins having a silicon atom are known as the resin, and monomers for producing the resins are also known (see, for example, JP2004-115460A and JP2008-138203A).

SUMMARY OF THE INVENTION

As various electronic devices have recently been requested to have higher functions, there has been a demand for the manufacture of finer wirings, and correspondingly, there has also been a demand for a further improvement in the etching resistance of a pattern.

Here, in a case where a resin having a silicon atom is employed as a resin for a resist composition, it can be expected for the etching resistance for a resist pattern to be improved. However, as a result of extensive studies of the present inventors, it became apparent that in response to an increasing need for miniaturization, for example, particularly in a case of forming an ultrafine pattern (in particular, a line-and-space pattern with a line width of 50 nm or less, or a hole pattern with a hole diameter of 50 nm or less), scum defects have been apparently revealed.

Therefore, the present invention has been made in consideration of the problem, and thus, it has an object to provide a pattern forming method which is capable of remarkably improving scum defect performance, particularly in formation of an ultrafine pattern (for example, a line-and-space pattern having a line width of 50 nm or less, or a hole pattern having a hole diameter of 50 nm or less), a method for manufacturing an electronic device, a monomer for producing a resin for a semiconductor device manufacturing process, a resin, a method for producing a resin, an actinic ray-sensitive or radiation-sensitive resin composition, and an actinic ray-sensitive or radiation-sensitive film.

The present invention is configured as follows, whereby the object of the present invention is accomplished.

[1] A pattern forming method comprising a film forming step of forming a film using a resin composition containing a resin (A) obtained from a monomer having a silicon atom, the monomer having a turbidity of 1 ppm or less based on JIS K0101:1998 using formazin as a reference material and an integrating sphere measurement system as a measurement system.

[2] A pattern forming method comprising:

a film forming step of forming a film using an actinic ray-sensitive or radiation-sensitive resin composition containing a resin (A);

an exposing step of irradiating the film with actinic rays or radiation; and a developing step of developing the film irradiated with actinic rays or radiation, in which the resin (A) is a resin obtained from a monomer having a silicon atom, the monomer having a turbidity of 1 ppm or less based on JIS K0101:1998 using formazin as a reference material and an integrating sphere measurement system as a measurement system.

[3] The pattern forming method as described in [2], in which the monomer having a silicon atom and a turbidity of 1 ppm or less has a silsesquioxane structure.

[4] The pattern forming method as described in [3], in which the silsesquioxane structure is a cage type silsesquioxane structure.

[5] The pattern forming method as described in any one of [2] to [4], in which the resin (A) includes a repeating unit having an acid-decomposable group.

[6] The pattern forming method as described in any one of [2] to [5], in which the resin (A) includes a repeating unit having at least one of a lactone structure, a sultone structure, or a carbonate structure.

[7] The pattern forming method as described in any one of [2] to [6], in which the developing step is a step of carrying out development using a developer including an organic solvent.

[8] A method for manufacturing an electronic device, comprising the pattern forming method as described in any one of [2] to [7].

[9] A monomer for producing a resin for a semiconductor manufacturing process, having a silicon atom, in which the monomer has a turbidity of 1 ppm or less based on JIS K0101:1998 using formazin as a reference material and an integrating sphere measurement system as a measurement system.

[10] The monomer as described in [9], in which the resin for a semiconductor manufacturing process is a resin for a resist composition.

[11] A resin which is a polymer of the monomer as described in [9] or [10].

[12] A method for producing a resin, comprising polymerizing the monomer as described in [9] or [10].

[13] An actinic ray-sensitive or radiation-sensitive resin composition comprising the resin as described in [11].

[14] An actinic ray-sensitive or radiation-sensitive film formed using the actinic ray-sensitive or radiation-sensitive resin composition as described in [13].

According to the present invention, it is possible to provide a pattern forming method which is capable of remarkably improving scum defect performance, particularly in formation of an ultrafine pattern (for example, a line-and-space pattern having a line width of 50 nm or less, or a hole pattern having a hole diameter of 50 nm or less), a method for manufacturing an electronic device, a monomer for producing a resin for a semiconductor device manufacturing process, a resin, a method for producing a resin, an actinic ray-sensitive or radiation-sensitive resin composition, and an actinic ray-sensitive or radiation-sensitive film.

DESCRIPTION OF THE PREFERRED EMBODIMENTS

Hereinafter, suitable embodiments of the present invention will be described in detail.

In citations for a group and an atomic group in the present specification, in a case where the group or the atomic group is denoted without specifying whether it is substituted or unsubstituted, the group or the atomic group includes both a group and an atomic group not having a substituent, and a group and an atomic group having a substituent. For example, an "alkyl group" which is not denoted about whether it is substituted or unsubstituted encompasses not only an alkyl group not having a substituent (unsubstituted alkyl group), but also an alkyl group having a substituent (substituted alkyl group).

In the present invention, "actinic rays" or "radiation" means, for example, a bright line spectrum of a mercury lamp, far ultraviolet rays typified by an excimer laser, extreme ultraviolet rays (EUV light), X-rays, particle rays such as electron beams and ion beams, or the like. In addition, in the present invention, "light" means actinic rays or radiation.

Furthermore, "exposure" in the present specification encompasses, unless otherwise specified, not only exposure by a mercury lamp, far ultraviolet rays typified by an excimer laser, X-rays, extreme ultraviolet rays (EUV light), or the like, but also lithography by particle rays such as electron beams and ion beams.

In the present specification, "(meth)acrylate" means "at least one of acrylate or methacrylate". Further, "(meth)acrylic acid" means "at least one of acrylic acid or methacrylic acid".

In the present specification, a numerical range expressed using "to" means a range that includes the preceding and succeeding numerical values of "to" as the lower limit value and the upper limit value, respectively.

[Pattern Forming Method]

The pattern forming method of the present invention includes a film forming step of forming a film using a resin composition containing a resin (A) obtained from a monomer having a silicon atom, the monomer having a turbidity of 1 ppm or less based on JIS K0101:1998 using formazin as a reference material and an integrating sphere measurement system as a measurement system.

Examples of the pattern forming method of the present invention include a method in a film formed using an actinic ray-sensitive or radiation-sensitive resin composition containing a resin (A) obtained from the monomer is exposed and developed to form a pattern, and a method in which a film formed using a resin composition containing a copolymer as the resin (A) obtained using the monomer is subjected to directed self-assembly (DSA) lithography (see, for example, ACS Nano Vol. 4, No. 8, Pages 4815 to 4823) to form a pattern.

As a film forming method in the film forming step, a well-known method can be employed, and examples thereof include the method described in a step (1) in a suitable embodiment which will be described later.

The pattern forming method according to a suitable embodiment of the present invention (hereinafter also referred to as the method of the present invention) include the following three steps.

(1) A film forming step of forming a film using an actinic ray-sensitive or radiation-sensitive resin composition containing a resin (A)

(2) An exposing step of irradiating the film with actinic rays or radiation (3) A developing step of developing the film irradiated with actinic rays or radiation Here, the resin (A) is a resin obtained from a monomer having a silicon atom.

Furthermore, the monomer having a silicon atom is a monomer having a turbidity of 1 ppm or less based on JIS K0101:1998 using formazin as a reference material and an integrating sphere measurement system as a measurement system.

More specifically, the turbidity of the monomer having a silicon atom can be obtained by firstly performing calibration of an integrating sphere type turbid meter "SEP-PT-706D type" (manufactured by Mitsubishi Chemical Corporation), using a standard plate including formazin as a reference material, then preparing a 15%-by-mass ethyl acetate solution of a sample (monomer having a silicon atom), putting 5 g of the solution into a cell with a thickness of 10 mm, leaving it to stand there for 3 minutes, and measuring the turbidity using the calibrated turbid meter. The measurement is carried out at 25° C.

Now, the present inventors have discovered that by employing the resin as a resin in an actinic ray-sensitive or radiation-sensitive resin composition, scum defect performance can be remarkably improved, particularly in formation of an ultrafine pattern (for example, a line-and-space pattern having a line width of 50 nm or less, or a hole pattern having a hole diameter of 50 nm or less).

As a result, it is presumed that a certain component in a monomer having a silicon atom, which causes the turbidity to be improved, is a component that deteriorates scum defect performance, and the effect is obtained by lowering the amount of the component.

At least some of components (a crosslinked product having a silicon atom and the like) of by-products in the synthesis of the monomer having a silicon atom can be considered as a component that deteriorates scum defect performance, which is, however, not clear.

The pattern forming method of the present invention may be either a negative tone pattern forming method or a positive tone pattern forming method, but is preferably the negative tone pattern forming method using an organic developer as a developer.

Hereinafter, the respective steps of the pattern forming method of the present invention will be described.

[Step (1): Film Forming Step]

In the step (1), an actinic ray-sensitive or radiation-sensitive film (resist film) is formed using an actinic ray-sensitive or radiation-sensitive resin composition (resist composition).

The members and the materials to be used in the step (1) will be firstly described, and then the procedures of the step (1) will be described.

[Actinic Ray-Sensitive or Radiation-Sensitive Resin Composition (Resist Composition)]

The actinic ray-sensitive or radiation-sensitive resin composition (hereinafter also referred to as "the composition of the present invention" or "the resist composition of the present invention") used in the method of the present invention is typically a chemically amplified resist composition.

The resist composition of the present invention may be either a positive tone resist composition or a negative tone resist composition, and may be either a resist composition for alkali development or a resist composition for organic solvent development.

Hereinafter, the respective components contained in the composition of the present invention will be described.

[1] (A) Resin

As described above, the composition of the present invention contains the resin (A), and this resin (A) is a resin obtained from a monomer having a silicon atom, the monomer having a turbidity of 1 ppm or less based on JIS K0101:1998 using formazin as a reference material and an integrating sphere measurement system as a measurement system.

Furthermore, the present invention also relates to a monomer for producing a resin having a turbidity of 1 ppm or less for a semiconductor manufacturing process (preferably for a resist composition), a resin which is a polymer of the monomers, and a method for producing the resin.

The turbidity is preferably 0.8 ppm or less, and more preferably 0.1 ppm or less. The turbidity is usually 0.01 ppm or more.

Moreover, the monomer having a silicon atom is preferably a monomer having a purity (GPC purity) defined with areas in gel permeation chromatography (GPC) area of 95% or more. The scum defects after formation of a pattern tend to be relieved by using a monomer having a GPC purity of 95% or more.

The GPC purity is more preferably 97% or more, and still more preferably 99% or more. The GPC purity is usually 99.9% or less.

As a method for obtaining the monomer having a silicon atom with the turbidity, for example, a method in which a synthesized or commercially available monomer having a silicon atom is purified such that its turbidity reaches 1 ppm or less is preferable. As the purification method, a known purification method can be employed, and specific examples thereof include filtration, centrifugation, adsorption, liquid separation, distillation, sublimation, crystallization, and a combination of two or more thereof.

In a case of synthesizing the monomer having a silicon atom, any of known synthesis methods can be employed, but examples thereof include the methods described in JP2008-523220A and WO01/10871A.

Examples of the specific filtration method include a method in which a dispersion liquid of monomers having a silicon atom (the concentration of the solid contents is, for example, 5 to 500 g/L, and examples of a liquid constituting the dispersion liquid include propylene glycol monomethyl ether acetate (PGMEA), methyl ethyl ketone (MEK), cyclohexanone, ethyl acetate, and tetrahydrofuran (THF)) is prepared, and this dispersion liquid is filtered through a filter.

Examples of the filter used for filtration include a fluorine resin filter (a polytetrafluoroethylene (PTFE) filter, a polyvinylidene fluoride (PVDF) filter, and the like), a polysulfone resin filter, a polyamide resin filter (a nylon filter and the like), a polyethylene resin filter, and a filter containing an ion exchange resin.

The pore diameter of the filter is preferably 1.0 µm or less, more preferably 0.5 µm or less, and still more preferably 0.1 µm or less. The pore diameter of the filter is usually 0.005 µm or more.

Examples of the specific centrifugation method include a method in which a dispersion liquid of monomers having a silicon atom (the concentration of the solid contents is, for example, 5 to 500 g/L, and examples of a liquid constituting the dispersion liquid include propylene glycol monomethyl ether acetate (PGMEA), methyl ethyl ketone (MEK), cyclohexanone, ethyl acetate, and tetrahydrofuran (THF)) is prepared, and this dispersion liquid is centrifuged, for example, under the conditions of 1,000 to 600,000 (×g) and 1 to 60 (min).

Examples of the specific adsorption method include a method in which a dispersion liquid of monomers having a silicon atom (the concentration of the solid contents is, for example, 5 to 500 g/L, and examples of a liquid constituting the dispersion liquid include propylene glycol monomethyl ether acetate (PGMEA), methyl ethyl ketone (MEK), cyclohexanone, ethyl acetate, and tetrahydrofuran (THF)) is prepared, and this dispersion liquid is brought into contact with an adsorbing material.

Examples of the adsorbing material include alumina, activated carbon, FLORISIL, silica gel, and molecular sieves.

Examples of the specific liquid separation include a method in which a monomer having a silicon atom, a hydrophobic liquid such as ethyl acetate, hexane, and propylene glycol monomethyl ether acetate (PGMEA), and a hydrophilic liquid such as water, acetonitrile, and methanol are mixed and stirred, and the monomer having a silicon atom is extracted from the hydrophobic liquid.

Distillation and sublimation can be carried out by subjecting the monomer having a silicon atom to distillation and sublimation in accordance with the known method.

Examples of the crystallization include a method in which a monomer having a silicon atom is mixed with a solvent such as ethyl acetate, hexane, acetonitrile, methanol, and ethanol, and then heated to 40° C. to 80° C., and the monomer is dissolved in the liquid and then cooled to obtain a crystal of the monomer having a silicon atom.

Among these, the purification of the monomer having silicon atom preferably includes filtration.

Furthermore, in a case where the pattern forming method of the present invention is, for example, a method for forming a pattern by the application of directed self assembly (DSA) lithography, the monomer having a silicon atom can also be used as a raw material of a block copolymer for use in DSA lithography or the like.

Since the resin (A) is a resin as a polymer obtained from the monomers having a silicon atom, it has repeating units having a silicon atom, corresponding to (derived from) the monomers having a silicon atom.

Furthermore, in the present specification, a repeating unit having both of a silicon atom and an acid-decomposable group is intended to correspond to either a repeating unit having a silicon atom or a repeating unit having an acid-decomposable group. For example, a resin only including a repeating unit having both of a silicon atom and an acid-decomposable group corresponds to a resin including a repeating unit having a silicon atom and a repeating unit having an acid-decomposable group.

The repeating unit having a silicon atom and the repeating unit having an acid-decomposable group will be firstly described, and then the repeating unit (optional repeating unit) which may be included in the resin (A) will be described.

[1-1] Repeating Unit Having Silicon Atom

The repeating unit having a silicon atom is not particularly limited as long as it has a silicon atom. Examples thereof include a silane-based repeating unit ($-SiR_2-$: $R_2$ is an organic group), a siloxane-based repeating unit ($-SiR_2-O-$: $R_2$ is an organic group), a (meth)acrylate-based repeating unit having an Si atom, and a vinyl-based repeating unit having an Si atom.

The repeating unit having an Si atom may or may not have an acid-decomposable group, but it is preferable that it does not have the Si atom.

The repeating unit having a silicon atom preferably has a silsesquioxane structure. In other words, the monomer having a silicon atom preferably has a silsesquioxane structure.

Furthermore, the resin (A) may have a silsesquioxane structure in the main chain or the side chain, but it preferably has a silsesquioxane structure in the side chain.

Examples of the silsesquioxane structure include a cage type silsesquioxane structure, a ladder type silsesquioxane structure, and a random type silsesquioxane structure. Among these, the cage type silsesquioxane structure is preferable.

Here, the cage type silsesquioxane structure is a silsesquioxane structure having a cage shape skeleton. The cage type silsesquioxane structure may be either a full cage type silsesquioxane structure or a partial cage type silsesquioxane structure, with the full cage type silsesquioxane structure being preferable.

Furthermore, the ladder type silsesquioxane structure is a silsesquioxane structure having a ladder shape skeleton.

In addition, the random type silsesquioxane structure is a silsesquioxane structure having a random skeleton.

The cage type silsesquioxane structure is preferably a siloxane structure represented by Formula (S).

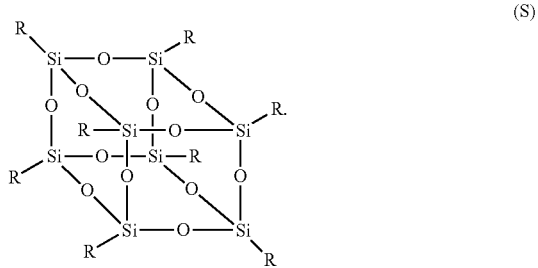

In Formula (S), R represents a monovalent substituent. R's which are present in plural numbers may be the same as or different from each other.

The substituent is not particularly limited, but specific examples thereof include a hydrogen atom, a hydroxyl group, a nitro group, a carboxyl group, an alkoxy group, an amino group, a mercapto group, a blocked mercapto group (for example, a mercapto group blocked (protected) with an acyl group), an acyl group, an imido group, a phosphino group, a phosphinyl group, a silyl group, a vinyl group, a hydrocarbon group which may have a heteroatom, a (meth)acryl group-containing group, and an epoxy group-containing group.

Examples of the halogen atom include a fluorine atom, a chlorine atom, a bromine atom, and an iodine atom.

Examples of the heteroatom of the hydrocarbon group which may have the heteroatom include an oxygen atom, a nitrogen atom, a sulfur atom, and a phosphorus atom.

Examples of the hydrocarbon group in the hydrocarbon group which may have the heteroatom include an aliphatic hydrocarbon group, an aromatic hydrocarbon group, and a group formed by combination thereof.

The aliphatic hydrocarbon group may be linear, branched, or cyclic. Specific examples of the aliphatic hydrocarbon group include a linear or branched alkyl group (in particular, having 1 to 30 carbon atoms), a linear or branched alkenyl group (in particular, having 2 to 30 carbon atoms), and a linear or branched alkynyl group (in particular, having 2 to 30 carbon atoms).

Examples of the aromatic hydrocarbon group include an aromatic hydrocarbon group having 6 to 18 carbon atoms, such as a phenyl group, a tolyl group, a xylyl group, and a naphthyl group.

The repeating unit having a silicon atom is preferably represented by Formula (I).

In Formula (I), L represents a single bond or a divalent linking group.

Examples of the divalent linking group include an alkylene group, a $-COO-Rt-$ group, and an $-O-Rt-$ group. In the formula, Rt represents an alkylene group or a cycloalkylene group.

L is preferably a single bond or a $-COO-Rt-$ group. Rt is preferably an alkylene group having 1 to 5 carbon atoms, and more preferably a $-CH_2-$ group, a $-(CH_2)_2-$ group, or a $-(CH_2)_3-$ group.

In Formula (I), X represents a hydrogen atom or an organic group.

Examples of the organic group include an alkyl group having a substituent such as a fluorine atom and a hydroxyl group, and the organic group is preferably a hydrogen atom, a methyl group, a trifluoromethyl group, or a hydroxymethyl group.

In Formula (I), A represents an Si-containing group. Among those, a group represented by Formula (a) or (b) is preferable.

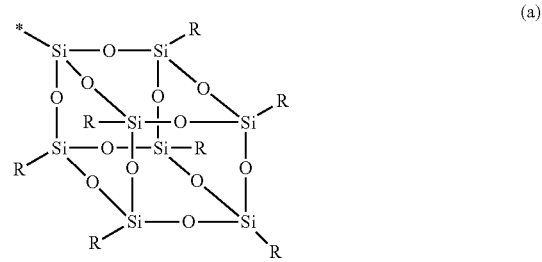

In Formula (a), R represents a monovalent substituent. R's which are present in plural numbers may be the same as or different from each other. Specific examples and suitable embodiments thereof are the same as for Formula (S). In a case where A in Formula (I) is a group represented by Formula (a), Formula (I) is represented by Formula (I-a).

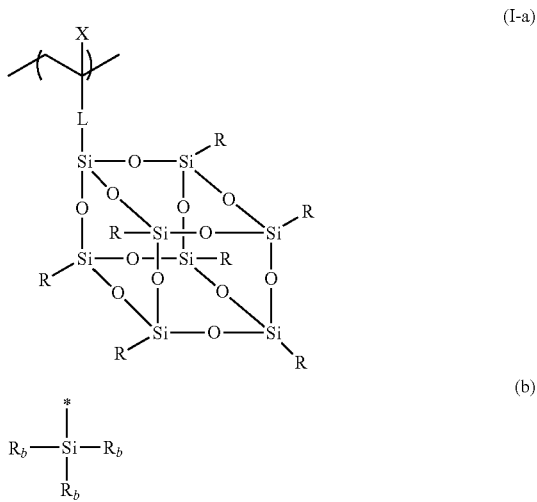

(I-a)

(b)

In Formula (b), $R_b$ represents a hydrocarbon group which may have a heteroatom. Specific examples and suitable embodiments of the hydrocarbon group which may have a heteroatom are the same as for R in Formula (S) as described above.

The repeating unit having a silicon atom included in the resin (A) may be used singly or in combination of two or more kinds thereof.

The content of the repeating unit having a silicon atom with respect to all the repeating units of the resin (A) is not particularly limited, but is preferably 1% to 70% by mole, and more preferably 3% to 50% by mole.

[1-2] Repeating Unit Having Acid-Decomposable Group

The resin (A) preferably includes a repeating unit having an acid-decomposable group. It is preferable that the repeating unit having an acid-decomposable group does not have a silicon atom.

Here, the acid-decomposable group refers to a group capable of decomposing by the action of an acid to generate a polar group.

The acid-decomposable group preferably has a structure in which a polar group is protected with a group (leaving group) capable of decomposing by the action of an acid to leave.

The polar group is not particularly limited as long as it is a group that is poorly soluble or insoluble in a developer including an organic solvent, and examples thereof include an acidic group (a group that dissociates in a 2.38%-by-mass aqueous tetramethylammonium hydroxide solution which has been used as a developer in a resist in the related art) such as a phenolic hydroxyl group, a carboxyl group, a fluorinated alcohol group (preferably a hexafluoroisopropanol group), a sulfonic acid group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, and a tris(alkylsulfonyl)methylene group, and an alcoholic hydroxyl group.

Furthermore, the alcoholic hydroxyl group refers to a hydroxyl group bonded to a hydrocarbon group, which is a hydroxyl group other than a hydroxyl group (phenolic hydroxyl group) directly bonded to an aromatic ring, from which an aliphatic alcohol (for example, a fluorinated alcohol group (a hexafluoroisopropanol group or the like)) having the α-position substituted with an electron withdrawing group such as a fluorine atom is excluded as a hydroxyl group. The alcoholic hydroxyl group is preferably a hydroxyl group having an acid dissociation constant (pKa) from 12 to 20.

Preferred examples of the polar group include a carboxyl group, a fluorinated alcohol group (preferably a hexafluoroisopropanol group), and a sulfonic acid group.

A group which is preferable as the acid-decomposable group is a group in which a hydrogen atom of the polar group is substituted with a group that leaves by the action of an acid.

Examples of the group (leaving group) that leaves by an acid include —C($R_{36}$)($R_{37}$)($R_{38}$), —C($R_{36}$)($R_{37}$)(OR$_{39}$), and —C($R_{01}$)($R_{02}$)(OR$_{39}$).

In the formulae, $R_{36}$ to $R_{39}$ each independently represent an alkyl group, a cycloalkyl group, an aryl group, an aralkyl group, or an alkenyl group. $R_{36}$ and $R_{37}$ may be bonded to each other to form a ring.

$R_{01}$ and $R_{02}$ each independently represent a hydrogen atom, an alkyl group, a cycloalkyl group, an aryl group, an aralkyl group, or an alkenyl group.

As the alkyl group as each of $R_{36}$ to $R_{39}$, $R_{01}$, and $R_{02}$, an alkyl group having 1 to 8 carbon atoms is preferable, and examples thereof include a methyl group, an ethyl group, a propyl group, an n-butyl group, a sec-butyl group, a hexyl group, and an octyl group.

A cycloalkyl group as each of $R_{36}$ to $R_{39}$, $R_{01}$, and $R_{02}$ may be a monocyclic cycloalkyl group or a polycyclic cycloalkyl group. As the monocyclic cycloalkyl group, a cycloalkyl group having 3 to 8 carbon atoms is preferable, and examples thereof include a cyclopropyl group, a cyclobutyl group, a cyclopentyl group, a cyclohexyl group, and a cyclooctyl group. As the polycyclic cycloalkyl group, a cycloalkyl group having 6 to 20 carbon atoms is preferable, and examples thereof include an adamantyl group, a norbornyl group, an isobornyl group, a camphonyl group, a dicyclopentyl group, an α-pinanyl group, a tricyclodecanyl group, a tetracyclododecyl group, and an androstanyl group. Further, at least one carbon atom in the cycloalkyl group may be substituted with heteroatoms such as an oxygen atom.

An aryl group as each of $R_{36}$ to $R_{39}$, $R_{01}$, and $R_{02}$ is preferably an aryl group having 6 to 10 carbon atoms, and examples thereof include a phenyl group, a naphthyl group, and an anthryl group.

An aralkyl group as each of $R_{36}$ to $R_{39}$, $R_{01}$, and $R_{02}$ is preferably an aralkyl group having 7 to 12 carbon atoms, and examples thereof include a benzyl group, a phenethyl group, and a naphthylmethyl group.

An alkenyl group as each of $R_{36}$ to $R_{39}$, $R_{01}$, and $R_{02}$ is preferably an alkenyl group having 2 to 8 carbon atoms, and examples thereof include a vinyl group, an allyl group, a butenyl group, and a cyclohexenyl group.

A ring formed by the bonding of $R_{36}$ and $R_{37}$ is preferably a (monocyclic or polycyclic) cycloalkyl group. As the cycloalkyl group, monocyclic cycloalkyl groups such as a cyclopentyl group and a cyclohexyl group, and polycyclic cycloalkyl groups such as a norbornyl group, a tetracyclodecanyl group, a tetracyclododecanyl group, and an adamantyl group are preferable, monocyclic cycloalkyl groups having 5 or 6 carbon atoms are more preferable, and monocyclic cycloalkyl groups having 5 carbon atoms are particularly preferable.

The acid-decomposable group is preferably a cumyl ester group, an enol ester group, an acetal group, an acetal ester group, a tertiary alkyl ester group, or the like, and more preferably a tertiary alkyl ester group.

The resin (A) preferably has a repeating unit represented by General Formula (AI) as the repeating unit having an acid-decomposable group. The repeating unit represented by General Formula (AI) generates a carboxyl group as a polar group by the action of an acid, and exhibits a high interaction by a hydrogen bond in a plurality of carboxyl groups, and as a result, in case of forming a negative tone pattern, it is possible to more reliably make the pattern be poorly soluble or insoluble in a developer including an organic solvent.

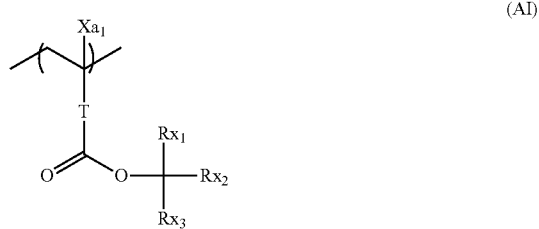

(AI)

In General Formula (AI), $Xa_1$ represents a hydrogen atom, an alkyl group, a cyano group, or a halogen atom.

T represents a single bond or a divalent linking group.

$Rx_1$ to $Rx_3$ each independently represent an alkyl group or a cycloalkyl group.

Two of $Rx_1$ to $Rx_3$ may be bonded to each other to form a ring structure.

Examples of the divalent linking group of T include an alkylene group, a —COO-Rt- group, an —O-Rt- group, and a phenylene group. In the formula, Rt represents an alkylene group or a cycloalkylene group.

T is preferably a single bond or a —COO-Rt- group. Rt is preferably an alkylene group having 1 to 5 carbon atoms, and more preferably a —$CH_2$— group, a —$(CH_2)_2$— group, or a —$(CH_2)_3$— group. T is more preferably a single bond.

The alkyl group of $Xa_1$ may have a substituent, and examples of the substituent include a hydroxyl group and a halogen atom (preferably a fluorine atom).

The alkyl group of $Xa_1$ is preferably an alkyl group having 1 to 4 carbon atoms, and examples thereof include a methyl group, an ethyl group, a propyl group, a hydroxymethyl group, and a trifluoromethyl group, with a methyl group being preferred.

$Xa_1$ is preferably a hydrogen atom or a methyl group.

The alkyl group of each of $Rx_1$, $Rx_2$, and $Rx_3$ may be linear or branched, and preferred examples thereof include a methyl group, an ethyl group, an n-propyl group, an isopropyl group, an n-butyl group, an isobutyl group, and a t-butyl group. The number of carbon atoms of the alkyl group is preferably 1 to 10, and more preferably 1 to 5.

The cycloalkyl group of each of $Rx_1$, $Rx_2$, and $Rx_3$ is preferably a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group.

As the ring structure formed by the bonding of two of $Rx_1$, $Rx_2$, and $Rx_3$, a monocyclic cycloalkane ring such as a cyclopentyl group and a cyclohexyl group, and a polycyclic cycloalkyl group such as a norbornyl group, a tetracyclodecanyl group, a tetracyclododecanyl group, and an adamantyl group are preferable, and a monocyclic cycloalkane ring having 5 or 6 carbon atoms is particularly preferable.

$Rx_1$, $Rx_2$, and $Rx_3$ are each independently preferably an alkyl group, and more preferably a linear or branched alkyl group having 1 to 4 carbon atoms.

Each of the groups may have a substituent, and examples of the substituent include an alkyl group (having 1 to 4 carbon atoms), a cycloalkyl group (having 3 to 8 carbon atoms), a halogen atom, an alkoxy group (having 1 to 4 carbon atoms), a carboxyl group, and an alkoxycarbonyl group (having 2 to 6 carbon atoms), with the groups having 8 or less carbon atoms being preferable. Among those, from the viewpoint of increasing a dissolution contrast for a developer including an organic solvent before and after acid decomposition, the substituent is more preferably a substituent not having a heteroatom such as an oxygen atom, a nitrogen atom, and a sulfur atom (for example, a substituent other than an alkyl group substituted with a hydroxyl group is more preferable), still more preferably a group composed only of a hydrogen atom and a carbon atom, and particularly preferably a linear or branched alkyl group or a cycloalkyl group.

In General Formula (AI), $Rx_1$ to $Rx_3$ are each independently an alkyl group, and it is preferable that two of $Rx_1$ to $Rx_3$ are not bonded to each other to form a ring structure. Thus, there is tendency that an increase in the volume of a group represented by —$C(Rx_1)(Rx_2)(Rx_3)$ as the group capable of decomposing by the action of an acid to leave can be suppressed, and a decrease in the volume of the exposed area can be suppressed in an exposing step and a post-exposure heating step that may be carried out after the exposing step.

Specific examples of the repeating unit represented by General Formula (AI) are set forth below, but the present invention is not limited to such specific examples.

In specific examples, Rx represents a hydrogen atom, $CH_3$, $CF_3$, or $CH_2OH$. Rxa and Rxb each independently represent an alkyl group (preferably an alkyl group having 1 to 10 carbon atoms, and more preferably an alkyl group having 1 to 5 carbon atoms). $Xa_1$ represents a hydrogen atom, $CH_3$, $CF_3$, or $CH_2OH$. Z represents a substituent, and in a case where a plurality of Z's are present, the plurality of Z's may be the same as or different from each other. p represents 0 or a positive integer. Specific examples and preferred examples of Z are the same as the specific examples and the preferred examples of the substituent which may be contained in the respective groups such as $Rx_1$ to $Rx_3$.

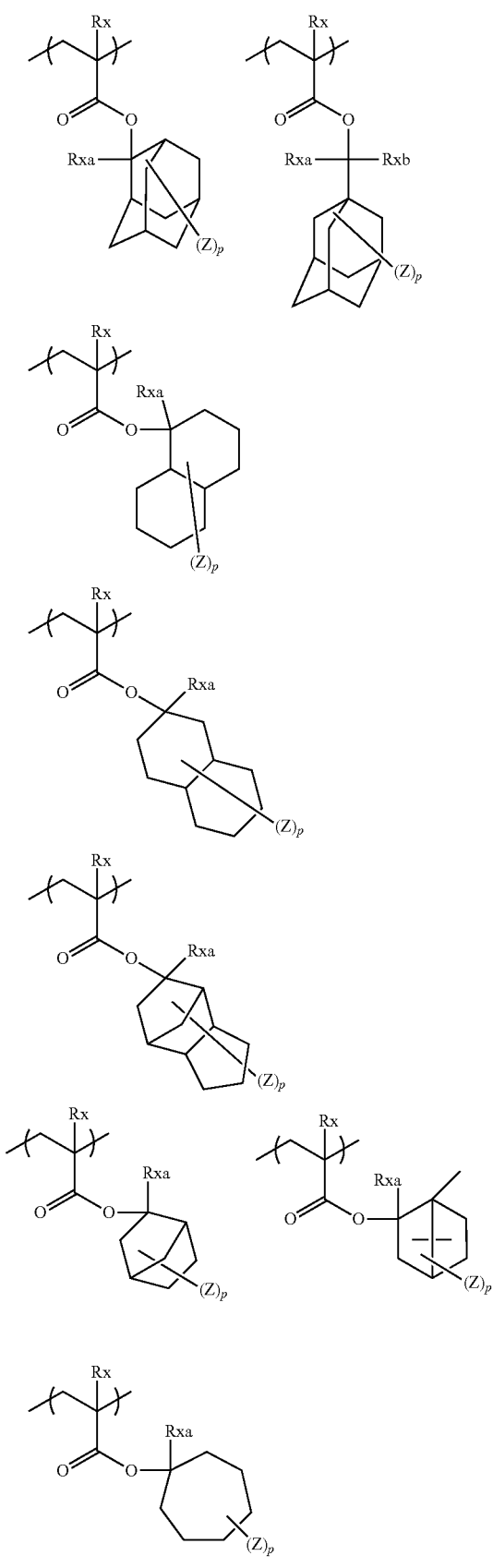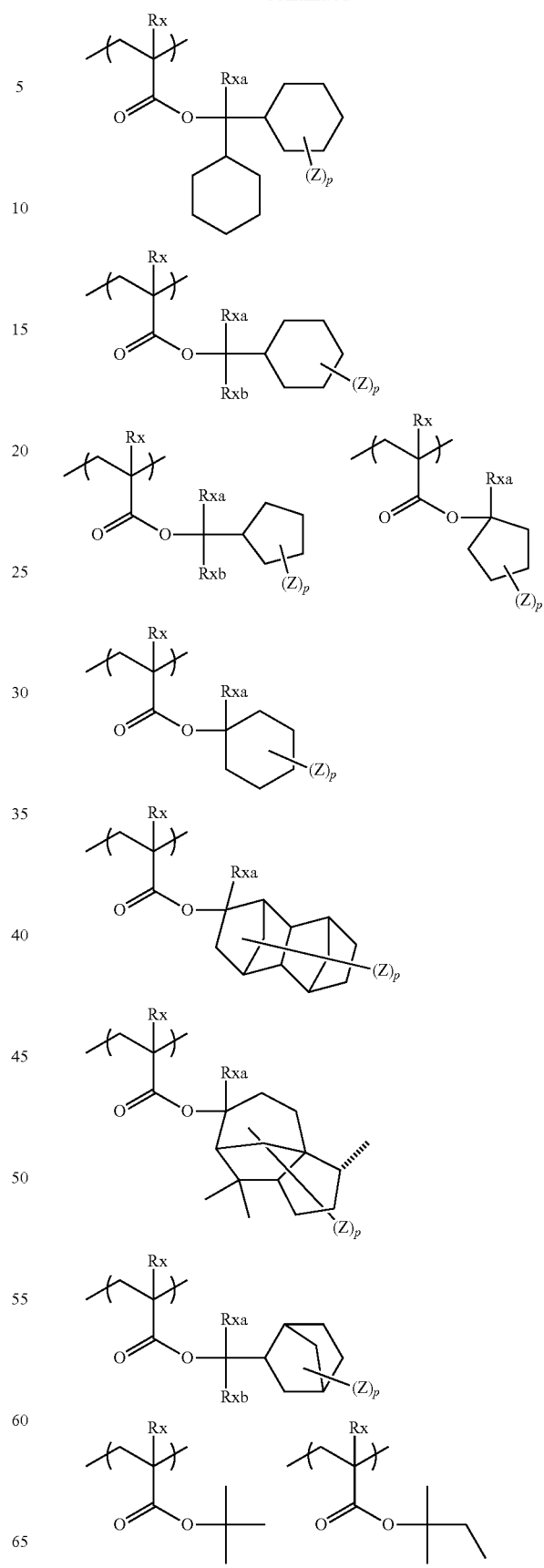

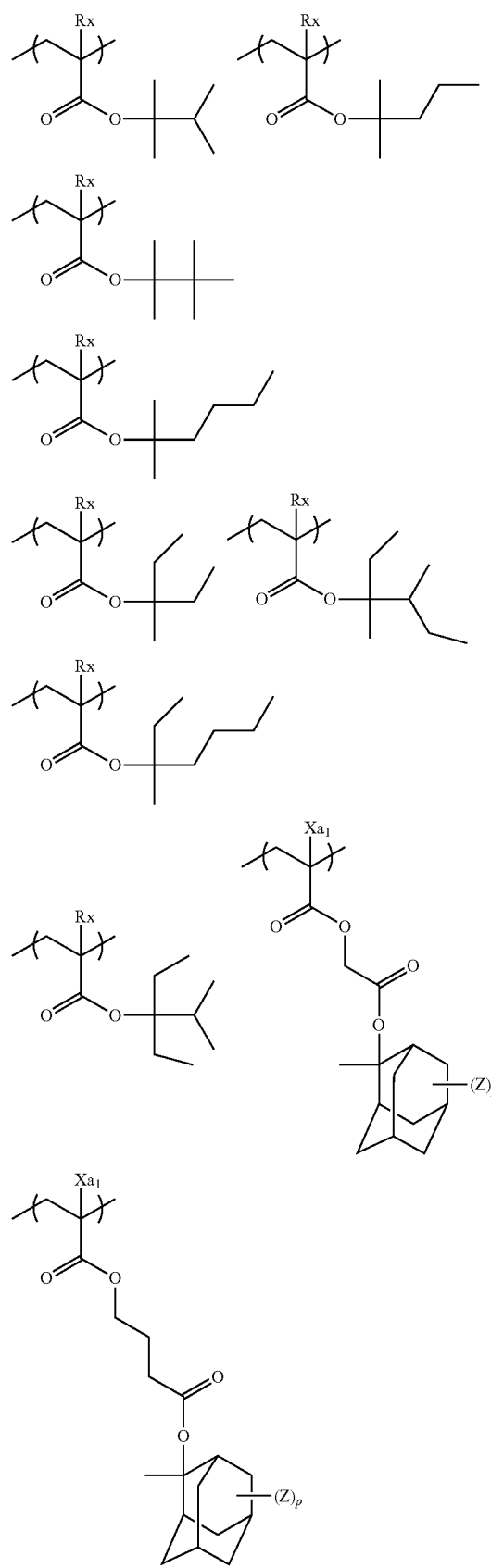
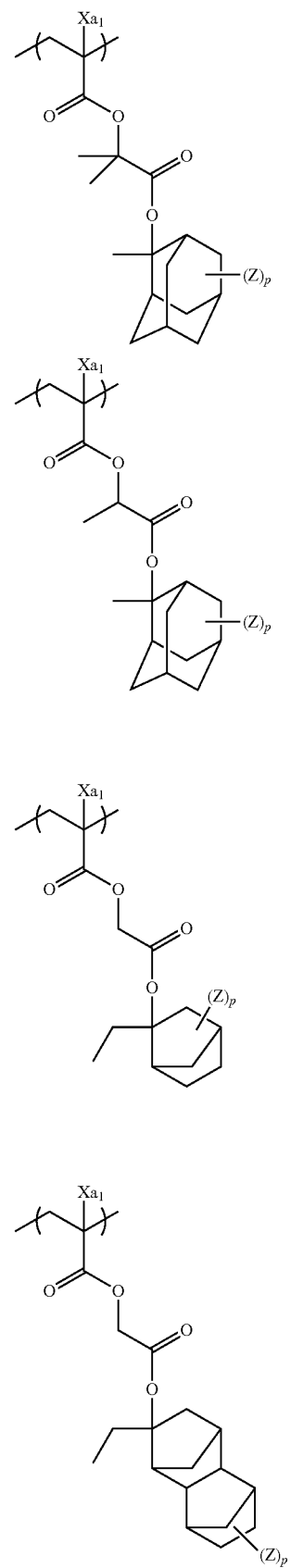

-continued

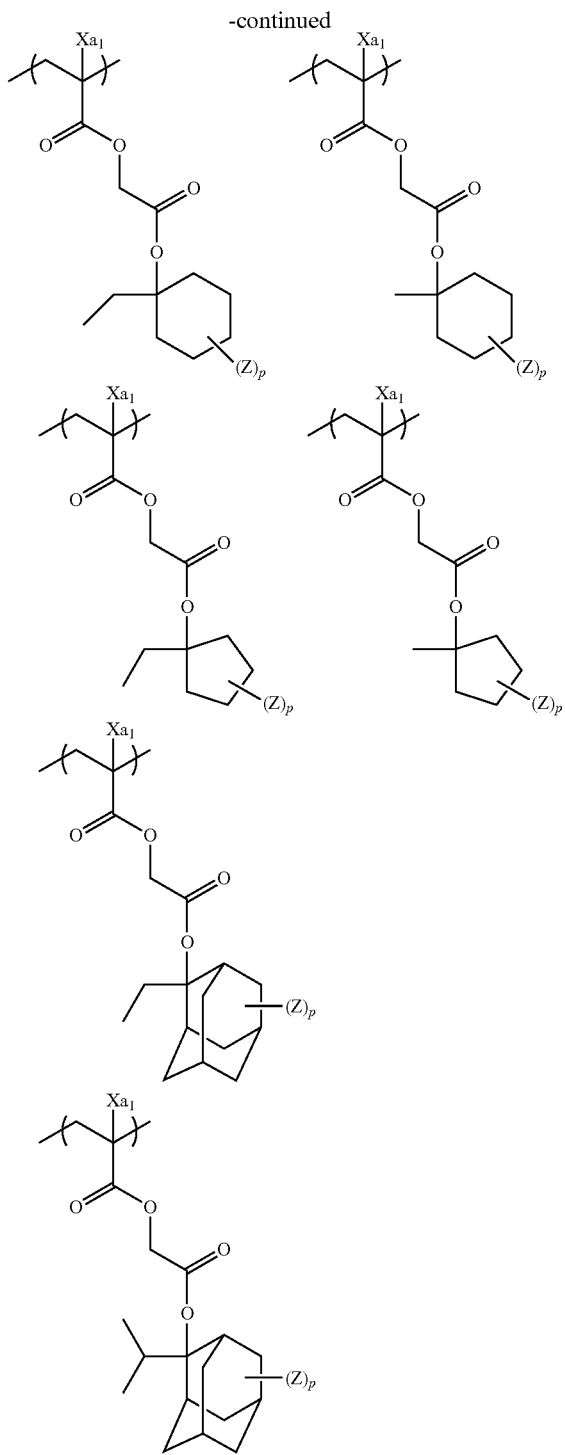

Furthermore, it is also preferable that the resin (A) has the repeating unit described in paragraphs [0057] to [0071] of JP2014-202969A as the repeating unit having an acid-decomposable group.

In addition, the resin (A) may also have the repeating unit having an alcoholic hydroxyl group described in paragraphs [0072] and [0073] of JP2014-202969A as the repeating unit having an acid-decomposable group.

The repeating unit having an acid-decomposable group may be used singly or in combination of two or more kinds thereof.

The content of the repeating units having an acid-decomposable group included in the resin (A) (a total of the contents in a case where the repeating units having an acid-decomposable group are present in plural numbers) is preferably 20% to 90% by mole, and more preferably 40% to 80% by mole, with respect to all the repeating units in the resin (A). Among these, it is preferable that the resin (A) has the repeating unit represented by General Formula (AI), and the content of the repeating unit represented by General Formula (AI) with respect to all the repeating units of the resin (A) is 40% by mole or more.

It is also preferable that the resin (A) includes a repeating unit having at least one of a lactone structure, a sultone structure, or a carbonate structure.

As the lactone structure or sultone structure, any structure may be used as long as it has a lactone structure or sultone structure, but the structure is preferably a 5- to 7-membered ring lactone structure or a 5- to 7-membered ring sultone structure, and more preferably a 5- to 7-membered ring lactone structure to which another ring structure is fused in the form of forming a bicyclo structure or a spiro structure or a 5- to 7-membered ring sultone structure to which another ring structure is fused in the form of forming a bicyclo structure or a spiro structure. The resin (A) still more preferably has a repeating unit having a lactone structure represented by any one of General Formulae (LC1-1) to (LC1-21), or a sultone structure represented by any one of General Formulae (SL1-1) to (SL1-3). Further, the lactone structure or sultone structure may be bonded directly to the main chain. The lactone structure is preferably (LC1-1), (LC1-4), (LC1-5), (LC1-6), (LC1-13), (LC1-14), or (LC1-17), and the lactone structure is particularly preferably (LC1-4). By using such a specific lactone structure, LER and development defects are relieved.

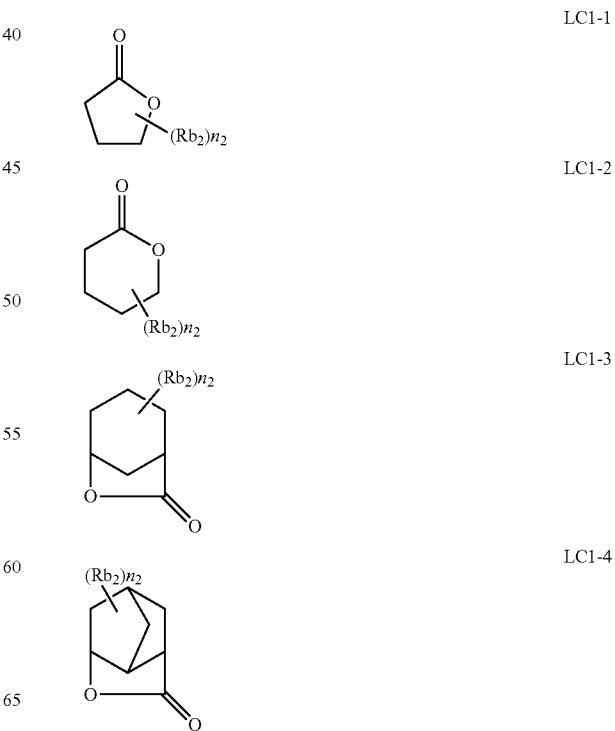

LC1-5 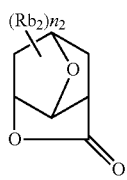
LC1-6 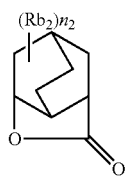
LC1-7 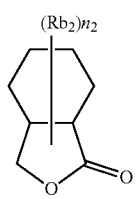
LC1-8 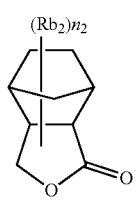
LC1-9 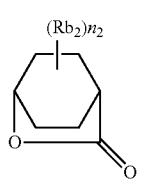
LC1-10 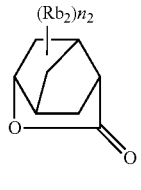
LC1-11 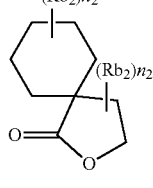
LC1-12 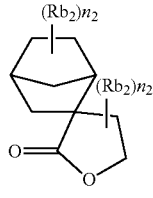
LC1-13 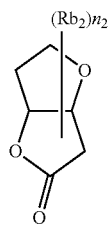
LC1-14 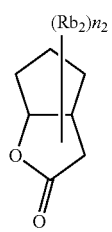
LC1-15 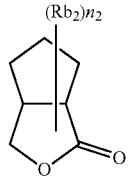
LC1-16 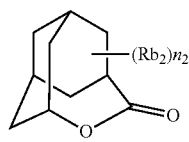
LC1-17 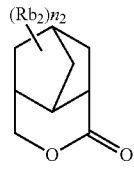
LC1-18 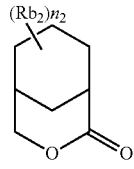
LC1-19 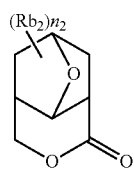
LC1-20 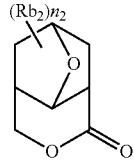

LC1-21
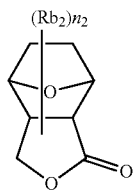

SL1-1
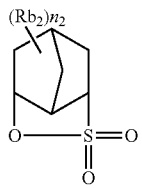

SL1-2
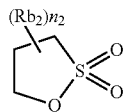

SL1-3
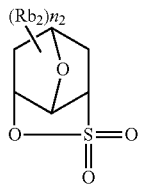

The lactone structure moiety or the sultone structure moiety may or may not have a substituent (Rb$_2$). Preferred examples of the substituent (Rb$_2$) include an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxyl group, a halogen atom, a hydroxyl group, a cyano group, and an acid-decomposable group. Among these, an alkyl group having 1 to 4 carbon atoms, a cyano group, and an acid-decomposable group are more preferable. n$_2$ represents an integer of 0 to 4. In a case where n$_2$ is 2 or more, the substituents (Rb$_2$) which are present in plural numbers may be the same as or different from each other. Further, the substituents (Rb$_2$) which are present in plural numbers may be bonded to each other to form a ring.

The repeating unit having a lactone structure or sultone structure usually has an optical isomer, and any optical isomer may be used. Further, one kind of optical isomer may be used singly or a plurality of optical isomers may be mixed and used. In a case of mainly using one kind of optical isomer, the optical purity (ee) thereof is preferably 90% or more, and more preferably 95% or more.

The repeating unit having a lactone structure or sultone structure is preferably a repeating unit represented by General Formula (III).

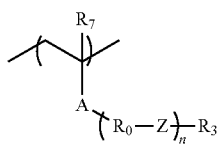
(III)

In General Formula (III),

A represents an ester bond (a group represented by —COO—) or an amide bond (a group represented by —CONH—).

In a case where R$_0$'s are present in plural numbers, they each independently represent an alkylene group, a cycloalkylene group, or a combination thereof.

In a case where Z's are present in plural numbers, they each independently represent a single bond, an ether bond, an ester bond, an amide bond, a urethane bond (a group represented by $-O-\overset{\overset{\displaystyle O}{\|}}{C}-\overset{R}{N}-$ or $-\overset{R}{N}-\overset{\overset{\displaystyle O}{\|}}{C}-O-$)

or a urea bond (a group represented by $-\overset{R}{N}-\overset{\overset{\displaystyle O}{\|}}{C}-\overset{R}{N}-$).

Here, R's each independently represent a hydrogen atom, an alkyl group, a cycloalkyl group, or an aryl group.

R$_8$ represents a monovalent organic group having a lactone structure or sultone structure.

n is the repetition number of the structure represented by —R$_0$—Z—, represents an integer of 0 to 5, and is preferably 0 or 1, and more preferably 0. In a case where n is 0, —R$_0$—Z— is not present, leading to a single bond.

R$_7$ represents a hydrogen atom, a halogen atom, or an alkyl group.

The alkylene group or the cycloalkylene group of R$_0$ may have a substituent.

Z is preferably an ether bond or an ester bond, and particularly preferably an ester bond.

The alkyl group of R$_7$ is preferably an alkyl group having 1 to 4 carbon atoms, more preferably a methyl group or an ethyl group, and particularly preferably a methyl group.

The alkylene group or the cycloalkylene group of R$_0$, and the alkyl group in R$_7$ may be each substituted, and examples of the substituent include a halogen atom such as a fluorine atom, a chlorine atom, and a bromine atom, a mercapto group, a hydroxyl group, an alkoxy group such as a methoxy group, an ethoxy group, an isopropoxy group, a t-butoxy group, and a benzyloxy group, and an acyloxy group such as an acetyloxy group and a propionyloxy group.

R$_7$ is preferably a hydrogen atom, a methyl group, a trifluoromethyl group, or a hydroxymethyl group.

The preferred chained alkylene group in R$_0$ is chained alkylene, preferably having 1 to 10 carbon atoms, and more preferably having 1 to 5 carbon atoms, and examples thereof include a methylene group, an ethylene group, and a propylene group. Preferred examples of the cycloalkylene group include a cycloalkylene group having 3 to 20 carbon atoms, and examples thereof include a cyclohexylene group, a cyclopentylene group, a norbornylene group, and an adamantylene group. In order to express the effects of the present invention, a chained alkylene group is more preferable, and a methylene group is particularly preferable.

The monovalent organic group having a lactone structure or sultone structure represented by Rx is not limited as long as it has the lactone structure or sultone structure, specific examples thereof include a lactone structure or sultone structure represented by any one of General Formulae (LC1-1) to (LC1-21), and (SL1-1) to (SL1-3), and among these, the structure represented by (LC1-4) is particularly preferable. Further, $n_2$ in (LC1-1) to (LC1-21) is more preferably 2 or less.

Furthermore, $R_8$ is preferably a monovalent organic group having an unsubstituted lactone structure or sultone structure, or a monovalent organic group having a lactone structure or sultone structure having a methyl group, a cyano group, or an alkoxycarbonyl group as a substituent, and more preferably a monovalent organic group having a lactone structure having a cyano group as a substituent (cyanolactone).

Specific examples of the repeating unit having a group having a lactone structure or sultone structure are set forth below, but the present invention is not limited thereto.

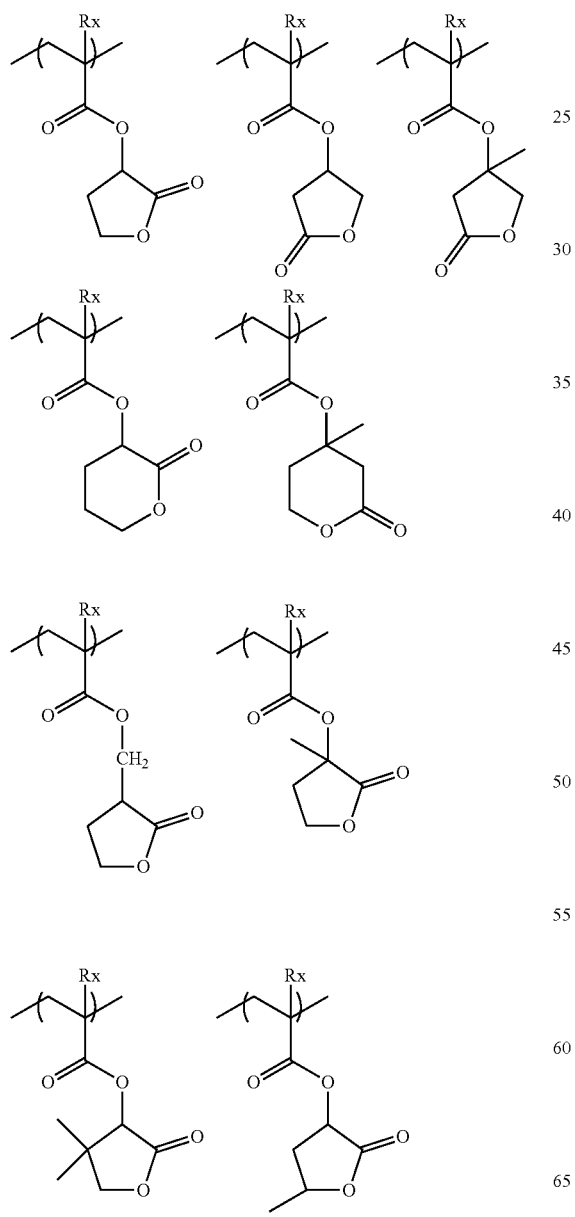

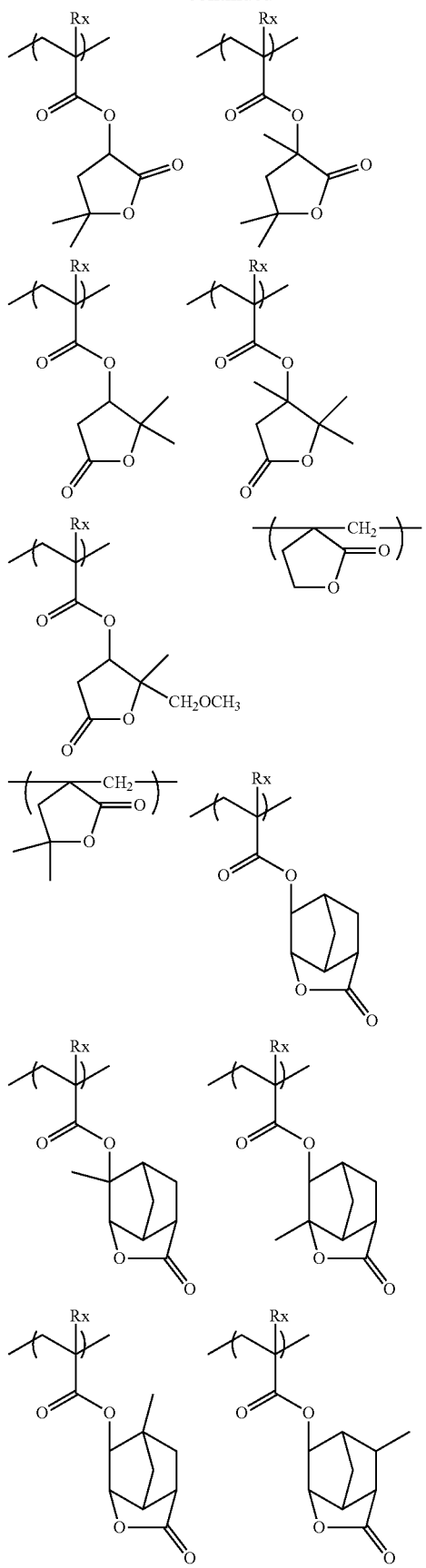

-continued

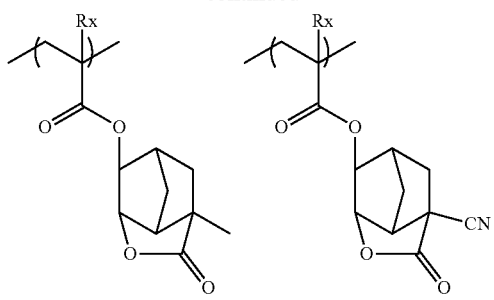
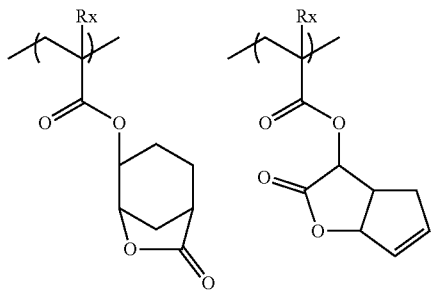
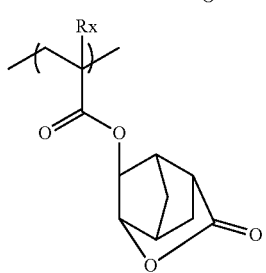
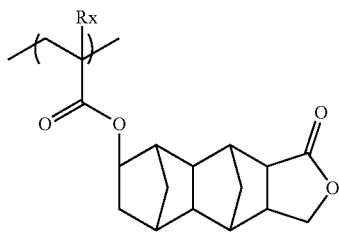
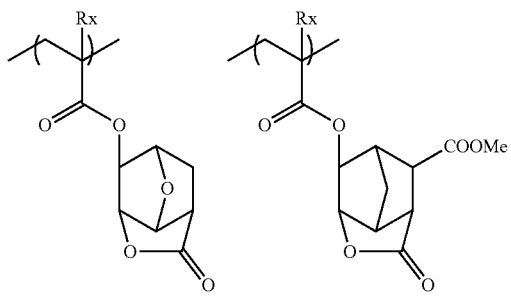
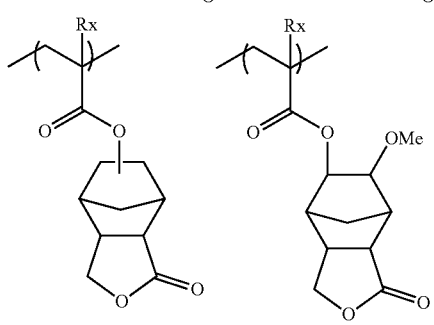
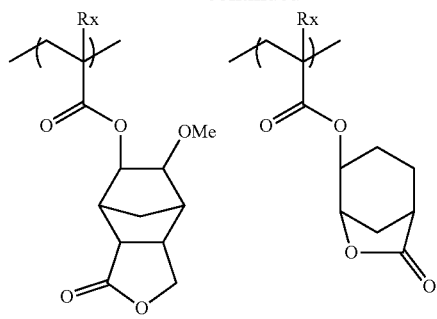
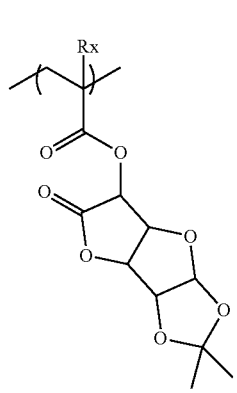
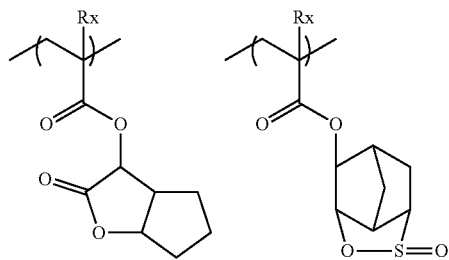
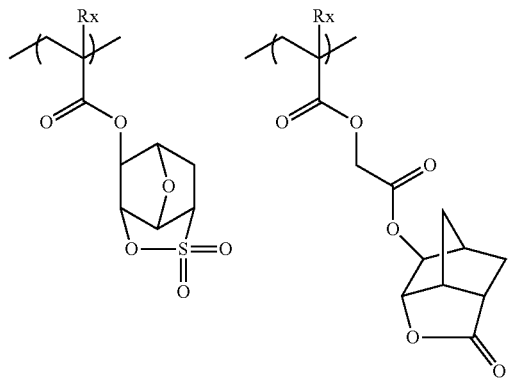

27
-continued
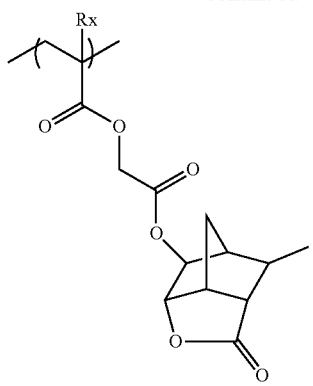
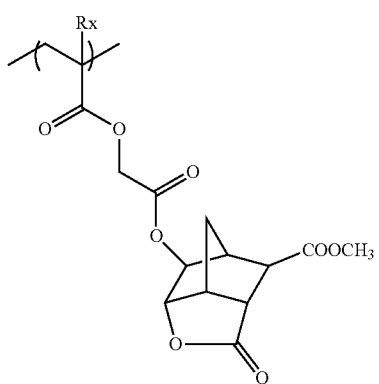
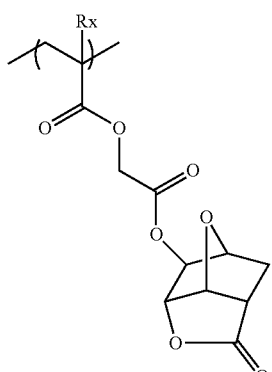
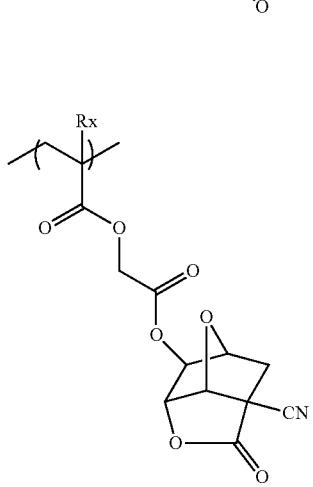
28
-continued
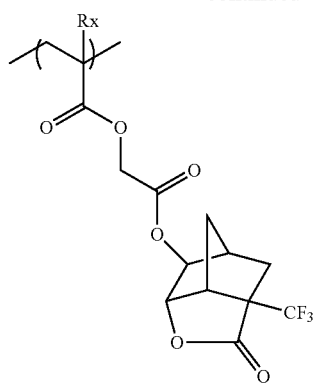
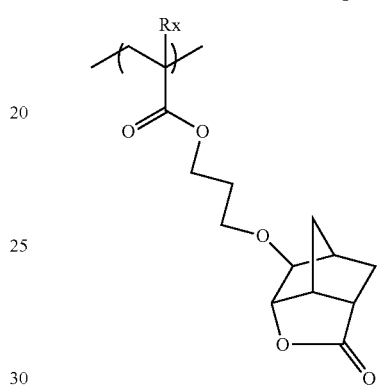
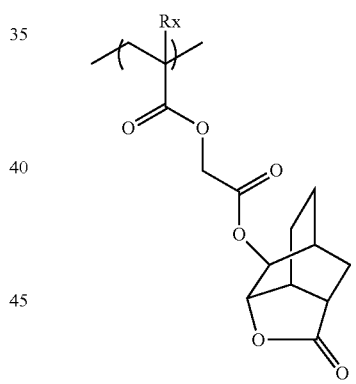
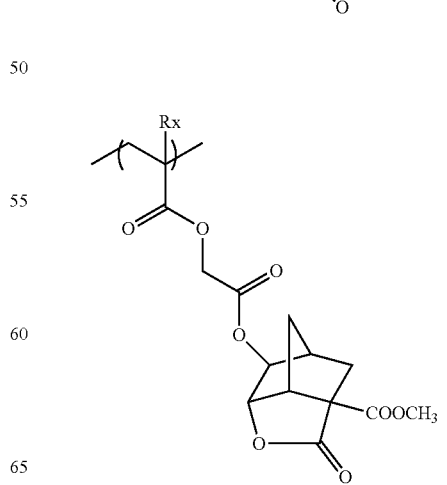

-continued

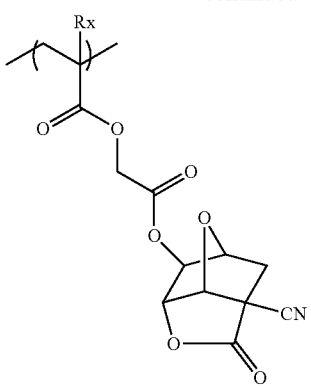
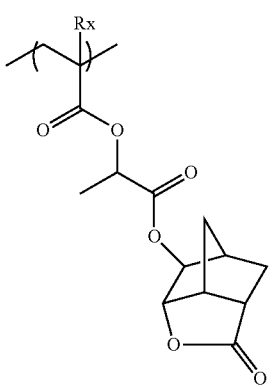
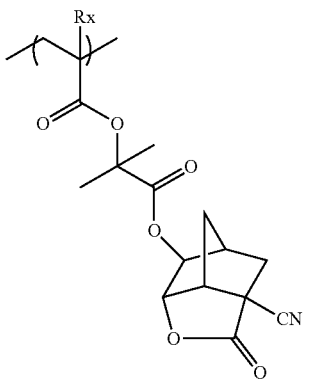
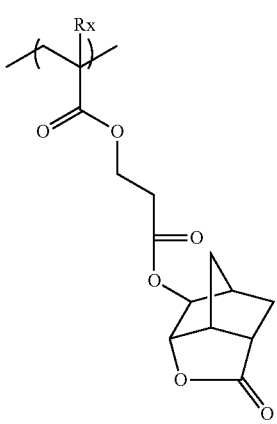

-continued

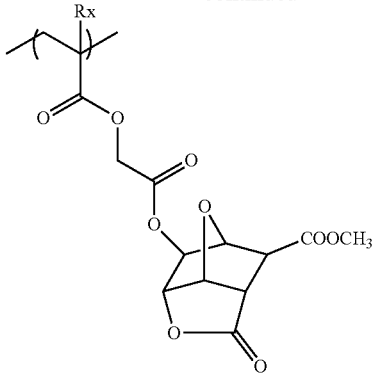
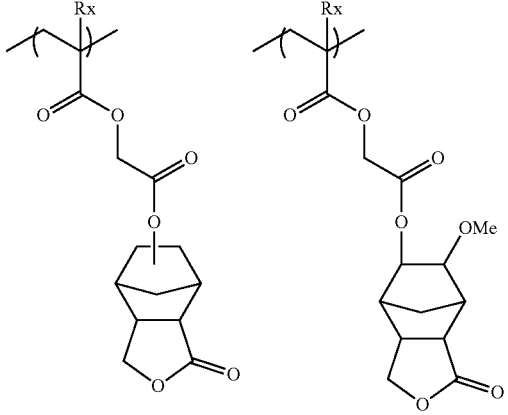

(In the formulae, Rx represents H, CH$_3$, CH$_2$OH, or CF$_3$.)

In order to enhance the effects of the present invention, it is also possible to use a combination of two or more kinds of repeating units having a lactone structure or sultone structure.

In a case where the resin (A) contains a repeating unit having a lactone structure or sultone structure, the content of the repeating unit having a lactone structure or sultone structure is preferably 5% to 60% by mole, more preferably 5% to 55% by mole, and still more preferably 10% to 50% by mole, with respect to all the repeating units in the resin (A).

Moreover, the resin (A) may have a repeating unit having a carbonate structure (cyclic carbonic acid ester structure).

The repeating unit having a cyclic carbonic acid ester structure is preferably a repeating unit represented by General Formula (A-1).

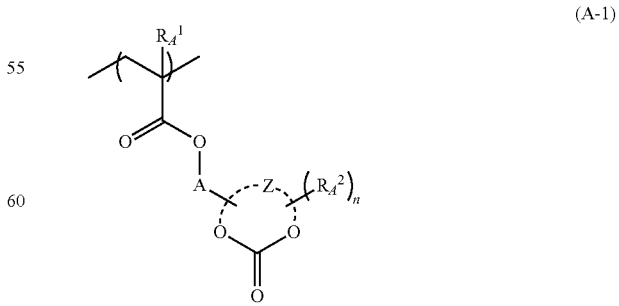

(A-1)

In General Formula (A-1), $R_A^1$ represents a hydrogen atom or an alkyl group.

In a case where n is 2 or more, $R_A^2$'s each independently represent a substituent.

A represents a single bond or a divalent linking group.

Z represents an atomic group which forms a monocyclic or polycyclic structure together with a group represented by —O—C(=O)—O— in the formula.

n represents an integer of 0 or more.

General Formula (A-1) will be described in detail.

The alkyl group represented by $R_A^1$ may have a substituent such as a fluorine atom.

$R_A^1$ is preferably a hydrogen atom, a methyl group, or a trifluoromethyl group, and more preferably a methyl group.

The substituent represented by $R_A^2$ is, for example, an alkyl group, a cycloalkyl group, a hydroxyl group, an alkoxy group, an amino group, or an alkoxycarbonylamino group. The substituent is preferably an alkyl group having 1 to 5 carbon atoms, and examples thereof include a linear alkyl group having 1 to 5 carbon atoms, such as a methyl group, an ethyl group, a propyl group, and a butyl group, and a branched alkyl group having 3 to 5 carbon atoms, such as an isopropyl group, an isobutyl group, and a t-butyl group. The alkyl group may have a substituent such as a hydroxyl group.

n is an integer of 0 or more, which represents the number of substituents. For example, n is preferably 0 to 4, and more preferably 0.

Examples of the divalent linking group represented by A include an alkylene group, a cycloalkylene group, an ester bond, an amide bond, an ether bond, a urethane bond, a urea bond, and combinations thereof. As the alkylene group, an alkylene group having 1 to 10 carbon atoms is preferable, an alkylene group having 1 to 5 carbon atoms is more preferable, and examples thereof include a methylene group, an ethylene group, and a propylene group.

In one embodiment of the present invention, A is preferably a single bond or an alkylene group.

Examples of a monocycle including —O—C(=O)—O—, which is represented by Z, include a 5- to 7-membered ring having $n_A$ of 2 to 4, in the cyclic carbonic acid ester represented by the following General Formula (a), and the monocycle is preferably a 5-membered ring or a 6-membered ring ($n_A$=2 or 3), and more preferably a 5-membered ring ($n_A$=2).

Examples of a polycycle including —O—C(=O)—O—, which is represented by Z, include a structure in which a fused ring is formed by cyclic carbonic acid ester represented by the following General Formula (a) together with one or two more other ring structures or a structure in which a spiro ring is formed. "Other ring structures" capable of forming a fused ring or a spiro ring may be an alicyclic hydrocarbon group, may be an aromatic hydrocarbon group, or may be a heterocycle.

(a)

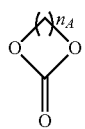

The monomer corresponding to the repeating unit represented by General Formula (A-1) can be synthesized by, for example, the method known in the related art described in Tetrahedron Letters, Vol. 27, No. 32 p. 3741 (1986), Organic Letters, Vol. 4, No. 15, p. 2561 (2002), or the like.

The resin (A) may include one kind or two or more kinds of the repeating units represented by General Formula (A-1).

In the resin (A), the content of the repeating unit having a cyclic carbonic acid ester structure (preferably the repeating unit represented by General Formula (A-1)) is preferably 3% to 80% by mole, more preferably 3% to 60% by mole, particularly preferably 3% to 30% by mole, and most preferably 10% to 15% by mole, with respect to all the repeating units constituting the resin (A). By setting the content to fall within such the range, developability, low defects, low line width roughness (LWR), low post-exposure bake (PEB) temperature dependence, profiles, and the like as a resist can be improved.

Specific examples (repeating units (A-1a) to (A-1w)) of the repeating unit represented by General Formula (A-1) will be described below, but the present invention is not limited thereto.

Moreover, $R_A^1$ in the following specific examples has the same definition as $R_A^1$ in General Formula (A-1).

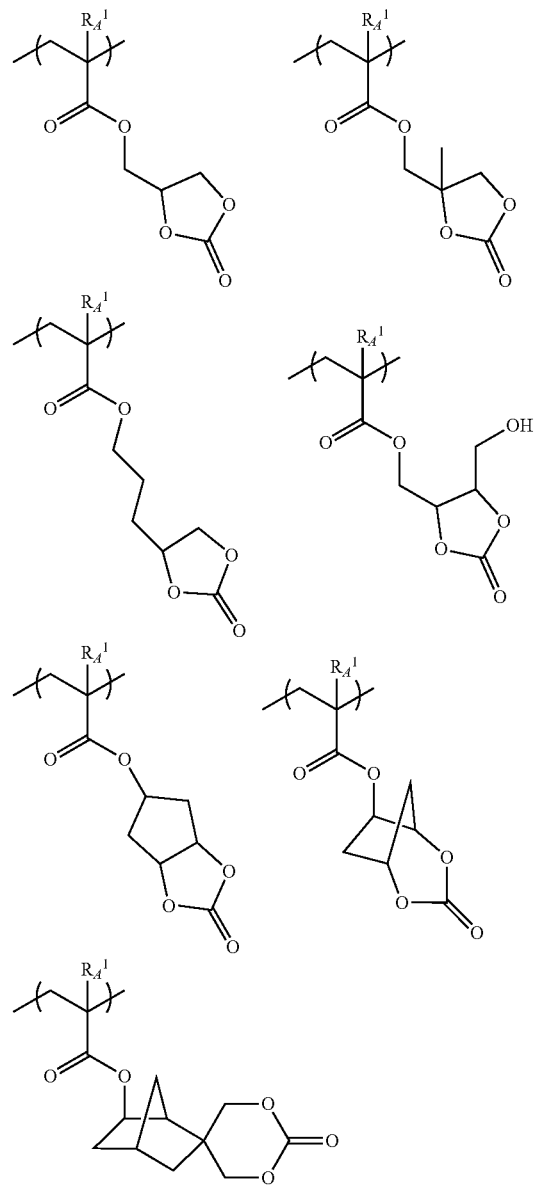

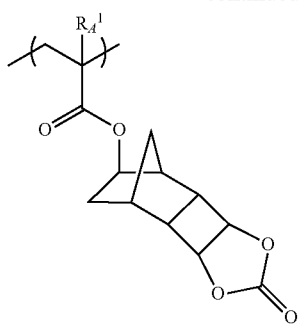
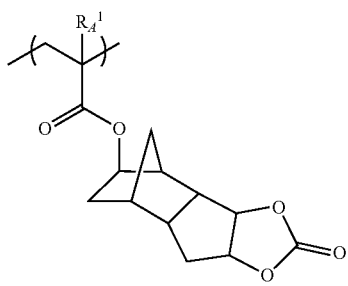
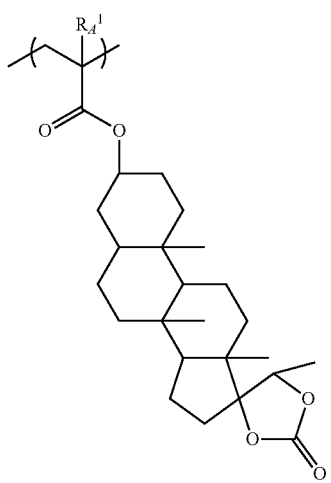
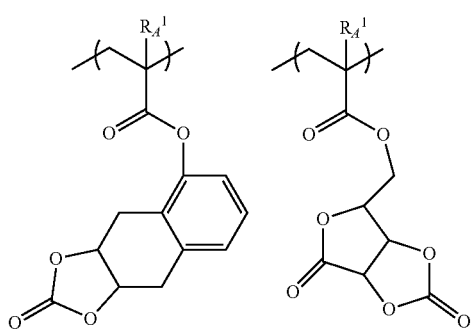
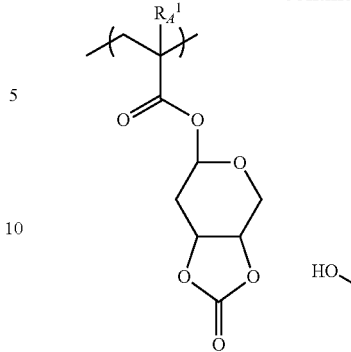
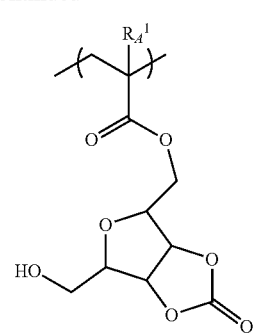
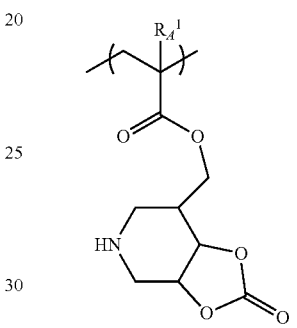
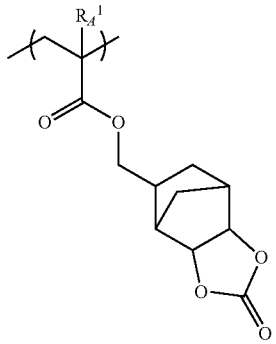
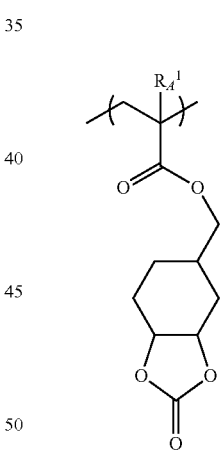

The resin (A) preferably has a repeating unit having a hydroxyl group or a cyano group which is other than General Formulae (AI) and (III). Thus, adhesiveness to a substrate and affinity for a developer are improved. The repeating unit having a hydroxyl group or a cyano group is preferably a repeating unit having an alicyclic hydrocarbon structure substituted with a hydroxyl group or a cyano group, and preferably has no acid-decomposable group. In the alicyclic hydrocarbon structure substituted with a hydroxyl group or a cyano group, as the alicyclic hydrocarbon structure, an adamantyl group, a diadamantyl group, or a norbornane group are preferable. As the alicyclic hydrocarbon structure substituted with a hydroxyl group or a cyano group, partial structures represented by the following general formulae are preferable.

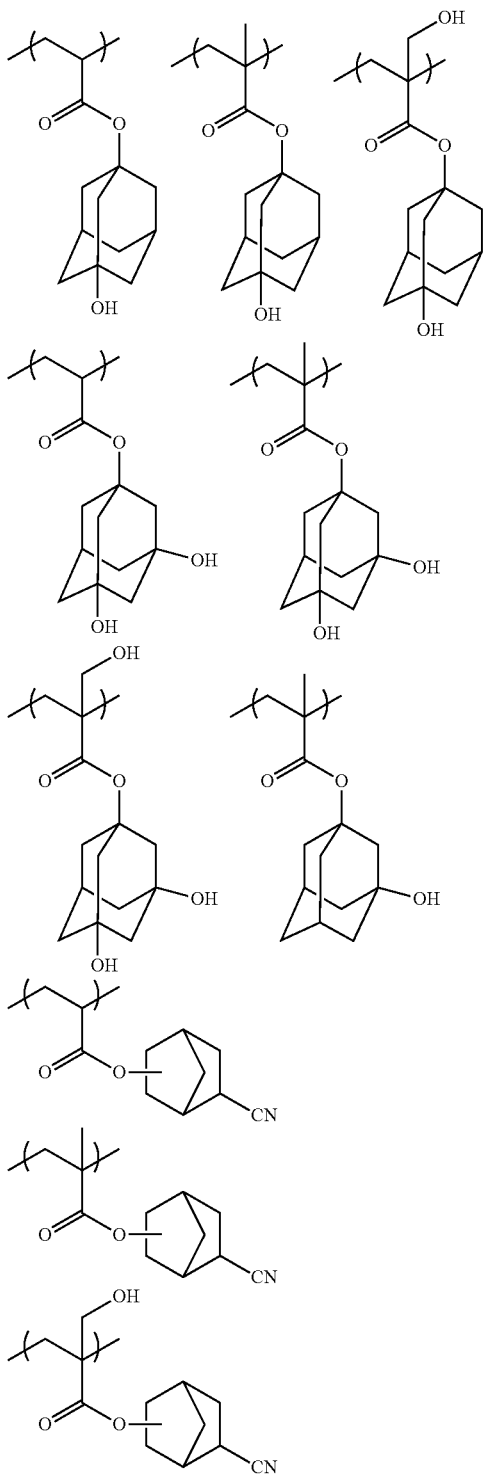

The content of the repeating unit having a hydroxyl group or a cyano group is preferably 5% to 40% by mole, more preferably 5% to 30% by mole, and still more preferably 10% to 25% by mole, with respect to all the repeating units of the resin (A).

Specific examples of the repeating unit having a hydroxyl group or a cyano group include the repeating units disclosed in paragraph 0340 of US2012/0135348A, but the present invention is not limited thereto.

The resin (A) used in the actinic ray-sensitive or radiation-sensitive resin composition of the present invention may have a repeating unit having an alkali-soluble group. Examples of the alkali-soluble group include a carboxyl group, a sulfonamido group, a sulfonylimido group, a bis-sulfonylimido group, and an aliphatic alcohol (for example, a hexafluoroisopropanol group) which is substituted by an electron withdrawing group at the α-position, and more preferably having a repeating unit with a carboxyl group. Due to the resin containing a repeating unit with an alkali-soluble group, resolution during formation of contact holes is enhanced. As the repeating unit with an alkali-soluble group, any of a repeating unit where an alkali-soluble group is bonded directly to the main chain of the resin such as repeating units derived from acrylic acid or methacrylic acid, a repeating unit where an alkali-soluble group is bonded to the main chain of the resin via a linking group, or further, introduction of a polymerization initiator or a chain transfer agent which has an alkali-soluble group to a terminal of a polymer chain used during polymerization is preferable, and the linking group may have a monocyclic or polycyclic hydrocarbon structure. The repeating unit derived from acrylic acid or methacrylic acid is particularly preferable.

The content of the repeating unit having an alkali-soluble group is preferably 0% to 20% by mole, more preferably 3% to 15% by mole, and still more preferably 5% to 10% by mole, with respect to all the repeating units in the resin (A).

Specific examples of the repeating unit having an alkali-soluble group include the repeating units disclosed in paragraph 0344 of US2012/0135348A, but the present invention is not limited thereto The resin (A) of the present invention can have a repeating unit having a cyclic hydrocarbon structure not having a polar group (for example, the alkali-soluble group, a hydroxyl group, and a cyano group) and not exhibiting acid decomposability. Examples of such a repeating unit include a repeating unit represented by General Formula (IV).

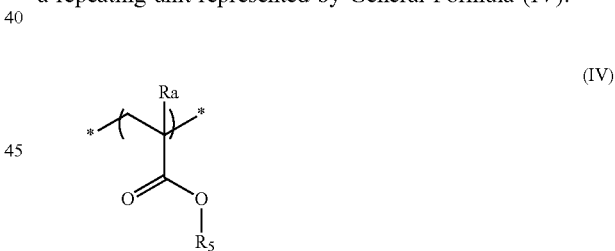

(IV)

In General Formula (IV), $R_5$ represents a hydrocarbon group which has at least one cyclic structure and does not have a polar group.

Ra represents a hydrogen atom, an alkyl group, or a —$CH_2$—O—$Ra_2$ group. In the formula, $Ra_2$ represents a hydrogen atom, an alkyl group, or an acyl group. Ra is preferably a hydrogen atom, a methyl group, a hydroxymethyl group, or a trifluoromethyl group, and particularly preferably a hydrogen atom or a methyl group.

The cyclic structure contained in $R_5$ includes a monocyclic hydrocarbon group and a polycyclic hydrocarbon group. Examples of the monocyclic hydrocarbon group include cycloalkyl groups having 3 to 12 carbon atoms, such as a cyclopentyl group, a cyclohexyl group, a cycloheptyl group, and a cyclooctyl group, a cycloalkenyl groups having 3 to 12 carbon atoms, such as a cyclohexenyl group. Preferred examples of the monocyclic hydrocarbon group include a monocyclic hydrocarbon group having 3 to 7 carbon atoms, and more preferably a cyclopentyl group and a cyclohexyl group.

Examples of the polycyclic hydrocarbon group include a ring-aggregated hydrocarbon group and a crosslinked cyclic hydrocarbon group, and examples of the ring-aggregated hydrocarbon group include a bicyclohexyl group, and a perhydronaphthalenyl group. Examples of the crosslinked cyclic hydrocarbon group include bicyclic hydrocarbon rings such as a pinane ring, a bornane ring, a norpinane ring, a norbornane ring, and a bicyclooctane ring (a bicyclo[2.2.2]octane ring, a bicyclo[3.2.1]octane ring, and the like), tricyclic hydrocarbon rings such as a homobrendane ring, an adamantane ring, a tricyclo[5.2.1.0$^{2,6}$]decane ring, and a tricyclo[4.3.1.1$^{2,5}$]undecane ring, and tetracyclic hydrocarbon rings such as a tetracyclo[4.4.0.1$^{2,5}$.1$^{7,10}$]dodecane ring and a perhydro-1,4-methano-5,8-methanonaphthalene ring. Other examples of the crosslinked cyclic hydrocarbon group include a hydrocarbon ring of a fused ring, for example, a fused ring in which a plurality of 5- to 8-membered cycloalkane rings such as a perhydronaphthalene ring (decalin), a perhydroanthracene ring, a perhydrophenanthrene ring, a perhydroacenaphthene ring, a perhydrofluorene ring, a perhydroindene ring, and a perhydrophenalene ring are fused.

Preferred examples of the crosslinked cyclic hydrocarbon group include a norbornyl group, an adamantyl group, a bicyclooctanyl group, and a tricyclo[5,2,1,0$^{2,6}$]decanyl group. More preferred examples of the crosslinked cyclic hydrocarbon group include a norbornyl group and an adamantyl group.

These alicyclic hydrocarbon groups may have a substituent, and preferred examples of the substituent include a halogen atom, an alkyl group, a hydroxyl group substituted with a hydrogen atom, an amino group substituted with a hydrogen atom, and the like. Preferred examples of the halogen atom include a bromine atom, a chlorine atom, and a fluorine atom, and preferred examples of the alkyl group include a methyl group, an ethyl group, a butyl group, and a t-butyl group. The alkyl group may further have a substituent, and examples of this substituent that may be further contained include a halogen atom, an alkyl group, a hydroxyl group substituted with a hydrogen atom, and an amino group substituted with a hydrogen atom.

Examples of the group substituted with a hydrogen atom include an alkyl group, a cycloalkyl group, an aralkyl group, a substituted methyl group, a substituted ethyl group, an alkoxycarbonyl group, and an aralkyloxycarbonyl group. Preferred examples of the alkyl group include an alkyl group having 1 to 4 carbon atoms, preferred examples of the substituted methyl group include a methoxymethyl group, a methoxythiomethyl group, a benzyloxymethyl group, a t-butoxymethyl group, and a 2-methoxyethoxymethyl group, preferred examples of the substituted ethyl group include 1-ethoxyethyl and 1-methyl-1-methoxyethyl, preferred examples of the acyl group include an aliphatic acyl group having 1 to 6 carbon atoms, such as a formyl group, an acetyl group, a propionyl group, a butyryl group, an isobutyryl group, a valeryl group, and a pivaloyl group, and examples of the alkoxycarbonyl group include an alkoxycarbonyl group having 1 to 4 carbon atoms.

The resin (A) may or may not contain a repeating unit having an alicyclic hydrocarbon structure not having a polar group and not exhibiting acid decomposability, but in a case where the resin (A) contains the repeating unit, the content of the repeating unit is preferably 1% to 40% by mole, and more preferably 2% to 20% by mole, with respect to all the repeating units in the resin (A).

Specific examples of the repeating unit having an alicyclic hydrocarbon structure not having a polar group and not exhibiting acid decomposability include the repeating units disclosed in paragraph 0354 of US2012/0135348A, but the present invention is not limited thereto.

Furthermore, the resin (A) may include, for example, the repeating units described in paragraphs [0045] to [0065] of JP2009-258586A.

In addition to the repeating structural units, the resin (A) used in the method of the present invention can have a variety of repeating structural units for the purpose of adjusting dry etching resistance or suitability for a standard developer, adhesiveness to a substrate, and a resist profile, and in addition, resolving power, heat resistance, sensitivity, and the like, which are characteristics generally required for the resist. Examples of such repeating structural units include, but are not limited to, repeating structural units corresponding to the following monomers.

Thus, it becomes possible to perform fine adjustments to performance required for the resin (A) used in the method of the present invention, in particular, (1) solubility with respect to a coating solvent, (2) film forming properties (glass transition point), (3) alkali developability, (4) film reduction (selection of hydrophilic, hydrophobic, or alkali-soluble groups), (5) adhesiveness of an unexposed area to a substrate, (6) dry etching resistance, and the like.

Examples of such a monomer include a compound having one addition-polymerizable unsaturated bond selected from acrylic acid esters, methacrylic acid esters, acrylamides, methacrylamides, allyl compounds, vinyl ethers, vinyl esters, and the like.

In addition to these, an addition-polymerizable unsaturated compound that is copolymerizable with the monomers corresponding to various repeating structural units as described above may be copolymerized.

In the resin (A), the molar ratio of each repeating structural unit content is appropriately set in order to adjust dry etching resistance or suitability for a standard developer, adhesiveness to a substrate, and a resist profile of the resist, and in addition, resolving power, heat resistance, sensitivity, and the like, each of which is performance generally required for the resist.

In a case where the composition of the present invention is for ArF exposure, it is preferable that the resin (A) does not substantially have an aromatic group in terms of transparency to ArF light. More specifically, the proportion of repeating units having an aromatic group in all the repeating units of the resin (A) is preferably 5% by mole or less, and more preferably 3% by mole or less, and ideally 0% by mole of all the repeating units, that is, it is even more preferable that the resin (A) does not have a repeating unit having an aromatic group. Further, it is preferable that the resin (A) has a monocyclic or polycyclic alicyclic hydrocarbon structure.

The resin (A) is preferably a resin in which all the repeating units are constituted with (meth)acrylate-based repeating units. In this case, any of a resin in which all of the repeating units are methacrylate-based repeating units, a resin in which all of the repeating units are acrylate-based repeating units, a resin in which all of the repeating units are methacrylate-based repeating units and acrylate-based repeating units can be used, but it is preferable that the acrylate-based repeating units account for 50% by mole or less of all of the repeating units.

The resin (A) can be synthesized in accordance with an ordinary method (for example, radical polymerization). Examples of the general synthesis method include a bulk polymerization method in which polymerization is carried out by dissolving monomer species and an initiator in a solvent and heating the solution, a dropwise addition polymerization method in which a solution of monomer species and an initiator is added dropwise to a heating solvent for 1 to 10 hours, with the dropwise addition polymerization method being preferable. Here, as the monomer species, at least the monomer having a silicon atom, which has a turbidity of 1 ppm or less, is used. Examples of the reaction solvent include ethers such as tetrahydrofuran, 1,4-dioxane, and diisopropyl ether, ketones such as methyl ethyl ketone and methyl isobutyl ketone, ester solvents such as ethyl acetate, amide solvents such as dimethyl formamide and dimethyl acetamide, and a solvent which dissolves the composition of the present invention, such as propylene glycol monomethyl ether acetate, propylene glycol monomethyl ether, and cyclohexanone, which will be described later. It is more preferable to perform polymerization using the same solvent as the solvent used in the composition of the present invention. Thus, generation of the particles during storage can be suppressed.

It is preferable that the polymerization reaction is carried out in an inert gas atmosphere such as nitrogen and argon. As the polymerization initiator, commercially available radical initiators (an azo-based initiator, a peroxide, or the like) are used to initiate the polymerization. As the radical initiator, an azo-based initiator is preferable, and the azo-based initiator having an ester group, a cyano group, or a carboxyl group is preferable. Preferable initiators include azobisisobutyronitrile, azobisdimethylvaleronitrile, dimethyl 2,2'-azobis(2-methyl propionate), or the like. The initiator is added or added in portionwise, as desired, a desired polymer is recovered after the reaction is completed, the reaction mixture is poured into a solvent, and then a method such as powder or solid recovery is used. The resin solution after polymerization may be purified using a ceramic filter, a nylon filter, or the like. The concentration of the reactant is 5% to 50% by mass and preferably 10% to 30% by mass. The reaction temperature is normally 10° C. to 150° C., preferably 30° C. to 120° C., and more preferably 60° C. to 100° C.

The weight-average molecular weight of the resin (A) is preferably 1,000 to 200,000, more preferably 2,000 to 20,000, still more preferably 3,000 to 15,000, and particularly preferably 3,000 to 11,000. By setting the weight-average molecular weight to 1,000 to 200,000, it is possible to prevent the deterioration of heat resistance or dry etching resistance, and also prevent the deterioration of film forming properties due to deteriorated developability or increased viscosity.

The dispersity (molecular weight distribution) is usually 1.0 to 3.0, and the dispersity in the range of preferably 1.0 to 2.6, more preferably 1.0 to 2.0, and particularly preferably 1.1 to 2.0 is used. As the molecular weight distribution is smaller, the resolution and the resist shape are better, the side wall of the resist pattern is smoother, and the roughness is better.

Furthermore, in the present specification, the weight-average molecular weight (Mw) and the dispersity are values in terms of standard polystyrene, determined by gel permeation chromatography (GPC) under the following conditions.

Type of columns: TSK gel Multipore HXL-M (manufactured by Tosoh Corporation, 7.8 mmID×30.0 cm)
Developing solvent: Tetrahydrofuran (THF)
Column temperature: 40° C.·Flow rate: 1 ml/min
Injection amount of sample: 10 μl Name of device: HLC-8120 (manufactured by Tosoh Corporation)

The content of the resin (A) in the total solid content of the composition of the present invention is 20% by mass or more. Among those, the content is preferably 40% by mass or more, more preferably 60% by mass or more, and still more preferably 80% by mass or more. The upper limit is not particularly limited, but is preferably 90% by mass or less.

In the present invention, the resin (A) may be used singly or in combination of a plurality of kinds thereof.

[2] Compound Capable of Generating Acid Upon Irradiation with Actinic Rays or Radiation The composition of the present invention preferably contains a compound capable of generating an acid upon irradiation of actinic rays or radiation (hereinafter also referred to as an "acid generator"). The acid generator is not particularly limited, but is preferably a compound capable of generating an organic acid upon irradiation with actinic rays or radiation.

The acid generator may be in a form of a low-molecular-weight compound or a form incorporated into a part of a polymer. Further, a combination of the form of a low-molecular-weight compound and the form incorporated into a part of a polymer may also be used.

In a case where the acid generator is in the form of a low-molecular-weight compound, the molecular weight is preferably 3,000 or less, more preferably 2,000 or less, and still more preferably 1,000 or less.

In a case where the compound (B) capable of generating an acid upon irradiation of actinic rays or radiation is in the form incorporated into a part of a polymer, it may be incorporated into a part of the above-mentioned acid-decomposable resin or into a resin other than the above-mentioned acid-decomposable resin.

In the present invention, the compound (B) capable of generating an acid upon irradiation of actinic rays or radiation is preferably in the form of a low-molecular-weight compound.

The acid generator which is appropriately selected from a photoinitiator for cationic photopolymerization, a photoinitiator for radical photopolymerization, a photodecoloring agent for dyes, a photodiscoloring agent, a known compound capable of generating an acid upon irradiation with actinic rays or radiation, which is used for a microresist or the like, and a mixture thereof, can be used. Examples thereof include the compounds described in paragraphs [0039] to [0103] of JP2010-61043A, the compounds described in paragraphs [0284] to [0389] of JP2013-4820A, and the like, but the present invention is not limited thereto.

Examples of the acid generator include a diazonium salt, a phosphonium salt, a sulfonium salt, an iodonium salt, imidosulfonate, oxime sulfonate, diazodisulfone, disulfone, and o-nitrobenzyl sulfonate.

Suitable examples of the acid generator contained in the composition of the present invention include a compound (specific acid generator) capable of generating an acid upon irradiation with actinic rays or radiation, represented by General Formula (3).

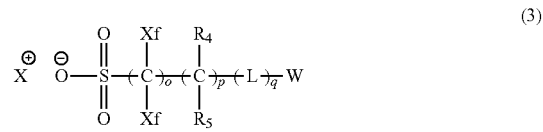

(3)

(Anion)

In General Formula (3),

Xf's each independently represent a fluorine atom or an alkyl group substituted with at least one fluorine atom.

$R_4$ and $R_5$ each independently represent a hydrogen atom, a fluorine atom, an alkyl group, or an alkyl group substituted with at least one fluorine atom, and in a case where $R_4$ and $R_5$ are present in plural numbers, they may be the same as or different from each other.

L represents a divalent linking group, and in a case where L's are present in plural numbers, they may be the same as or different from each other.

W represents an organic group including a cyclic structure.

o represents an integer of 1 to 3. p represents an integer of 0 to 10. q represents an integer of 0 to 10.

Xf represents a fluorine atom or an alkyl group substituted with at least one fluorine atom. The number of carbon atoms of the alkyl group is preferably 1 to 10, and more preferably 1 to 4. Further, the alkyl group substituted with at least one fluorine atom is preferably a perfluoroalkyl group.

Xf is preferably a fluorine atom or a perfluoroalkyl group having 1 to 4 carbon atoms. Xf is more preferably a fluorine atom or $CF_3$. It is particularly preferable that both Xf's are fluorine atoms.

$R_4$ and $R_5$ each independently represent a hydrogen atom, a fluorine atom, an alkyl group, or an alkyl group substituted with at least one fluorine atom, and in a case where $R_4$ and $R_5$ are each present in plural numbers, they may be the same as or different from each other.

The alkyl group as each of $R_4$ and $R_5$ may have a substituent, and preferably has 1 to 4 carbon atoms. $R_4$ and $R_5$ are each preferably a hydrogen atom.

Specific examples and suitable embodiments of the alkyl group substituted with at least one fluorine atom are the same as the specific examples and suitable embodiments of Xf in General Formula (3).

L represents a divalent linking group, and in a case where L's are present in plural numbers, they may be the same as or different from each other.

Examples of the divalent linking group include —COO— (—C(=O)—O—), —OCO—, —CONH—, —NHCO—, —CO—, —O—, —S—, —SO—, —SO$_2$—, an alkylene group (preferably having 1 to 6 carbon atoms), a cycloalkylene group (preferably having 3 to 10 carbon atoms), an alkenylene group (preferably having 2 to 6 carbon atoms), or a divalent linking group formed by combination of these plurality of groups. Among these, —COO—, —OCO—, —CONH—, —NHCO—, —CO—, —O—, —SO$_2$—, —COO— alkylene group-, —OCO-alkylene group-, —CONH-alkylene group-, or —NHCO-alkylene group- is preferable, and —COO—, —OCO—, —CONH—, —SO$_2$—, —COO-alkylene group-, or —OCO-alkylene group- is more preferable.

W represents an organic group including a cyclic structure. Among the organic groups, a cyclic organic group is preferable.

Examples of the cyclic organic group include an alicyclic group, an aryl group, and a heterocyclic group.

The alicyclic group may be monocyclic or polycyclic, and examples of the monocyclic alicyclic group include monocyclic cycloalkyl groups such as a cyclopentyl group, a cyclohexyl group, and a cyclooctyl group. Examples of the polycyclic alicyclic group include polycyclic cycloalkyl groups such as a norbornyl group, a tricyclodecanyl group, a tetracyclodecanyl group, a tetracyclododecanyl group, and an adamantyl group. Among these, an alicyclic group having a bulky structure having 7 or more carbon atoms, such as a norbornyl group, a tricyclodecanyl group, a tetracyclodecanyl group, a tetracyclododecanyl group, and an adamantyl group is preferable from the viewpoints of suppressing diffusivity into the film during the post-exposure bake (PEB) process and improving a mask error enhancement factor (MEEF).

The aryl group may be monocyclic or polycyclic. Examples of the aryl group include a phenyl group, a naphthyl group, a phenanthryl group, and an anthryl group. Among these, a naphthyl group showing a relatively low light absorbance at 193 nm is preferable.

The heterocyclic group may be monocyclic or polycyclic, but in a case where it is polycyclic, it is possible to suppress acid diffusion. Further, the heterocyclic group may have aromaticity or may not have aromaticity. Examples of the heterocycle having aromaticity include a furan ring, a thiophene ring, a benzofuran ring, a benzothiophene ring, a dibenzofuran ring, a dibenzothiophene ring, and a pyridine ring. Examples of the heterocycle not having an aromaticity include a tetrahydropyran ring, a lactone ring, a sultone ring, and a decahydroisoquinoline ring. As a heterocycle in the heterocyclic group, a furan ring, a thiophene ring, a pyridine ring, or a decahydroisoquinoline ring is particularly preferable. Further, examples of the lactone ring and the sultone ring include the above-mentioned lactone structures and sultone structures exemplified in the resin.

The cyclic organic group may have a substituent. Examples of the substituent include, an alkyl group (which may be linear or branched, and preferably has 1 to 12 carbon atoms), a cycloalkyl group (which may be monocyclic, polycyclic, or spiro ring, and preferably has 3 to 20 carbon atoms), an aryl group (preferably having 6 to 14 carbon atoms), a hydroxyl group, an alkoxy group, an ester group, an amido group, a urethane group, a ureido group, a thioether group, a sulfonamido group, and a sulfonic acid ester group. Incidentally, the carbon constituting the cyclic organic group (carbon contributing to ring formation) may be carbonyl carbon.

o represents an integer of 1 to 3. p represents an integer of 0 to 10. q represents an integer of 0 to 10.

In one embodiment, it is preferable that in General Formula (3), o is an integer of 1 to 3, p is an integer of 1 to 10, and q is 0. Xf is preferably a fluorine atom, $R_4$ and $R_5$ are preferably both hydrogen atoms, and W is preferably a polycyclic hydrocarbon group. o is more preferably 1 or 2, and still more preferably 1. p is more preferably an integer of 1 to 3, still more preferably 1 or 2, and particularly preferably 1. W is more preferably a polycyclic cycloalkyl group, and still more preferably an adamantyl group or a diadamantyl group.

(Cation)

In General Formula (3), $X^+$ represents a cation.

$X^+$ is not particularly limited as long as it is a cation, but suitable embodiments thereof include cations (parts other than $Z^-$) in General Formula (ZI), (ZII), or (ZIII) which will be described later.

(Suitable Embodiments)

Suitable specific embodiments of the acid generator include a compound represented by General Formula (ZI), (ZII), or (ZIII).

(ZI)

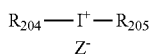  (ZII)

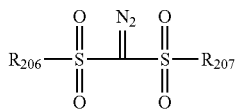  (ZIII)

In General Formula (ZI), $R_{201}$, $R_{202}$, and $R_{203}$ each independently represent an organic group.

The number of carbon atoms of the organic group as $R_{201}$, $R_{202}$, and $R_{203}$ is generally 1 to 30, and preferably 1 to 20.

Furthermore, two members out of $R_{201}$ to $R_{203}$ may be bonded to each other to form a ring structure, and the ring may include an oxygen atom, a sulfur atom, an ester bond, an amide bond, or a carbonyl group, and examples of the group formed by the bonding of two members out of $R_{201}$ to $R_{203}$ include an alkylene group (for example, a butylene group and a pentylene group).

$Z^-$ represents an anion in General Formula (3), and specifically represents the following anion.

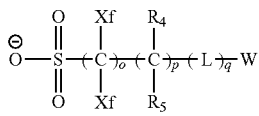

Examples of the organic group represented by each of $R_{201}$, $R_{202}$, and $R_{203}$ include groups corresponding to the compounds (ZI-1), (ZI-2), (ZI-3) and (ZI-4) which will be described later.

Incidentally, the organic group may be a compound having a plurality of structures represented by General Formula (ZI). For example, it may be a compound having a structure in which at least one of $R_{201}$, ..., or $R_{203}$ in the compound represented by General Formula (ZI) is bonded to at least one of $R_{201}$, ..., or $R_{203}$ of another compound represented by General Formula (ZI) through a single bond or a linking group.

More preferred examples of the component (ZI) include compounds (ZI-1), (ZI-2), (ZI-3), and (ZI-4) described below.

First, the compound (ZI-1) will be described.

The compound (ZI-1) is an arylsulfonium compound in which at least one of $R_{201}$, ..., or $R_{203}$ in General Formula (ZI) is an aryl group, that is, a compound having arylsulfonium as a cation.

In the arylsulfonium compound, all of $R_{201}$ to $R_{203}$ may be aryl groups, or some of $R_{201}$ to $R_{203}$ may be aryl groups and the remainders may be alkyl groups or cycloalkyl groups, but all of $R_{201}$ to $R_{203}$ may be aryl groups.

Examples of the arylsulfonium compound include a triarylsulfonium compound, a diarylalkylsulfonium compound, an aryldialkylsulfonium compound, a diarylcycloalkylsulfonium compound, and an aryldicycloalkylsulfonium compound.

The aryl group in the arylsulfonium compound is preferably a phenyl group or a naphthyl group, and more preferably a phenyl group. The aryl group may be an aryl group having a heterocyclic structure having an oxygen atom, a nitrogen atom, a sulfur atom, or the like. Examples of the heterocyclic structure include a pyrrole residue, a furan residue, a thiophene residue, an indole residue, a benzofuran residue, and a benzothiophene residue. In a case where the arylsulfonium compound has two or more aryl groups, these two or more aryl groups may be the same as or different from each other.

The alkyl group or the cycloalkyl group which may be contained, if desired, in the arylsulfonium compound, is preferably a linear or branched alkyl group having 1 to 15 carbon atoms or a cycloalkyl group having 3 to 15 carbon atoms, for example, a methyl group, an ethyl group, a propyl group, an n-butyl group, a sec-butyl group, a t-butyl group, a cyclopropyl group, a cyclobutyl group, and a cyclohexyl group.

The aryl group, the alkyl group, and the cycloalkyl group of each of $R_{201}$ to $R_{203}$ may have an alkyl group (for example, an alkyl group having 1 to 15 carbon atoms), a cycloalkyl group (for example, a cycloalkyl group having 3 to 15 carbon atoms), an aryl group (for example, an aryl group having 6 to 14 carbon atoms), an alkoxy group (for example, an alkoxy group having 1 to 15 carbon atoms), a halogen atom, a hydroxyl group, or a phenylthio group as a substituent.

Next, the compound (ZI-2) will be described.

The compound (ZI-2) is a compound in which $R_{201}$ to $R_{203}$ in Formula (ZI) each independently represent an organic group not having an aromatic ring. Here, the aromatic ring also encompasses an aromatic ring containing a heteroatom.

The organic group, as each of $R_{201}$ to $R_{203}$, containing no aromatic ring has generally 1 to 30 carbon atoms, and preferably 1 to 20 carbon atoms.

$R_{201}$ to $R_{203}$ are each independently preferably an alkyl group, a cycloalkyl group, an allyl group, or a vinyl group, more preferably a linear or branched 2-oxoalkyl group, a 2-oxocycloalkyl group, or an alkoxycarbonylmethyl group, and particularly preferably a linear or branched 2-oxoalkyl group.

Preferred examples of the alkyl group and the cycloalkyl group of each of $R_{201}$ to $R_{203}$ include a linear or branched alkyl group having 1 to 10 carbon atoms (for example, a methyl group, an ethyl group, a propyl group, a butyl group, and a pentyl group), and a cycloalkyl group having 3 to 10 carbon atoms (a cyclopentyl group, a cyclohexyl group, and a norbornyl group).

$R_{201}$ to $R_{203}$ may further be substituted with a halogen atom, an alkoxy group (for example, an alkoxy group having 1 to 5 carbon atoms), a hydroxyl group, a cyano group, or a nitro group.

Next, the compound (ZI-3) will be described.

The compound (ZI-3) is a compound represented by General Formula (ZI-3), which is a compound having a phenacylsulfonium salt structure.

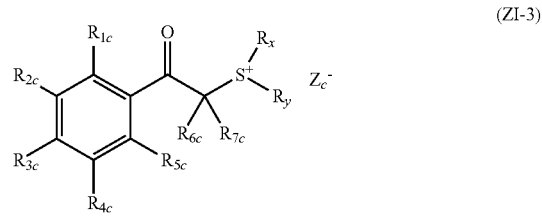  (ZI-3)

In General Formula (ZI-3), $R_{1c}$ to $R_{5c}$ each independently represent a hydrogen atom, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group, or an arylthio group.

$R_{6c}$ and $R_{7c}$ each independently represent a hydrogen atom, an alkyl group, a cycloalkyl group, a halogen atom, a cyano group, or an aryl group.

$R_x$ and $R_y$ each independently represent an alkyl group, a cycloalkyl group, a 2-oxoalkyl group, a 2-oxocycloalkyl group, an alkoxycarbonylalkyl group, an allyl group, or a vinyl group.

Among any two or more members out of $R_{1c}$ to $R_{5c}$, $R_{5c}$ and $R_{6c}$, $R_{6c}$ and $R_{7c}$, $R_{5c}$ and $R_x$, and $R_x$ and $R_y$, each may be bonded to each other to form a ring structure, and the ring structure may contain an oxygen atom, a sulfur atom, a ketone group, an ester bond, or an amide bond.

Examples of the ring structure include an aromatic or non-aromatic hydrocarbon ring, an aromatic or non-aromatic heterocycle, or a polycyclic fused ring composed of two or more of these rings. Examples of the ring structure include 3- to 10-membered rings, and the ring structures are preferably 4- to 8-membered ring, and more preferably 5- or 6-membered rings.

Examples of groups formed by the bonding of any two or more of $R_{1c}$ to $R_{5c}$, $R_{6c}$ and $R_{7c}$, and $R_x$ and $R_y$ include a butylene group and a pentylene group.

As groups formed by the bonding of $R_{5c}$ and $R_{6c}$, and $R_{5c}$ and $R_x$, a single bond or alkylene group is preferable, and examples thereof include a methylene group and an ethylene group.

$Zc^-$ represents an anion in General Formula (3), and specifically, is the same as described above.

Specific examples of the alkoxy group in the alkoxycarbonyl group as each of $R_{1c}$ to $R_{5c}$ are the same as the specific examples of the alkoxy group as each of $R_{1c}$ to $R_{5c}$.

Specific examples of the alkyl group in the alkylcarbonyloxy group and the alkylthio group as each of $R_{1c}$ to $R_{5c}$ are the same as the specific examples of the alkyl group as each of $R_{1c}$ to $R_{5c}$.

Specific examples of the cycloalkyl group in the cycloalkylcarbonyloxy group as each of $R_{1c}$ to $R_{5c}$ are the same as the specific examples of the cycloalkyl group as each of $R_{1c}$ to $R_{5c}$.

Specific examples of the aryl group in the aryloxy group and the arylthio group as each of $R_{1c}$ to $R_{5c}$ are the same as the specific examples of the aryl group as each of $R_{1c}$ to $R_{5c}$.

Examples of the cation in the compound (ZI-2) or (ZI-3) in the present invention include the cations described after paragraph [0036] of US2012/0076996A.

Next, the compound (ZI-4) will be described.

The compound (ZI-4) is represented by General Formula (ZI-4).

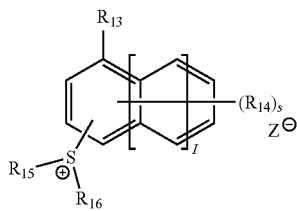

(ZI-4)

In General Formula (ZI-4), $R_{13}$ represents a hydrogen atom, a fluorine atom, a hydroxyl group, an alkyl group, a cycloalkyl group, an alkoxy group, an alkoxycarbonyl group, or a group having a cycloalkyl group. These groups may have a substituent.

In a case where $R_{14}$'s are present in plural numbers, they each independently represent a hydroxyl group, an alkyl group, a cycloalkyl group, an alkoxy group, an alkoxycarbonyl group, an alkylcarbonyl group, an alkylsulfonyl group, a cycloalkylsulfonyl group, or a group having a cycloalkyl group. These groups may have a substituent.

$R_{15}$'s each independently represent an alkyl group, a cycloalkyl group, or a naphthyl group. These groups may have a substituent. Two $R_{15}$'s may be bonded to each other to form a ring. In a case where two $R_{15}$'s are bonded to form a ring, the ring skeleton may include a heteroatom such as an oxygen atom and a nitrogen atom. In one embodiment, it is preferable that two $R_{15}$'s are alkylene groups, and are bonded to each other to form a ring structure.

l represents an integer of 0 to 2.

r represents an integer of 0 to 8.

$Z^-$ represents an anion in General Formula (3), and specifically, is as described above.

In General Formula (ZI-4), as the alkyl group of each of $R_{13}$, $R_{14}$, and $R_{15}$, an alkyl which is linear or branched and has 1 to 10 carbon atoms is preferable, and preferred examples thereof include a methyl group, an ethyl group, an n-butyl group, and a t-butyl group. Examples of the cation of the compound represented by General Formula (ZI-4) in the present invention include the cations described in paragraphs [0121], [0123], and [0124] of JP2010-256842A, paragraphs [0127], [0129], and [0130] of JP2011-76056A, and the like.

Next, General Formulae (ZII) and (ZIII) will be described.

In General Formulae (ZII) and (ZIII), $R_{204}$ to $R_{207}$ each independently represent an aryl group, an alkyl group, or a cycloalkyl group. The aryl group of each of $R_{204}$ to $R_{207}$ is preferably a phenyl group or a naphthyl group, and more preferably a phenyl group.

The aryl group of each of $R_{204}$ to $R_{207}$ may be an aryl group having a heterocyclic structure containing an oxygen atom, a nitrogen atom, a sulfur atom, or the like. Examples of the skeleton of the aryl group having a heterocyclic structure include pyrrole, furan, thiophene, indole, benzofuran, and benzothiophene.

Preferred examples of the alkyl group and the cycloalkyl group in each of $R_{204}$ to $R_{207}$ include linear or branched alkyl groups having 1 to 10 carbon atoms (for example, a methyl group, an ethyl group, a propyl group, a butyl group, and a pentyl group), and cycloalkyl groups having 3 to 10 carbon atoms (a cyclopentyl group, a cyclohexyl group, and a norbornyl group).

The aryl group, the alkyl group, or the cycloalkyl group of each of $R_{204}$ to $R_{207}$ may have a substituent. Examples of the substituent which the aryl group, the alkyl group, or the cycloalkyl group of each of $R_{204}$ to $R_{207}$ may have include an alkyl group (for example, having 1 to 15 carbon atoms), a cycloalkyl group (for example, having 3 to 15 carbon atoms), an aryl group (for example, having 6 to 15 carbon atoms), an alkoxy group (for example, having 1 to 15 carbon atoms), a halogen atom, a hydroxyl group, and a phenylthio group.

$Z^-$ represents an anion in General Formula (3), and specifically, is as described above.

The acid generator (including a specific acid generator, which applies hereinafter) may be in a form of a low-molecular-weight compound or in a form incorporated into a part of a polymer. Further, a combination of the form of a low-molecular-weight compound and the form incorporated into a part of a polymer may also be used.

In a case where the acid generator is in the form of a low-molecular-weight compound, the molecular weight is preferably 580 or more, more preferably 600 or more, still more preferably 620 or more, and particularly preferably 640 or more. The upper limit is not particularly limited, but is preferably 3,000 or less, more preferably 2,000 or less, and still more preferably 1,000 or less.

In a case where the acid generator is in the form incorporated into a part of a polymer, it may be incorporated into a part of the above-mentioned resin or into a resin other than the resin.

The acid generator can be synthesized by a known method, and can be synthesized in accordance with, for example, the method described in JP2007-161707A.

The acid generator may be used singly or in combination of two or more kinds thereof.

The content of the acid generator (a total sum of contents in a case where the acid generators are present in plural kinds) in the composition is preferably 0.1% to 30% by mass, more preferably 0.5% to 25% by mass, still more preferably 3% to 20% by mass, and particularly preferably 3% to 15% by mass, with respect to the total solid contents of the composition.

In a case where the compound represented by General Formula (ZI-3) or (ZI-4) is included as the acid generator, the content of the acid generator (a total sum of the contents in a case where the acid generators are present in plural kinds) included in the composition is preferably 5% to 35% by mass, more preferably 8% to 30% by mass, still more preferably 9% to 30% by mass, and particularly preferably 9% to 25% by mass, with respect to the total solid contents of the composition.

[3] Hydrophobic Resin

The composition of the present invention may contain a hydrophobic resin (hereinafter also referred to as a "hydrophobic resin (D)" or simply a "resin (D)"). Further, the hydrophobic resin (D) is preferably different from the resin (A).

Although the hydrophobic resin (D) is preferably designed to be unevenly distributed on an interface as described above, it does not necessarily have to have a hydrophilic group in its molecule as different from the surfactant, and does not need to contribute to uniform mixing of polar/nonpolar materials.

Examples of the effect of addition of the hydrophobic resin include control of the static/dynamic contact angle of the resist film surface with respect to water, improvement of the immersion liquid tracking properties, and suppression of out gas.

The hydrophobic resin (D) preferably has at least one of a "fluorine atom", a "silicon atom", or a "$CH_3$ partial structure which is contained in a side chain moiety of a resin" from the viewpoint of uneven distribution on the film surface layer, and more preferably has two or more kinds.

In a case where hydrophobic resin (D) includes a fluorine atom and/or a silicon atom, the fluorine atom and/or the silicon atom in the hydrophobic resin (D) may be contained in the main chain or the side chain of the resin.

In a case where the hydrophobic resin (D) contains a fluorine atom, the resin is preferably a resin which contains an alkyl group having a fluorine atom, a cycloalkyl group having a fluorine atom, or an aryl group having a fluorine atom, as a partial structure having a fluorine atom.

The alkyl group having a fluorine atom (preferably having 1 to 10 carbon atoms, and more preferably having 1 to 4 carbon atoms) is a linear or branched alkyl group in which at least one hydrogen atom is substituted with a fluorine atom, and may further have a substituent other than a fluorine atom.

The cycloalkyl group having a fluorine atom and the aryl group having a fluorine atom are a cycloalkyl group in which one hydrogen atom is substituted with a fluorine atom, and an aryl group having a fluorine atom, respectively, and may further have a substituent other than a fluorine atom.

Preferred examples of the alkyl group having a fluorine atom, the cycloalkyl group having a fluorine atom, and the aryl group having a fluorine atom include groups represented by General Formulae (F2) to (F4), but the present invention is not limited thereto.

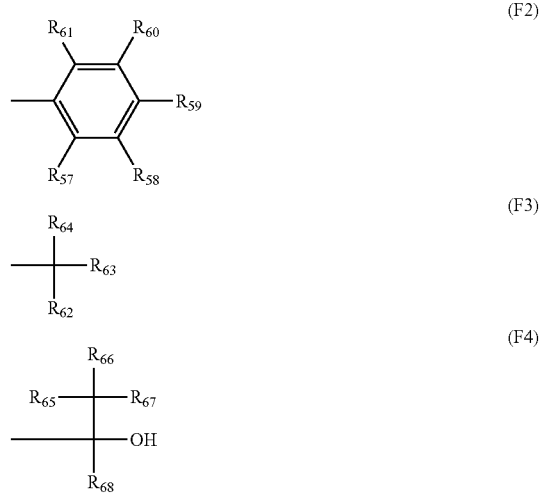

In General Formulae (F2) to (F4), $R_{57}$ to $R_{68}$ each independently represent a hydrogen atom, a fluorine atom, or an (linear or branched) alkyl group, a provided that at least one of $R_{57}$, ..., or $R_{61}$, at least one of $R_{62}$, ..., or $R_{64}$, and at least one of $R_{65}$, ..., or $R_{68}$ each independently represent a fluorine atom or an alkyl group (preferably having 1 to 4 carbon atoms) in which at least one hydrogen atom is substituted with a fluorine atom.

It is preferable that all of $R_{57}$ to $R_{61}$, and $R_{65}$ to $R_{67}$ are fluorine atoms. $R_{62}$, $R_{63}$, and $R_{68}$ are each preferably an alkyl group (preferably having 1 to 4 carbon atoms) in which at least one hydrogen atom is substituted with a fluorine atom, and more preferably a perfluoroalkyl group having 1 to 4 carbon atoms. $R_{62}$ and $R_{63}$ may be linked to each other to form a ring.

The hydrophobic resin (D) may contain a silicon atom. It is preferably a resin having, as the partial structure having a silicon atom, an alkylsilyl structure (preferably a trialkylsilyl group) or a cyclic siloxane structure.

Examples of the repeating unit having a fluorine atom or a silicon atom include those exemplified in [0519] of US2012/0251948A1.

Moreover, it is also preferable that the hydrophobic resin (D) contains a $CH_3$ partial structure in the side chain moiety as described above.

Here, the $CH_3$ partial structure (hereinafter also simply referred to as a "side chain $CH_3$ partial structure") contained in the side chain moiety in the hydrophobic resin (D) includes a $CH_3$ partial structure contained in an ethyl group, a propyl group, and the like.

On the other hand, a methyl group bonded directly to the main chain of the hydrophobic resin (D) (for example, an α-methyl group in the repeating unit having a methacrylic acid structure) makes only a small contribution of uneven distribution to the surface of the hydrophobic resin (D) due to the effect of the main chain, and it is therefore not included in the $CH_3$ partial structure in the present invention.

More specifically, in a case where the hydrophobic resin (D) contains a repeating unit derived from a monomer having a polymerizable moiety with a carbon-carbon double bond, such as a repeating unit represented by General Formula (M), and in addition, $R_{11}$ to $R_{14}$ are $CH_3$ "themselves", such $CH_3$ is not included in the $CH_3$ partial structure contained in the side chain moiety in the present invention.

On the other hand, a $CH_3$ partial structure which is present via a certain atom from a C—C main chain corresponds to the $CH_3$ partial structure in the present invention. For example, in a case where $R_{11}$ is an ethyl group ($CH_2CH_3$), the hydrophobic resin has "one" $CH_3$ partial structure in the present invention.

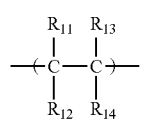

(M)

In General Formula (M), $R_{11}$ to $R_{14}$ each independently represent a side chain moiety.

Examples of $R_{11}$ to $R_{14}$ in the side chain moiety include a hydrogen atom and a monovalent organic group.

Examples of the monovalent organic group for $R_{11}$ to $R_{14}$ include an alkyl group, a cycloalkyl group, an aryl group, an alkyloxycarbonyl group, a cycloalkyloxycarbonyl group, an aryloxycarbonyl group, an alkylaminocarbonyl group, a cycloalkylaminocarbonyl group, and an arylaminocarbonyl group, each of which may further have a substituent.

The hydrophobic resin (D) is preferably a resin including a repeating unit having the $CH_3$ partial structure in the side chain moiety thereof. Further, the hydrophobic resin more preferably has, as such a repeating unit, at least one repeating unit (x) selected from a repeating unit represented by General Formula (II) or a repeating unit represented by General Formula (III).

Hereinafter, the repeating unit represented by General Formula (II) will be described in detail.

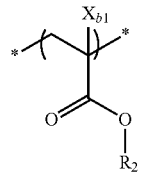

(II)

In General Formula (II), $X_{b1}$ represents a hydrogen atom, an alkyl group, a cyano group, or a halogen atom, and $R_2$ represents an organic group which has one or more $CH_3$ partial structures and is stable against an acid. Here, it is preferable that the organic group which is stable against an acid is more specifically an organic group not having the "acid-decomposable group" described in the resin (A).

The alkyl group of $X_{b1}$ is preferably an alkyl group having 1 to 4 carbon atoms, and examples thereof include a methyl group, an ethyl group, a propyl group, a hydroxymethyl group, and a trifluoromethyl group, with the methyl group being preferable.

$X_{b1}$ is preferably a hydrogen atom or a methyl group.

Examples of $R_2$ include an alkyl group, a cycloalkyl group, an alkenyl group, a cycloalkenyl group, an aryl group, and an aralkyl group, each of which has one or more $CH_3$ partial structures. Each of the cycloalkyl group, the alkenyl group, the cycloalkenyl group, the aryl group and the aralkyl group may further have an alkyl group as a substituent.

$R_2$ is preferably an alkyl group or an alkyl-substituted cycloalkyl group, each of which has one or more $CH_3$ partial structures.

The number of the $CH_3$ partial structures contained in the organic group which has one or more $CH_3$ partial structures and is stable against an acid as $R_2$ is preferably from 2 to 10, and more preferably from 2 to 8.

Specific preferred examples of the repeating unit represented by General Formula (II) are set forth below, but the present invention is not limited thereto.

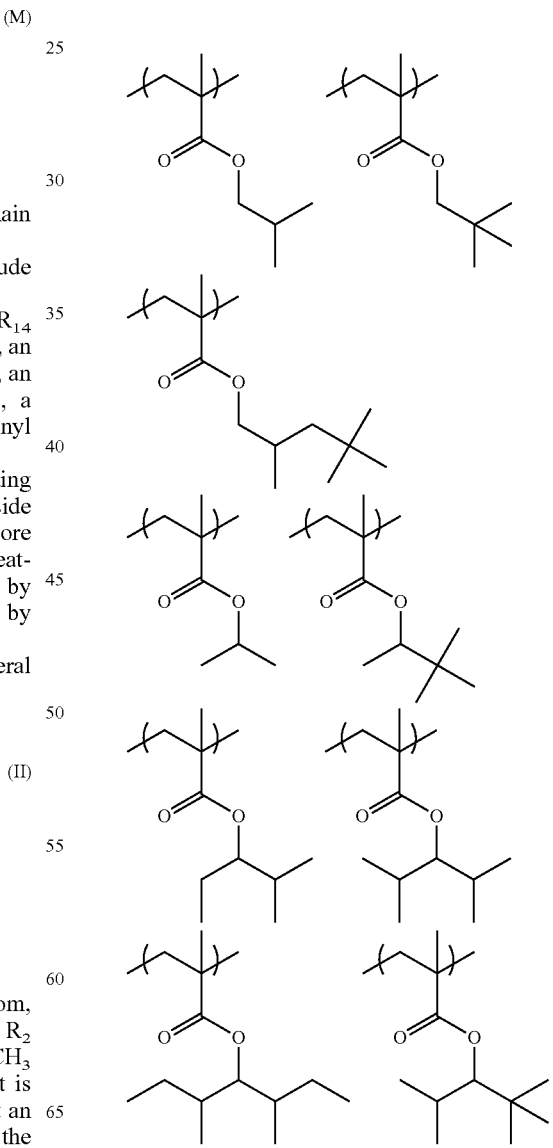

-continued

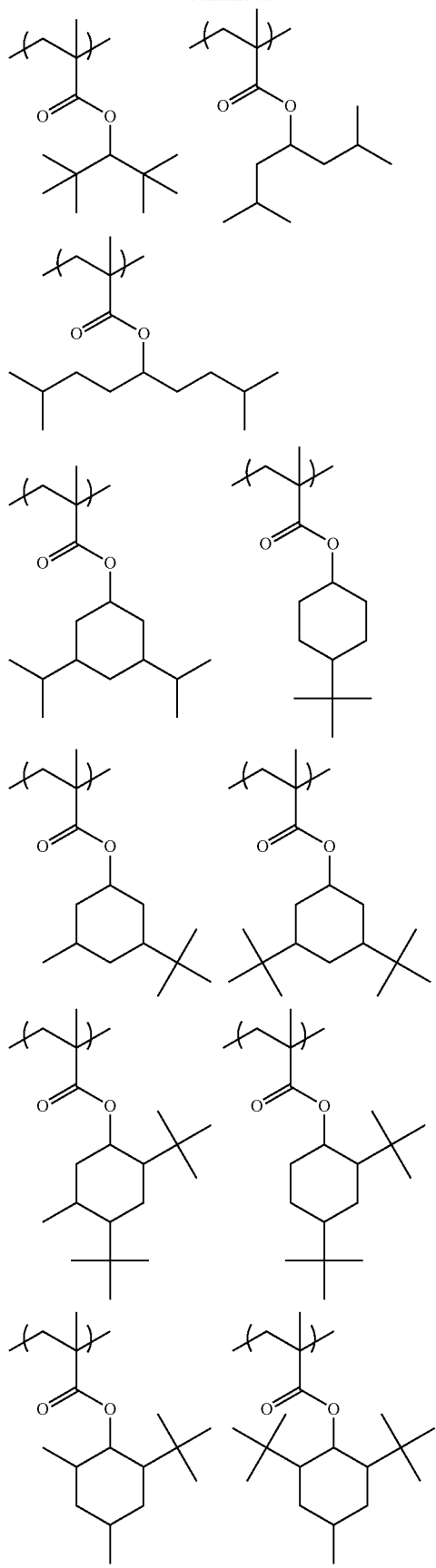

-continued

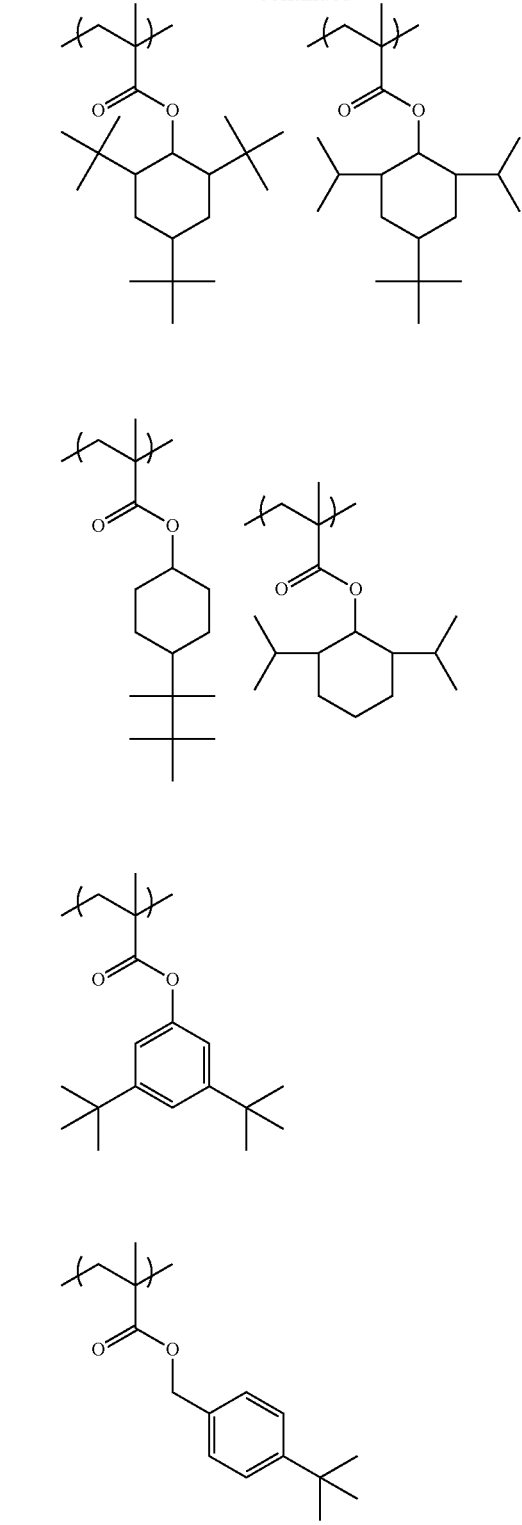

The repeating unit represented by General Formula (II) is preferably a repeating unit which is stable against an acid (non-acid-decomposable), and specifically, it is preferably a repeating unit not having a group capable of decomposing by the action of an acid to generate a polar group.

Hereinafter, the repeating unit represented by General Formula (III) will be described in detail.

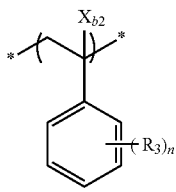
(III)

In General Formula (III), $X_{b2}$ represents a hydrogen atom, an alkyl group, a cyano group, or a halogen atom, $R_3$ represents an organic group which has one or more $CH_3$ partial structures and is stable against an acid, and n represents an integer of 1 to 5.

The alkyl group of $X_{b2}$ is preferably an alkyl group having 1 to 4 carbon atoms, and examples thereof include a methyl group, an ethyl group, a propyl group, a hydroxymethyl group, and a trifluoromethyl group, but a hydrogen atom is preferable.

Since $R_3$ is an organic group stable against an acid, it is preferable that $R_3$ is more specifically an organic group not having the "acid-decomposable group" described in the resin (A).

Examples of $R_3$ include an alkyl group having one or more $CH_3$ partial structures.

The number of the $CH_3$ partial structures contained in the organic group which has one or more $CH_3$ partial structures and is stable against an acid as $R_3$ is preferably from 1 to 10, more preferably from 1 to 8, and still more preferably from 1 to 4.

n represents an integer of 1 to 5, more preferably 1 to 3, and still more preferably 1 or 2.

Specific preferred examples of the repeating unit represented by General Formula (III) are set forth below, but the present invention is not limited thereto.

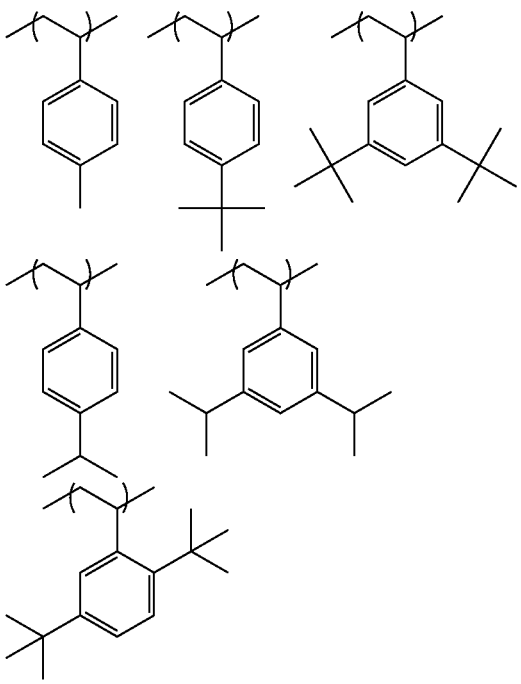

The repeating unit represented by General Formula (III) is preferably a repeating unit which is stable against an acid (non-acid-decomposable), and specifically, it is preferably a repeating unit which does not have a group capable of decomposing by the action of an acid to generate a polar group.

In a case where the hydrophobic resin (D) includes a $CH_3$ partial structure in the side chain moiety thereof, and in particular, it has neither a fluorine atom nor a silicon atom, the content of at least one repeating unit (x) of the repeating unit represented by General Formula (II) or the repeating unit represented by General Formula (III) is preferably 90% by mole or more, and more preferably 95% by mole or more, with respect to all the repeating units of the hydrophobic resin (D). Further, the content is usually 100% by mole or less with respect to all the repeating units of the hydrophobic resin (D).

By incorporating at least one repeating unit (x) of the repeating unit represented by General Formula (II) or the repeating unit represented by General Formula (III) in a proportion of 90% by mole or more with respect to all the repeating units of the hydrophobic resin (D) into the hydrophobic resin (D), the surface free energy of the hydrophobic resin (D) is increased. As a result, it is difficult for the hydrophobic resin (D) to be unevenly distributed on the surface of the resist film and the static/dynamic contact angle of the resist film with respect to water can be securely increased, thereby enhancing the immersion liquid tracking properties.

In addition, in a case where the hydrophobic resin (D) contains (i) a fluorine atom and/or a silicon atom or (ii) a $CH_3$ partial structure in the side chain moiety, the hydrophobic resin (D) may have at least one group selected from the following groups (x) to (z):

(x) an acid group, (y) a group having a lactone structure, an acid anhydride group, or an acid imido group, and (z) a group capable of decomposing by the action of an acid.

Examples of the acid group (x) include a phenolic hydroxyl group, a carboxylic acid group, a fluorinated alcohol group, a sulfonic acid group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, and a tris(alkylsulfonyl)methylene group.

Preferred examples of the acid group include a fluorinated alcohol group (preferably a hexafluoroisopropanol group), a sulfonimido group, and a bis(alkylcarbonyl)methylene group.

Examples of the repeating unit containing an acid group (x) include a repeating unit in which the acid group is directly bonded to the main chain of the resin, such as a repeating unit by an acrylic acid or a methacrylic acid, and a repeating unit in which the acid group is bonded to the main chain of the resin through a linking group, and the acid group may also be introduced into the polymer chain terminal by using a polymerization initiator or chain transfer agent containing an acid group during the polymerization, either of which is preferable.

The repeating unit having an acid group (x) may have at least one of a fluorine atom or a silicon atom. The content of the repeating units having an acid group (x) is preferably 1% to 50% by mole, more preferably 3% to 35% by mole, and still more preferably 5% to 20% by mole, with respect to all the repeating units in the hydrophobic resin (D).

Specific examples of the repeating unit having an acid group (x) are set forth below, but the present invention is not limited thereto. In the formulae, Rx represents a hydrogen atom, CH₃, CF₃, or CH₂OH.
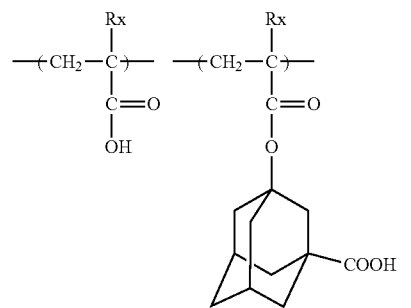
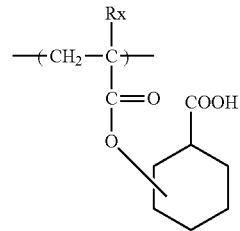
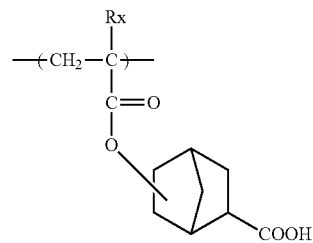
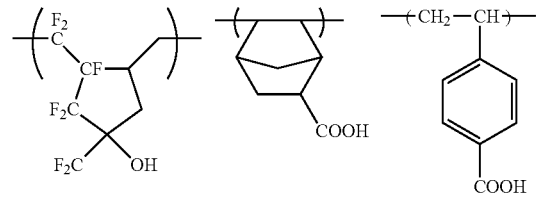
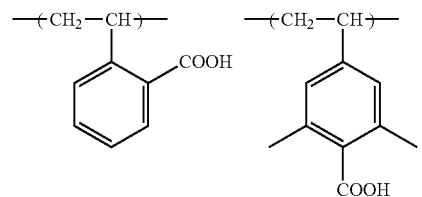
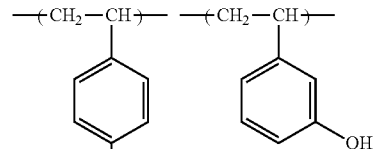
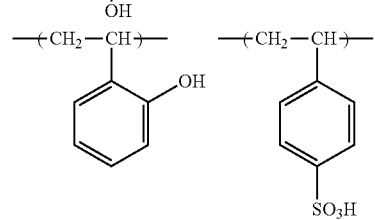
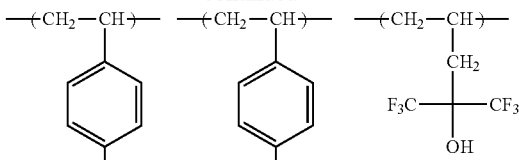
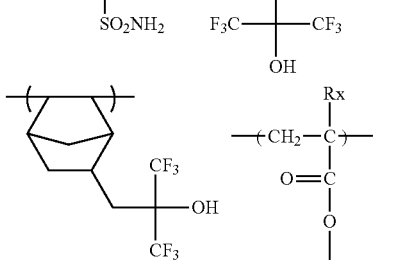
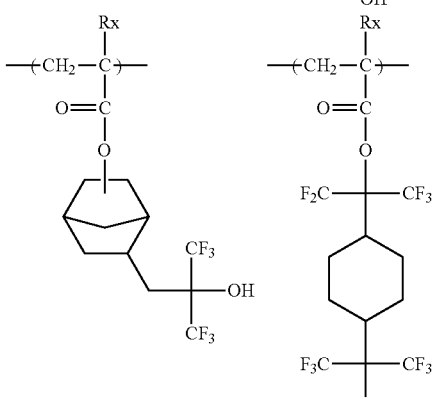
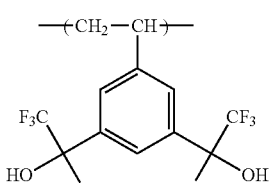
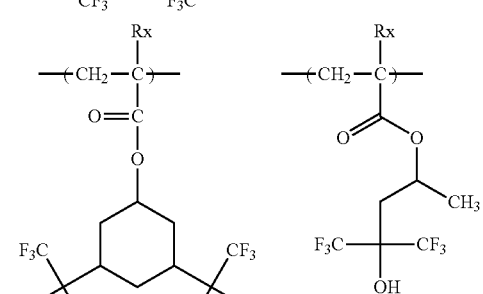
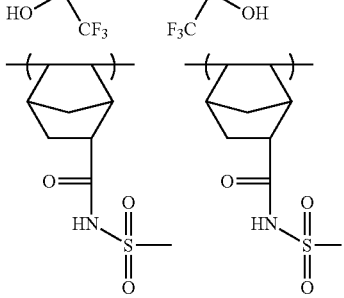

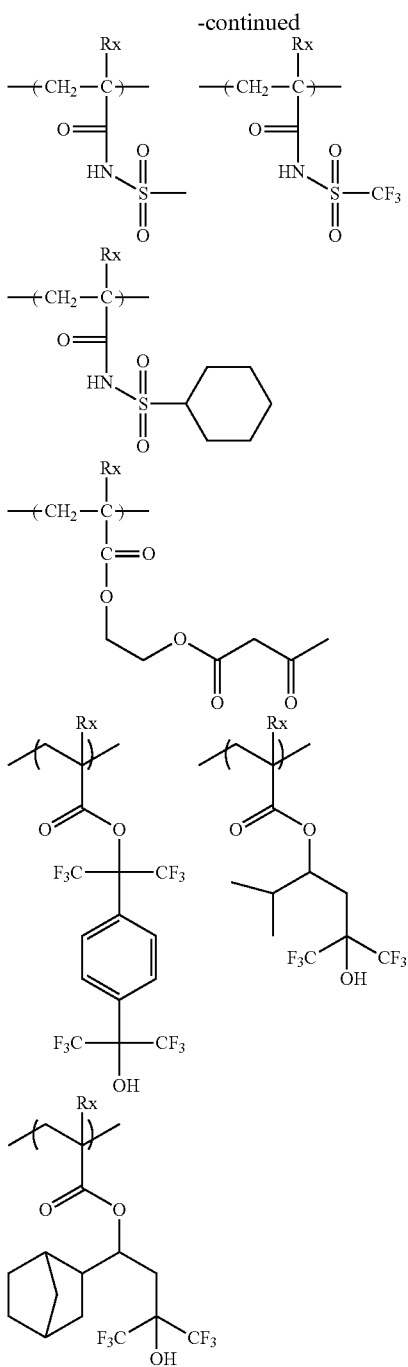

As the group having a lactone structure, the acid anhydride group, or the acid imido group (y), a group having a lactone structure is particularly preferable.

The repeating unit including such a group is, for example, a repeating unit in which the group is directly bonded to the main chain of the resin, such as a repeating unit by an acrylic acid ester or a methacrylic acid ester. This repeating unit may be a repeating unit in which the group is bonded to the main chain of the resin through a linking group. Alternatively this repeating unit may be introduced into the terminal of the resin by using a polymerization initiator or chain transfer agent containing the group during the polymerization.

Examples of the repeating unit having a group having a lactone structure include the same ones as the repeating unit having a lactone structure as described earlier in the section of the resin (A).

The content of the repeating units having a group having a lactone structure, an acid anhydride group, or an acid imido group is preferably 1% to 100% by mole, more preferably 3% to 98% by mole, and still more preferably 5% to 95% by mole, with respect to all the repeating units in the hydrophobic resin (D).

With respect to the hydrophobic resin (D), examples of the repeating unit having a group (z) capable of decomposing by the action of an acid include the same ones as the repeating units having an acid-decomposable group, as mentioned with respect to the resin (A). The repeating unit having a group (z) capable of decomposing by the action of an acid may have at least one of a fluorine atom or a silicon atom. With respect to the hydrophobic resin (D), the content of the repeating units having a group (z) capable of decomposing by the action of an acid is preferably 1% to 80% by mole, more preferably 10% to 80% by mole, and still more preferably 20% to 60% by mole, with respect to all the repeating units in the resin (D).

The hydrophobic resin (D) may further have repeating units different from the above-mentioned repeating units.

The content of the repeating units including a fluorine atom is preferably 10% to 100% by mole, and more preferably 30% to 100% by mole, with respect to all the repeating units included in the hydrophobic resin (D). Further, the content of the repeating units including a silicon atom is preferably 10% to 100% by mole, and more preferably 20% to 100% by mole, with respect to all the repeating units included in the hydrophobic resin (D).

On the other hand, in particular, in a case where the hydrophobic resin (D) includes a $CH_3$ partial structure in the side chain moiety thereof, it is also preferable that the hydrophobic resin (D) has a form not having substantially any one of a fluorine atom and a silicon atom. Further, it is preferable that the hydrophobic resin (D) is substantially composed of only repeating units, which are composed of only atoms selected from a carbon atom, an oxygen atom, a hydrogen atom, a nitrogen atom, and a sulfur atom.

The weight-average molecular weight of the hydrophobic resin (D) in terms of standard polystyrene is preferably 1,000 to 100,000, and more preferably 1,000 to 50,000.

Furthermore, the hydrophobic resins (D) may be used singly or in combination of plural kinds thereof.

The content of the hydrophobic resin (D) in the composition is preferably 0.01% to 10% by mass, and more preferably 0.05% to 8% by mass, with respect to the total solid contents of the composition of the present invention.

In the hydrophobic resin (D), the content of residual monomers or oligomer components is also preferably 0.01% to 5% by mass, and more preferably 0.01% to 3% by mass. Further, the molecular weight distribution (Mw/Mn, also referred to as a dispersity) is preferably in the range of 1 to 5, and more preferably in the range of 1 to 3.

As the hydrophobic resin (D), various commercially available products may also be used, or the resin may be synthesized by an ordinary method (for example, radical polymerization).

[4] Acid Diffusion Control Agent

The composition of the present invention preferably contains an acid diffusion control agent. The acid diffusion control agent acts as a quencher that inhibits a reaction of the acid-decomposable resin in the unexposed area by excessive generated acids by trapping the acids generated from an acid generator or the like upon exposure. As the acid diffusion control agent, a basic compound, a low-molecular-weight compound which has a nitrogen atom and a group that leaves by the action of an acid, a basic compound whose basicity is reduced or lost upon irradiation with actinic rays or radiation, or an onium salt which becomes a relatively weak acid relative to the acid generator can be used.

Preferred examples of the basic compound include compounds having structures represented by Formulae (A) to (E).

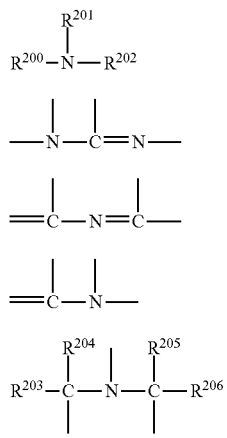

In General Formulae (A) and (E), $R^{200}$, $R^{201}$, and $R^{202}$ may be the same as or different from each other, and each represent a hydrogen atom, an alkyl group (preferably having 1 to 20 carbon atoms), a cycloalkyl group (preferably having 3 to 20 carbon atoms), or an aryl group (having 6 to 20 carbon atoms), and $R^{201}$ and $R^{202}$ may be bonded to each other to form a ring.

$R^{203}$, $R^{204}$, $R^{205}$, and $R^{206}$ may be the same as or different from each other, and each represent an alkyl group having 1 to 20 carbon atoms.

With regard to the alkyl group, the alkyl group having a substituent is preferably an aminoalkyl group having 1 to 20 carbon atoms, a hydroxyalkyl group having 1 to 20 carbon atoms, or a cyanoalkyl group having 1 to 20 carbon atoms.

The alkyl groups in General Formulae (A) and (E) are more preferably unsubstituted.

Preferred examples of the compound include guanidine, aminopyrrolidine, pyrazole, pyrazoline, piperazine, aminomorpholine, aminoalkylmorpholine, and piperidine. More preferred examples of the compound include a compound having an imidazole structure, a diazabicyclo structure, an onium hydroxide structure, an onium carboxylate structure, a trialkylamine structure, an aniline structure, or a pyridine structure; an alkylamine derivative having a hydroxyl group and/or an ether bond; and an aniline derivative having a hydroxyl group and/or an ether bond.

Specific preferred examples of the compound include the compounds exemplified in paragraph [0379] in US2012/0219913A1.

Preferred examples of the basic compound include an amine compound having a phenoxy group, an ammonium salt compound having a phenoxy group, an amine compound having a sulfonic acid ester group, and an ammonium salt compound having a sulfonic acid ester group.

These basic compounds may be used singly or in combination of two or more kinds thereof.

The composition of the present invention may or may not contain the basic compound, but in a case where it contains the basic compound, the content of the basic compound is usually 0.001% to 10% by mass, and preferably 0.01% to 5% by mass, with respect to the solid content of the composition.

The ratio between the acid generator to the basic compound to be used in the composition, in terms of a molar ratio (acid generator/basic compound), is preferably 2.5 to 300, more preferably 5.0 to 200, and still more preferably 7.0 to 150.

The low-molecular-weight compound (hereinafter referred to as a "compound (C)") which has a nitrogen atom and a group that leaves by the action of an acid is preferably an amine derivative having a group that leaves by the action of an acid on a nitrogen atom.

As the group that leaves by the action of an acid, an acetal group, a carbonate group, a carbamate group, a tertiary ester group, a tertiary hydroxyl group, or a hemiaminal ether group are preferable, and a carbamate group or a hemiaminal ether group is particularly preferable.

The molecular weight of the compound (C) is preferably 100 to 1,000, more preferably 100 to 700, and particularly preferably 100 to 500.

The compound (C) may have a carbamate group having a protecting group on a nitrogen atom. The protecting group constituting the carbamate group can be represented by General Formula (d-1).

In General Formula (d-1), $R_b$'s each independently represent a hydrogen atom, an alkyl group (preferably having 1 to 10 carbon atoms), a cycloalkyl group (preferably having 3 to 30 carbon atoms), an aryl group (preferably having 3 to 30 carbon atoms), an aralkyl group (preferably having 1 to 10 carbon atoms), or an alkoxyalkyl group (preferably having 1 to 10 carbon atoms). $R_b$'s may be linked to each other to form a ring.

The alkyl group, the cycloalkyl group, the aryl group, or the aralkyl group represented by $R_b$ may be substituted with a functional group such as a hydroxyl group, a cyano group, an amino group, a pyrrolidino group, a piperidino group, a morpholino group, and an oxo group, an alkoxy group, or a halogen atom. This shall apply to the alkoxyalkyl group represented by $R_b$.

$R_b$ is preferably a linear or branched alkyl group, a cycloalkyl group, or an aryl group, and more preferably a linear or branched alkyl group, or a cycloalkyl group.

Examples of the ring formed by the mutual linking of two $R_b$'s include an alicyclic hydrocarbon group, an aromatic hydrocarbon group, a heterocyclic hydrocarbon group, and derivatives thereof.

Examples of the specific structure of the group represented by General Formula (d-1) include, but are not limited to, the structures disclosed in paragraph [0466] in US2012/0135348A1.

It is particularly preferable that the compound (C) has a structure of General Formula (6).

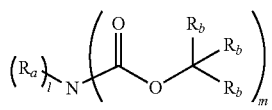
(6)

In General Formula (6), $R_a$ represents a hydrogen atom, an alkyl group, a cycloalkyl group, an aryl group, or an aralkyl group. In a case where l is 2, two $R_a$'s may be the same as or different from each other. Two $R_a$'s may be linked to each other to form a heterocycle may be bonded to each other to form, together with a carbon atom to which they are bonded with the nitrogen atom in the formula. The heterocycle may contain a heteroatom other than the nitrogen atom in the formula.

$R_b$ has the same meaning as $R_b$ in General Formula (d-1), and preferred examples are also the same.

l represents an integer of 0 to 2, and m represents an integer of 1 to 3, satisfying l+m=3.

In General Formula (6), the alkyl group, the cycloalkyl group, the aryl group, and the aralkyl group as $R_a$ may be substituted with the same groups as the group mentioned above as a group which may be substituted in the alkyl group, the cycloalkyl group, the aryl group, and the aralkyl group as $R_b$.

Specific examples of the alkyl group, the cycloalkyl group, the aryl group, and the aralkyl group (such the alkyl group, a cycloalkyl group, an aryl group, and aralkyl group may be substituted with the groups as described above) of $R_a$ include the same groups as the specific examples as described above with respect to $R_b$.

Specific examples of the particularly preferred compound (C) in the present invention include, but are not limited to, the compounds disclosed in paragraph [0475] in US2012/0135348A1.

The compounds represented by General Formula (6) can be synthesized in accordance with JP2007-298569A, JP2009-199021A, and the like.

In the present invention, the low-molecular-weight compound (C) having a group that leaves by the action of an acid on a nitrogen atom may be used singly or in combination of two or more kinds thereof.

The content of the compound (C) in the composition of the present invention is preferably 0.001% to 20% by mass, more preferably 0.001% to 10% by mass, and still more preferably 0.01% to 5% by mass, with respect to the total solid contents of the composition.

The basic compound whose basicity is reduced or lost upon irradiation with actinic rays or radiation (hereinafter also referred to as a "compound (PA)") is a compound which has a functional group with proton-accepting properties, and decomposes under irradiation with actinic rays or radiation to exhibit deterioration in proton-accepting properties, no proton-accepting properties, or a change from the proton-accepting properties to acidic properties.

The functional group with proton-accepting properties refers to a functional group having a group or an electron which is capable of electrostatically interacting with a proton, and for example, means a functional group with a macrocyclic structure, such as a cyclic polyether, or a functional group containing a nitrogen atom having an unshared electron pair not contributing to π-conjugation. The nitrogen atom having an unshared electron pair not contributing to π-conjugation is, for example, a nitrogen atom having a partial structure represented by the following formula.

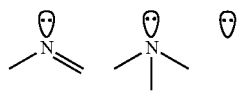

Unshared electron pair

Preferred examples of the partial structure of the functional group with proton-accepting properties include crown ether, azacrown ether, primary to tertiary amines, pyridine, imidazole, and pyrazine structures.

The compound (PA) decomposes upon irradiation with actinic rays or radiation to generate a compound exhibiting deterioration in proton-accepting properties, no proton-accepting properties, or a change from the proton-accepting properties to acidic properties. Here, exhibiting deterioration in proton-accepting properties, no proton-accepting properties, or a change from the proton-accepting properties to acidic properties means a change of proton-accepting properties due to the proton being added to the functional group with proton-accepting properties, and specifically a decrease in the equilibrium constant at chemical equilibrium in a case where a proton adduct is generated from the compound (PA) having the functional group with proton-accepting properties and the proton.

The proton-accepting properties can be confirmed by carrying out pH measurement.

In the present invention, the acid dissociation constant pKa of the compound generated by the decomposition of the compound (PA) upon irradiation with actinic rays or radiation preferably satisfies pKa<−1, more preferably −13<pKa<−1, and still more preferably −13<pKa<−3.

In the present invention, the acid dissociation constant pKa indicates an acid dissociation constant pKa in an aqueous solution, and is described, for example, in Chemical Handbook (II) (Revised 4$^{th}$ Edition, 1993, compiled by the Chemical Society of Japan, Maruzen Company, Ltd.), and a lower value thereof indicates higher acid strength. Specifically, the pKa in an aqueous solution may be measured by using an infinite-dilution aqueous solution and measuring the acid dissociation constant at 25° C., or a value based on the Hammett substituent constants and the database of publicly known literature data can also be obtained by computation using the following software package 1. All the values of pKa described in the present specification indicate values determined by computation using this software package.

Software package 1: Advanced Chemistry Development (ACD/Labs) Software V 8.14 for Solaris (1994-2007 ACD/Labs).

The compound (PA) generates a compound represented by General Formula (PA-1), for example, as the proton adduct generated by decomposition upon irradiation with actinic rays or radiation. The compound represented by General Formula (PA-1) is a compound exhibiting deterioration in proton-accepting properties, no proton-accepting properties, or a change from the proton-accepting properties to acidic properties since the compound has a functional group with proton-accepting properties as well as an acidic group, as compared with the compound (PA).

Q-A-(X)$_n$—B—R　　　(PA-1)

In General Formula (PA-1),

Q represents —$SO_3H$, —$CO_2H$, or —$W_1NHW_2R_f$, in which $R_f$ represents an alkyl group (preferably having 1 to 20 carbon atoms), a cycloalkyl group (preferably having 3 to 20 carbon atoms), or an aryl group (preferably having 6 to 30 carbon atoms), and $W_1$ and $W_2$ each independently represent —$SO_2$— or —CO—.

A represents a single bond or a divalent linking group.

X represents —$SO_2$— or —CO—.

n is 0 or 1.

B represents a single bond, an oxygen atom, or —$N(R_x)R_y$—, in which $R_x$ represents a hydrogen atom or a monovalent organic group, and $R_y$ represents a single bond or a divalent organic group, a provided that $R_x$ may be bonded to $R_y$ to form a ring or may be bonded to R to form a ring.

R represents a monovalent organic group having a functional group with proton-accepting properties.

The compound (PA) is preferably an ionic compound. The functional group with proton-accepting properties may be included in an anion moiety or a cation moiety, but is preferably included in the anion moiety.

Furthermore, in the present invention, compounds (PA) other than a compound capable of generating the compound represented by General Formula (PA-1) can also be appropriately selected. For example, a compound having a proton-accepting moiety at its cation moiety may be used as an ionic compound. More specific examples thereof include a compound represented by General Formula (7).

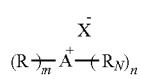

(7)

In the formula, A represents a sulfur atom or an iodine atom.

m represents 1 or 2 and n represents 1 or 2, provided that m+n=3 in a case where A is a sulfur atom and that m+n=2 in a case where A is an iodine atom.

R represents an aryl group.

$R_N$ represents an aryl group substituted with the functional group with proton-accepting properties, and X⁻ represents a counter anion.

Specific examples of X⁻ include the same anions as those of the acid generators as described above.

Specific preferred examples of the aryl group of each of R and $R_N$ include a phenyl group.

Specific examples of the functional group with proton-accepting properties contained in $R_N$ are the same as those of the functional group with proton-accepting properties as described above in Formula (PA-1).

Specific examples of the ionic compounds having a proton acceptor site at a cationic moiety include the compounds exemplified in [0291] of US2011/0269072A1.

In addition, such compounds can be synthesized, for example, with reference to the methods described in JP2007-230913A, JP2009-122623A, and the like.

The compound (PA) may be used singly or in combination of two or more kinds thereof.

The content of the compound (PA) is preferably 0.1% to 10% by mass, and more preferably 1% to 8% by mass, with respect to the total solid content of the composition.

In the composition of the present invention, an onium salt which becomes a relatively weak acid with respect to the acid generator can be used as an acid diffusion control agent.

In a case of mixing the acid generator and the onium salt capable of generating an acid which is a relatively weak acid with respect to an acid generated from the acid generator, and then using the mixture, in a case where the acid generated from the acid generator upon irradiation with actinic rays or radiation collides with an onium salt having an unreacted weak acid anion, a weak acid is discharged by salt exchange, thereby generating an onium salt having a strong acid anion. In this process, the strong acid is exchanged with a weak acid having a lower catalytic ability and therefore, the acid is deactivated in appearance, and thus, it is possible to carry out the control of acid diffusion.

As the onium salt which becomes a relatively weak acid with respect to the acid generator, compounds represented by General Formulae (d1-1) to (d1-3) are preferable.

(d1-1)

(d1-2)

(d1-3)

In the formulae, $R^{51}$ is a hydrocarbon group which may have a substituent, $Z^{2c}$ is a hydrocarbon group (provided that carbon adjacent to S is not substituted with a fluorine atom) having 1 to 30 carbon atoms, which may have a substituent, $R^{52}$ is an organic group, $Y^3$ is a linear, branched, or cyclic alkylene group or arylene group, Rf is a hydrocarbon group including a fluorine atom, and M⁺'s are each independently a sulfonium or iodonium cation.

Preferred examples of the sulfonium cation or the iodonium cation represented by M⁺ include the sulfonium cations exemplified by General Formula (ZI) and the iodonium cations exemplified by General Formula (ZII).

Preferred examples of the anionic moiety of the compound represented by General Formula (d1-1) include the structures exemplified in paragraph [0198] of JP2012-242799A.

Preferred examples of the anionic moiety of the compound represented by General Formula (d1-2) include the structures exemplified in paragraph [0201] of JP2012-242799A.

Preferred examples of the anionic moiety of the compound represented by General Formula (d1-3) include the structures exemplified in paragraphs [0209] and [0210] of JP2012-242799A.

The onium salt which becomes a relatively weak acid with respect to the acid generator may be a compound (hereinafter also referred to as a "compound (CA)") having a cationic moiety (C) and an anionic moiety in the same molecule, in which the cationic moiety and the anionic moiety are linked to each other through a covalent bond.

As the compound (CA), a compound represented by any one of General Formulae (C-1) to (C-3) is preferable.

(C-1)

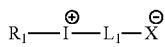
(C-2)

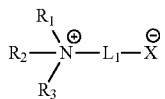
(C-3)

In General Formulae (C-1) to (C-3), $R_1$, $R_2$, and $R_3$ represent a substituent having 1 or more carbon atoms.

$L_1$ represents a divalent linking group that links a cationic moiety with an anionic moiety, or a single bond.

—$X^-$ represents an anionic moiety selected from —$COO^-$, —$SO_3^-$, —$SO_2^-$, and —$N^-$—$R_4$. $R_4$ represents a monovalent substituent having a carbonyl group: —C(=O)—, a sulfonyl group: —S(=O)$_2$—, or a sulfinyl group: —S(=O)— at a site for linking to an adjacent N atom.

$R_1$, $R_2$, $R_3$, $R_4$, and $L_1$ may be bonded to one another to form a ring structure. Further, in (C-3), two members out of $R_1$ to $R_3$ may be combined to form a double bond with an N atom.

Examples of the substituent having 1 or more carbon atoms in each of $R_1$ to $R_3$ include an alkyl group, a cycloalkyl group, an aryl group, an alkyloxycarbonyl group, a cycloalkyloxycarbonyl group, an aryloxycarbonyl group, an alkylaminocarbonyl group, a cycloalkylaminocarbonyl group, and an arylaminocarbonyl group, and preferably an alkyl group, a cycloalkyl group, and an aryl group.

Examples of $L_1$ as a divalent linking group include a linear or branched alkylene group, a cycloalkylene group, an arylene group, a carbonyl group, an ether bond, ester bond, amide bond, a urethane bond, a urea bond, and a group formed by a combination of two or more kinds of these groups. $L_1$ is more preferably alkylene group, an arylene group, an ether bond, ester bond, and a group formed by a combination of two or more kinds of these groups.

Preferred examples of the compound represented by General Formula (C-1) include the compounds exemplified in paragraphs [0037] to [0039] of JP2013-6827A and paragraphs [0027] to [0029] of JP2013-8020A.

Preferred examples of the compound represented by General Formula (C-2) include the compounds exemplified in paragraphs [0012] and [0013] of JP2012-189977A.

Preferred examples of the compound represented by General Formula (C-3) include the compounds exemplified in paragraphs [0029] to [0031] of JP2012-252124A.

The content of the onium salt which becomes a relatively weak acid with respect to the acid generator is preferably 0.5% to 10.0% by mass, more preferably 0.5% to 8.0% by mass, and still more preferably 1.0% to 8.0% by mass, with respect to the solid content of the composition.

[5] Solvent

The composition of the present invention usually contains a solvent.

Examples of the solvent which can be used in the preparation of the composition include organic solvents such as alkylene glycol monoalkyl ether carboxylate, alkylene glycol monoalkyl ether, alkyl lactate ester, alkyl alkoxypropionate, a cyclic lactone (preferably having 4 to 10 carbon atoms), a monoketone compound (preferably having 4 to 10 carbon atoms) which may have a ring, alkylene carbonate, alkyl alkoxyacetate, and alkyl pyruvate.

Specific examples of these solvents include the solvents described in [0441] to [0455] in US2008/0187860A.

In the present invention, a mixed solvent obtained by mixing a solvent containing a hydroxyl group and a solvent containing no hydroxyl group in the structure may be used as the organic solvent.

As the solvent containing a hydroxyl group and the solvent containing no hydroxyl group, the aforementioned exemplary compounds can be appropriately selected, but as the solvent containing a hydroxyl group, an alkylene glycol monoalkyl ether, alkyl lactate, and the like are preferable, and propylene glycol monomethyl ether (PGME, alternative name: 1-methoxy-2-propanol), ethyl lactate, and methyl 2-hydroxyisobutyrate are more preferable. Further, as the solvent containing no hydroxyl group, alkylene glycol monoalkyl ether acetate, alkyl alkoxy propionate, a monoketone compound which may contain a ring, cyclic lactone, alkyl acetate, and the like are preferable. Among these, propylene glycol monomethyl ether acetate (PGMEA, alternative name: 1-methoxy-2-acetoxypropane), ethyl ethoxypropionate, 2-heptanone, γ-butyrolactone, cyclohexanone, and butyl acetate are particularly preferable, and propylene glycol monomethyl ether acetate, ethyl ethoxypropionate, and 2-heptanone are most preferable.

The mixing ratio (mass ratio) of the solvent containing a hydroxyl group to the solvent containing no hydroxyl group is 1/99 to 99/1, preferably 10/90 to 90/10, and more preferably 20/80 to 60/40. A mixed solvent whose proportion of the solvent containing no hydroxyl group is 50% by mass or more is particularly preferable from the viewpoint of coating evenness.

The solvent preferably includes propylene glycol monomethyl ether acetate, and is preferably a solvent composed of propylene glycol monomethyl ether acetate singly or a mixed solvent of two or more kinds of solvents containing propylene glycol monomethyl ether acetate.

[6] Surfactant

The composition of the present invention may or may not further contain a surfactant. In a case where the composition contains the surfactant, it is more preferable that the composition contains any one of fluorine- and/or silicon-based surfactants (a fluorine-based surfactant, a silicon-based surfactant, and a surfactant having both a fluorine atom and a silicon atom).

By incorporating the surfactant into the composition of the present invention, it becomes possible to provide a resist pattern having improved adhesiveness and decreased development defects with good sensitivity and resolution in a case where an exposure light source of 250 nm or less, and particularly 220 nm or less, is used.

Examples of the fluorine- and/or silicon-based surfactants include the surfactants described in paragraph [0276] in US2008/0248425A.

In addition, in the present invention, surfactants other than the fluorine- and/or silicon-based surfactants described in paragraph [0280] in US2008/0248425A can also be used.

These surfactants may be used singly or in combination of a few surfactants.

In a case where the composition of the present invention contains a surfactant, the content of the surfactant is preferably 0.0001% to 2% by mass, and more preferably 0.0005% to 1% by mass, with respect to the total solid contents of the composition.

On the other hand, by setting the amount of the surfactant to be added to 10 ppm or less with respect to the total amount (excluding the solvent) of the composition, the hydrophobic resin is more unevenly distributed to the surface, so that the resist film surface can be made more hydrophobic, which can enhance the water tracking properties during the liquid immersion exposure.

[7] Other Additives

The composition of the present invention may or may not contain an onium carboxylate salt. Examples of such an onium carboxylate salt include those described in [0605] and [0606] in US2008/0187860A.

The onium carboxylate salt can be synthesized by reacting sulfonium hydroxide, iodonium hydroxide, ammonium hydroxide and carboxylic acid with silver oxide in a suitable solvent.

In a case where the composition of the present invention contains the onium carboxylate salt, the content of the salt is generally 0.1% to 20% by mass, preferably 0.5% to 10% by mass, and more preferably 1% to 7% by mass, with respect to the total solid contents of the composition.

The composition of the present invention may further contain an acid proliferation agent, a dye, a plasticizer, a light sensitizer, a light absorbent, an alkali-soluble resin, a dissolution inhibitor, a compound promoting solubility in a developer (for example, a phenol compound with a molecular weight of 1,000 or less, an alicyclic or aliphatic compound having a carboxyl group), and the like, as desired.

Such a phenol compound having a molecular weight of 1,000 or less can be easily synthesized by those skilled in the art with reference to the method described in, for example, JP1992-122938A (JP-H04-122938A), JP1990-28531A (JP-H02-28531A), U.S. Pat. No. 4,916,210A, EP219294B, or the like.

Specific examples of the alicyclic compound or aliphatic compound having a carboxyl group include, but not limited to, a carboxylic acid derivative having a steroid structure such as a cholic acid, deoxycholic acid or lithocholic acid, an adamantane carboxylic acid derivative, adamantane dicarboxylic acid, cyclohexane carboxylic acid, and cyclohexane dicarboxylic acid.

The concentration of the solid contents of the composition according to the present invention is usually 1.0% to 10% by mass, preferably 2.0% to 5.7% by mass, and more preferably 2.0% to 5.3% by mass. By setting the concentration of the solid contents to these ranges, it is possible to uniformly coat the resist solution on a substrate and additionally, it is possible to form a resist pattern having excellent line width roughness. The reason is not clear, but it is considered that, by setting the concentration of the solid contents to 10% by mass or less, and preferably 5.7% by mass or less, the aggregation of materials, particularly the photoacid generator, in the resist solution is suppressed, and as the result, it is possible to form a uniform resist film.

The concentration of the solid contents is the mass percentage of the mass of other resist components excluding the solvent with respect to the total mass of the composition.

A method for preparing the composition of the present invention is not particularly limited, but the composition is preferably prepared by dissolving the above-mentioned respective components in a predetermined organic solvent, and preferably in the mixed solvent, and filtering the solution through a filter. The filter for use in filtration through a filter is preferably a polytetrafluoroethylene-, polyethylene-, or nylon-made filter with a pore size of 0.1 μm or less, more preferably 0.05 μm or less, and still more preferably 0.03 μm or less. In the filtration through a filter, as described in, for example, JP2002-62667A, circulating filtration may be carried out, or the filtration may be carried out by connecting plural kinds of filters in series or in parallel. In addition, the composition may be filtered in plural times. Furthermore, the composition may be subjected to a deaeration treatment or the like before or after filtration through a filter.

The composition of the present invention relates to an actinic ray-sensitive or radiation-sensitive resin composition whose properties change by undergoing a reaction upon irradiation with actinic rays or radiation. More specifically, the present invention relates to an actinic ray-sensitive or radiation-sensitive resin composition which can be used in a step of manufacturing a semiconductor such as an IC, for manufacture of a circuit board for a liquid crystal, a thermal head, or the like, the manufacture of a mold structure for imprinting, other photofabrication processes, a planographic printing plate, or an acid-curable composition.

[Procedure of Step (1)]

The procedure of the step (1) is not particularly limited, but examples thereof include a method in which the composition of the present invention is applied onto a substrate, and subjected to a curing treatment, as desired (application method), and a method in which a resist film is formed on a temporary support and the resist film is transferred onto a substrate. Among those, the application method is preferable due to excellent productivity.

The substrate is not particularly limited, and a substrate such as an inorganic substrate such as silicon, $SiO_2$, and SiN, and a coating type inorganic substrate such as spin on glass (SOG), which are generally used in a process for manufacturing a semiconductor such as an IC, a process for manufacturing a circuit board for a liquid crystal, a thermal head, or the like, and other lithographic processes of photofabrication can be used. In addition, an antireflection film may further be formed between the resist film and the substrate, as desired. As the antireflection film, a known organic or inorganic antireflection film can be appropriately used. Further, the pattern forming method of the present invention may be combined with a two-layer resist process, for example, as disclosed in JP2008-083384A, or may be combined with a process including performing multiple exposure and development as disclosed in WO2011/122336A. In a case where the present invention is combined with the process disclosed in WO2011/122336A, it is preferable that the pattern forming method of the present invention is applied as the second negative tone pattern forming method in Claim 1 of WO2011/122336A.

[Resist Film]

The thickness of the resist film is not particularly limited, but is preferably 1 to 500 nm, and more preferably 1 to 100 nm since a fine pattern with higher accuracy can be formed. By setting the concentration of the solid contents in the composition to an appropriate range to obtain a suitable viscosity, the coatability and the film forming properties can be improved, thereby providing such a film thickness.

In addition, the present invention also relates to an actinic ray-sensitive or radiation-sensitive film (resist film) formed using the composition of the present invention.

[Step (2): Exposing Step]

The step (2) is a step of irradiating (exposing) the film (resist film) formed in the step (1) with (to) actinic rays or radiation.

The light used for the exposure is not particularly limited, and examples thereof include infrared rays, visible light, ultraviolet rays, far ultraviolet rays, extreme ultraviolet rays, X-rays, and electron beams, preferably far ultraviolet rays at a wavelength of 250 nm or less, more preferably far ultraviolet rays at a wavelength of 220 nm or less, and still more preferably far ultraviolet rays at a wavelength of 1 to 200 nm.

More specific examples thereof include a KrF excimer laser (248 nm), an ArF excimer laser (193 nm), an $F_2$ excimer laser (157 nm), X-rays, EUV (13 nm), and electron beams. Among these, the KrF excimer laser, the ArF excimer laser, EUV, or the electron beams are preferable, and the ArF excimer laser is more preferable.

A liquid immersion exposure method can be applied to the exposing step. It is possible to combine the liquid immersion exposure method with super-resolution technology such as a phase shift method and a modified illumination method. The liquid immersion exposure can be carried out by the method described in, for example, paragraphs [0594] to [0601] of JP2013-242397A.

Moreover, in a case where the receding contact angle of the resist film formed using the composition of the present invention is extremely small, it cannot be suitably used in a case of carrying out exposure through a liquid immersion medium, and further, an effect of reducing watermark defect cannot be sufficiently exhibited. In order to realize a preferred receding contact angle, it is preferable to incorporate the hydrophobic resin (D) into the composition. Alternatively, a film (hereinafter also referred to as a "topcoat") sparingly soluble in an immersion liquid, which is formed with the hydrophobic resin (D) on the upper layer of the resist film, may be provided on the upper layer of a resist film including the hydrophobic resin (D). The functions required for the topcoat are coating suitability on the upper layer part of the resist film, and sparing solubility in an immersion liquid. It is preferable that the topcoat is not mixed with the composition film and can be uniformly applied onto the upper layer of the composition film.

The topcoat is not particularly limited, and a topcoat known in the related art can be formed by a method known in the related art. Examples of the known topcoat include the topcoats described in JP2013-519765A, JP2008-309678A, and JP2014-56194A.

In the liquid immersion exposure step, it is necessary for the immersion liquid to move on a wafer following the movement of an exposure head which scans the wafer at a high speed to form an exposed pattern. Therefore, the contact angle of the immersion liquid for the resist film in a dynamic state is important, and the resist is required to have a performance of allowing the immersion liquid to follow the high-speed scanning of an exposure head with no remaining of a liquid droplet.

The film irradiated with actinic rays or radiation in the step (2) after the step (2) and before the step (3) which will be described later may be subject to a heating treatment (PEB: post-exposure bake). The reaction in the exposed area in the present step is accelerated. The heating treatment (PEB) may be carried out plural times.

The temperature for the heating treatment is preferably 70° C. to 130° C., and more preferably 80° C. to 120° C.

The time for the heating treatment is preferably 30 to 300 seconds, more preferably 30 to 180 seconds, and still more preferably 30 to 90 seconds.

Heating treatment may be carried out using a means equipped in an ordinary exposure/development machine, or may also be carried out using a hot plate or the like.

[Step (3): Developing Step]

The step (3) is a step of developing the film irradiated with actinic rays or radiation in the step (2) using a developer.

The developer may be either an alkali developer or a developer including an organic solvent, but is preferably a developer including an organic solvent.

As the alkali developer, a quaternary ammonium salt typified by tetramethylammonium hydroxide is usually used, but in addition, an aqueous alkali solution such as an inorganic alkali, primary to tertiary amines, alcohol amine, and cyclic amine can also be used.

Specifically, as the alkali developer, for example, aqueous alkali solutions of inorganic alkalis such as sodium hydroxide, potassium hydroxide, sodium carbonate, sodium silicate, sodium metasilicate, and aqueous ammonia; primary amines such as ethylamine and n-propylamine; secondary amines such as diethylamine and di-n-butylamine; tertiary amines such as triethylamine and methyldiethylamine; alcohol amines such as dimethylethanolamine and triethanolamine; quaternary ammonium salts such as tetramethylammonium hydroxide and tetraethylammonium hydroxide; cyclic amines such as pyrrole and piperidine; or the like can be used. Among these, an aqueous tetraethylammoniumhydroxide solution is preferably used.

Furthermore, an appropriate amount of alcohols or a surfactant may also be added to the alkali developer. The alkali concentration of the alkali developer is usually 0.1% to 20% by mass. The pH of the alkali developer is usually 10.0 to 15.0.

The time for performing development using an alkali developer is usually 10 to 300 seconds.

The alkali concentration (and the pH) of the alkali developer and the developing time can be appropriately adjusted, depending on the patterns to be formed.

Washing may be carried out using a rinsing liquid after the development using an alkali developer, and as the rinsing liquid, pure water is used and an appropriate amount of a surfactant may be added thereto before the use.

Furthermore, after the developing treatment or the rinsing treatment, a treatment for removing the developer or rinsing liquid adhering on the pattern by a supercritical fluid may be carried out.

In addition, a heating treatment can be carried out in order to remove the moisture content remaining in the pattern after the rinsing treatment or the treatment using a supercritical fluid.

As the developer (hereinafter also referred to as an organic developer) including an organic solvent, polar solvents and hydrocarbon-based solvents such as a ketone-based solvent, an ester-based solvent, an alcohol-based solvent, an amide-based solvent, and an ether-based solvent can be used, and specific examples thereof include, in addition to, for example, those described in paragraphs [0461] to [0463] of JP2014-048500A, methyl 2-hydroxyisobutyrate, butyl butyrate, isobutyl isobutyrate, butyl propionate, butyl butanoate, and isoamyl acetate.

Furthermore, in an aliphatic hydrocarbon-based solvent which is a hydrocarbon-based solvent, a mixture of compounds having the same carbon atoms and different structures may be included. For example, in a case where decane is used as the aliphatic hydrocarbon-based solvent, 2-methylnonane, 2,2-dimethyloctane, 4-ethyloctane, isodecane, or the like, which is a compound having the same carbon atoms and different structures, may be included in the aliphatic hydrocarbon-based solvent.

Incidentally, one kind of the compound having the same carbon atoms and different structures may be included, or a plurality of kinds of the compound as described above may be included.

The solvents may used by mixing a plurality of the solvents or by mixing the solvent of water or solvents other than the solvents. However, in order to sufficiently exhibit the effects of the present invention, it is preferable that the moisture content in the entire developer is less than 10% by mass, but it is more preferable that the developer substantially does not contain water.

That is, the content of the organic solvent with respect to the organic developer is preferably from 90% by mass to 100% by mass, and preferably from 95% by mass to 100% by mass, with respect to the total amount of the developer.

In particular, the organic developer is preferably a developer containing at least one organic solvent selected from the group consisting of a ketone-based solvent, an ester-based solvent, an alcohol-based solvent, an amide-based solvent, and an ether-based solvent.

The vapor pressure of the organic developer at 20° C. is preferably 5 kPa or less, more preferably 3 kPa or less, and particularly preferably 2 kPa or less. By setting the vapor pressure of the organic developer to 5 kPa or less, the evaporation of the developer on the substrate or in a developing cup is suppressed, the temperature uniformity in the wafer surface is improved, and as a result, the dimensional uniformity within a wafer surface is improved.

It is possible to add an appropriate amount of a surfactant to the organic developer, as desired.

The surfactant is not particularly limited, but it is possible to use, for example, ionic or non-ionic fluorine- and/or silicon-based surfactants, or the like. Examples of the fluorine- and/or silicon-based surfactant include the surfactants described in JP1987-36663A (JP-S62-36663A), JP1986-226746A (JP-S61-226746A), JP1986-226745A (JP-S61-226745A), JP1987-170950A (JP-S62-170950A), JP1988-34540A (JP-S63-34540A), JP1995-230165A (JP-H7-230165A), JP1996-62834A (JP-H8-62834A), JP1997-54432A (JP-H9-54432A), JP1997-5988A (JP-H9-5988A), U.S. Pat. No. 5,405,720A, U.S. Pat. No. 5,360,692A, U.S. Pat. No. 5,529,881A, U.S. Pat. No. 5,296,330A, U.S. Pat. No. 5,436,098A, U.S. Pat. No. 5,576,143A, U.S. Pat. No. 5,294,511A, and U.S. Pat. No. 5,824,451A, and a non-ionic surfactant is preferable. The non-ionic surfactant is not particularly limited, but it is more preferable to use a fluorine-based surfactant or a silicon-based surfactant.

The amount of the surfactant to be used is usually 0.001% to 5% by mass, preferably 0.005% to 2% by mass, and more preferably 0.01% to 0.5% by mass, with respect to the total amount of the developer.

The organic developer may include a basic compound. Specific and preferred examples of the basic compound which can be included in the organic developer used in the present invention are the same as those for the basic compound which can be included in the composition of the present invention, as mentioned above as the acid diffusion control agent.

It is preferable that the method includes a step of washing using a rinsing liquid after the step of carrying out development using a developer including an organic solvent.

The rinsing liquid used in the rinsing step after the step of carrying out development using a developer including an organic solvent is not particularly limited as long as the rinsing liquid does not dissolve the resist pattern, and a solution including a common organic solvent can be used. As the rinsing liquid, a rinsing liquid containing at least one organic solvent selected from the group consisting of a hydrocarbon-based solvent, a ketone-based solvent, an ester-based solvent, an alcohol-based solvent, an amide-based solvent, and an ether-based solvent is preferably used.

Specific examples of the hydrocarbon-based solvent, the ketone-based solvent, the ester-based solvent, the alcohol-based solvent, the amide-based solvent, and the ether-based solvent are the same as those described for the developer containing an organic solvent.

After the developing step using a developer including an organic solvent, it is more preferable to carry out a step of carrying out washing using a rinsing liquid containing at least one organic solvent selected from the group consisting of a ketone-based solvent, an ester-based solvent, an alcohol-based solvent, an amide-based solvent, and a hydrocarbon-based solvent, it is still more preferable to carry out a step of carrying out washing using a rinsing liquid containing an alcohol-based solvent or an ester-based solvent, it is particularly preferable to carry out a step of carrying out washing using a rinsing liquid containing a monohydric alcohol, and it is most preferable to carry out a step of carrying out washing using a rinsing liquid containing a monohydric alcohol having 5 or more carbon atoms.

The rinsing liquid containing the hydrocarbon-based solvent is preferably a hydrocarbon compound having 6 to 30 carbon atoms, more preferably a hydrocarbon compound having 8 to 30 carbon atoms, and particularly preferably a hydrocarbon compound having 10 to 30 carbon atoms. By using a rinsing liquid including decane and/or undecane among these, pattern collapse is suppressed.

In a case where the ester-based solvent is used as the organic solvent, a glycol ether-based solvent may be used, in addition to the ester-based solvent (one kind or two or more kinds). Specific examples of such a case include use of an ester-based solvent (preferably butyl acetate) as a main component and a glycol ether-based solvent (preferably propylene glycol monomethyl ether (PGME)) as a side component. Thus, residue defects are suppressed.

Here, examples of the monohydric alcohol used in the rinsing step include linear, branched, or cyclic monohydric alcohols, and specifically, 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol, 4-octanol, or the like can be used. Further, 1-hexanol, 2-hexanol, 4-methyl-2-pentanol, 1-pentanol, 3-methyl-1-butanol, or the like can be used as a particularly preferred monohydric alcohol having 5 or more carbon atoms.

The respective components in plural numbers may be mixed, or the components may be mixed with an organic solvent other than the above solvents, and used.

The moisture content of the rinsing liquid is preferably 10% by mass or less, more preferably 5% by mass or less, and particularly preferably 3% by mass or less. By setting the moisture content to 10% by mass or less, good development characteristics can be obtained.

The vapor pressure at 20° C. of the rinsing liquid which is used after the step of carrying out development using a developer including an organic solvent is preferably from 0.05 kPa to 5 kPa, more preferably from 0.1 kPa to 5 kPa, and most preferably from 0.12 kPa to 3 kPa. By setting the vapor pressure of the rinsing liquid to a range from 0.05 kPa to 5 kPa, the temperature uniformity within a wafer surface is improved, and further, the dimensional uniformity within a wafer surface is enhanced by suppression of swelling due to the permeation of the rinsing liquid.

The rinsing liquid can also be used after adding an appropriate amount of a surfactant thereto.

In the rinsing step, the wafer which has been subjected to development using a developer including an organic solvent is subjected to a washing treatment using the rinsing liquid including an organic solvent. A method for the washing treatment is not particularly limited, and for example, a method in which a rinsing liquid is continuously discharged on a substrate rotated at a constant rate (a rotation application method), a method in which a substrate is immersed in a tank filled with a rinsing liquid for a certain period of time (a dip method), a method in which a rinsing liquid is sprayed on a substrate surface (a spray method), or the like, can be applied. Among these, a method in which a washing treatment is carried out using the rotation application method, and a substrate is rotated at a rotation speed of 2,000 rpm to 4,000 rpm after washing, thereby removing the rinsing liquid from the substrate, is preferable. Further, it is preferable that a heating step (post bake) is included after the rinsing step. The residual developer and the rinsing liquid between and inside the patterns are removed by the baking. The heating step after the rinsing step is carried out at typically 40° C. to 160° C., and preferably 70° C. to 95° C., and typically for 10 seconds to 3 minutes, and preferably for 30 seconds to 90 seconds.

As the developing method, for example, a method in which a substrate is immersed in a tank filled with a developer for a certain period of time (a dip method), a method in which a developer is heaped up to the surface of a substrate by surface tension and developed by stopping for a certain period of time (a puddle method), a method in which a developer is sprayed on the surface of a substrate (a spray method), a method in which a developer is continuously discharged on a substrate spun at a constant rate while scanning a developer discharging nozzle at a constant rate (a dynamic dispense method), or the like, can be applied. Further, suitable ranges of the discharge pressure of the developer to be discharged, methods for adjusting the discharge pressure of the developer, and the like are not particularly limited, and for example, the ranges and the methods described in paragraphs [0631] to [0636] of JP2013-242397A can be used.

In the pattern forming method of the present invention, a step of carrying out development by using a developer containing an organic solvent (organic solvent developing step) and a step of carrying out development by using an aqueous alkali solution (alkali developing step) may be used in combination. Due to this combination, a finer pattern can be formed.

In the present invention, an area with a low exposure intensity is removed in the organic solvent developing step, and by further carrying out the alkali developing step, an area with a high exposure intensity is also removed. By virtue of multiple development processes in which development is carried out in plural times in this manner, a pattern can be formed by keeping only a region with an intermediate exposure intensity from not being dissolved, so that a finer pattern than usual can be formed (the same mechanism as in paragraph [0077] of JP2008-292975A).

In the pattern forming method of the present invention, the order of the alkali developing step and the organic solvent developing step are not particularly limited, but it is more preferable that the alkali developing step is carried out prior to the organic solvent developing step.

It is preferable that various materials (for example, a resist solvent, a developer, a rinsing liquid, a composition for forming an antireflection film, and a composition for forming a topcoat) used in the composition of the present invention and the pattern forming method of the present invention do not include impurities such as metals. The content of the metal components included in these materials is preferably 1 part per million (ppm) or less, more preferably 100 parts per trillion (ppt) or less, and still more preferably 10 ppt or less, but the material not having substantially metal components (within a detection limit of a measurement apparatus or less) is particularly preferable.

Examples of a method for removing impurities such as metals from the various materials include filtration using a filter. As for the filter pore diameter, the pore size is preferably 50 nm or less, more preferably 10 nm or less, and still more preferably 5 nm or less. As for the materials of a filter, a polytetrafluoroethylene-made filter, a polyethylene-made filter, and a nylon-made filter are preferable. In the step of filtration using a filter, plural kinds of filters may be connected in series or in parallel, and used. In a case of using plural kinds of filters, a combination of filters having different pore diameters and/or materials may be used. In addition, various materials may be filtered plural times, and the step of filtering plural times may be a circulatory filtration step.

Moreover, examples of the method for reducing the impurities such as metals included in the various materials include a method involving selecting raw materials having a small content of metals as raw materials constituting various materials, a method involving subjecting raw materials constituting various materials to filtration using a filter, and a method involving performing distillation under the condition with contamination being suppressed to the largest degree by, for example, lining the inside of a device with TEFLON (registered trademark). The preferred conditions for filtration using a filter, which is carried out for raw materials constituting various materials, are the same as described above.

In addition to the filtration using a filter, removal of impurities by an adsorbing material may be carried out, or a combination of filtration using a filter and an adsorbing material can be used. As the adsorbing material, known adsorbing materials may be used, and for example, inorganic adsorbing materials such as silica gel and zeolite, and organic adsorbing materials such as activated carbon can be used.

It is necessary to prevent the incorporation of metal impurities in the production process in order to reduce the impurities such as metals included in the various materials. Sufficient removal of metal impurities from a production device can be checked by measuring the content of metal components included in a washing liquid used to wash the production device. The content of the metal components included in the washing liquid after the use is preferably 100 parts per trillion (ppt) or less, more preferably 10 ppt or less, and particularly preferably 1 ppt or less.

An electrically conductive compound may be added to the organic treatment liquid (a resist solvent, a developer, a rinsing liquid, or the like) used in the composition of the present invention and the pattern forming method of the present invention in order to prevent failure of chemical liquid pipe and various parts (a filter, an O-ring, a tube, or the like) due to electrostatic charge, and subsequently generated electrostatic discharge. The electrically conductive compound is not particularly limited and examples thereof include methanol. The addition amount is not particularly limited, but from the viewpoint of maintaining preferred development characteristics, it is preferably 10% by mass or less, and more preferably 5% by mass or less. For members of the chemical liquid pipe, various pipes coated with stainless steel (SUS), or a polyethylene, polypropylene, or fluorine resin (a polytetrafluoroethylene or perfluoroalkoxy resin, or the like) that has been subjected to an antistatic treatment can be used. In the same manner, for the filter or the O-ring, polyethylene, polypropylene, or fluorine resin (a polytetrafluoroethylene or perfluoroalkoxy resin, or the like) that has been subjected to an antistatic treatment can be used.

A method for improving the surface roughness of a pattern may be applied to the pattern formed by the method of the present invention. Examples of the method for improving the surface roughness of a pattern include the method of treating a resist pattern by a plasma of a hydrogen-containing gas disclosed in WO2014/002808A1. In addition, known methods as described in JP2004-235468A, US2010/0020297A, JP2009-19969A, and Proc. of SPIE Vol. 832883280N-1 "EUV Resist Curing Technique for LWR Reduction and Etch Selectivity Enhancement" may be applied.

The pattern forming method of the present invention can be used for a guide pattern formation in a directed self-assembly (DSA) (see, for example, ACS Nano Vol. 4, No. 8, Pages 4815-4823).

In addition, a resist pattern formed by the method can be used as a core material (core) of the spacer process disclosed in JP1991-270227A (JP-H03-270227A) and JP2013-164509A.

In addition, the present invention further relates to a method for manufacturing an electronic device, including the above-described pattern forming method of the present invention, and an electronic device manufactured by the method for manufacturing an electronic device.

The electronic device of the present invention is suitably mounted on electric or electronic equipment (for example, home electronics, office automation (OA)-related equipment, media-related equipment, optical equipment, and telecommunication equipment).

EXAMPLES

Hereinafter, the present invention will be described in more details with reference to Examples, but the present invention is not limited thereto.

[Preparation of Monomers for Examples]
<Preparation Example 1: Monomer 1>
A 5%-by-mass ethyl acetate solution of a commercially available product (manufactured by Hybrid Plastics Inc.) of a monomer 1 (with regard to the chemical structural formula thereof, refer to the formula below) was passed through a column packed with alumina (manufactured by Wako Pure Chemical Industries, Co., Ltd.) (a first step), then the filtrate was filtered through a polytetrafluoroethylene filter with a pore diameter of 0.01 μm (a second step), and ethyl acetate as the liquid was volatilized to prepare the monomer 1.

The measurement results of $^1$H-NMR of the prepared monomer 1 are as follows.
$^1$H-NMR (300 MHz, CDCl$_3$) δ=6.12 (s, 1H), 5.53 (s, 1H), 4.12 (t, 2H), 1.95 (s, 3H), 1.70-1.89 (m, 2H), 1.02 (t, 21H), 0.73 (t, 2H), 0.56 (dd, 14H)

<Preparation Example 2: Monomer 2>
To 100 g of a 10%-by-mass propylene glycol monomethyl ether acetate (PGMEA) solution of a commercially available product (manufactured by Hybrid Plastics Inc.) of a monomer 2 (with regard to the chemical structural formula thereof, refer to the formula below) was added 10.0 g of activated carbon (manufactured by Wako Pure Chemical Industries, Co., Ltd.), and the mixture was stirred for 1 hour at room temperature and filtered through Celite to remove activated carbon. Then, this solution was subjected to a liquid separation operation together with 0.01 N aqueous hydrochloric acid, and then washed with 0.01 N aqueous ammonia and distilled water (a second step) to prepare a PGMEA solution of the monomer 2.

<Preparation Example 3: Monomer 3>
A synthetic product of a monomer 3 (with regard to the chemical structural formula thereof, refer to the formula below) was subjected to purification by distillation at 1 mmHg and 40° C. to prepare the monomer 3.

<Preparation Example 4: Monomer 4>
A commercially available product (manufactured by Hybrid Plastics Inc.) of a monomer 4 (with regard to the chemical structural formula thereof, refer to the formula below) was subjected to purification by sublimation at 0.1 mmHg and 50° C. to prepare the monomer 4.

<Preparation Example 5: Monomer 5>
A commercially available product (manufactured by Hybrid Plastics Inc.) of a monomer 5 (with regard to the chemical structural formula thereof, refer to the formula below) was heated and dissolved in acetonitrile, and crystallized (a first step), then a 10% by mass MEK solution of the monomer 5 obtained by mixing the crystalline product with methyl ethyl ketone (MEK) was passed through an ion exchange resin filter (IonKleen SL manufactured by PALL Corporation) (a second step), and MEK as the liquid was volatilized to prepare the monomer 5.

<Preparation Example 6: Monomer 6>
A 10%-by-mass ethyl acetate solution of a commercially available product (manufactured by Shin-Etsu Chemical Co., Ltd.) of a monomer 6 (with regard to the chemical structural formula thereof, refer to the formula below) was filtered through a polyethylene filter with a pore diameter of 0.01 μm, and ethyl acetate as the liquid was volatilized to prepare the monomer 6.

<Preparation Example 7: Monomer 7>
A 10%-by-mass ethyl acetate solution of a commercially available product (manufactured by Tokyo Kasei Kogyo Co., Ltd.) of a monomer 7 (with regard to the chemical structural formula thereof, refer to the formula below) was passed through a column packed with silica gel (manufactured by Kanto Chemical Co., Inc.) (a first step), then the filtrate was filtered through a polyvinylidene fluoride filter with a pore diameter of 0.03 μm (a second step), and ethyl acetate as the liquid was volatilized to prepare the monomer 7.

<Preparation Example 8: Monomer 8>
A 20%-by mass cyclohexanone solution of a synthetic product of a monomer 8 (with regard to the chemical structural formula thereof, refer to the formula below) was filtered through a nylon filter with a pore diameter of 0.1 μm to prepare a cyclohexanone solution of the monomer 8.

<Preparation Example 9: Monomer 9>
A 15%-by-mass ethyl acetate solution of a synthetic product (manufactured by Tokyo Kasei Kogyo Co., Ltd.) of a monomer 9 (with regard to the chemical structural formula thereof, refer to the formula below) was centrifuged (conditions: 7,000 (×g), 20 min) using a centrifuge (MX-300 manufactured by Tomy Seiko Co., Ltd.) (a first step), then the filtrate was filtered through a polysulfone filter with a pore diameter of 0.1 μm (a second step), and ethyl acetate as the liquid was volatilized to prepare the monomer 9.

<Preparation Example 10: Monomer 10>
A 5%-by-mass hexane solution of a synthetic product (manufactured by Tokyo Kasei Kogyo Co., Ltd.) of a monomer 10 (with regard to the chemical structural formula thereof, refer to the formula below) was passed through a column packed with FLORISIL (manufactured by Wako Pure Chemical Industries, Co., Ltd.) (a first step), then the filtrate was filtered through a nylon filter with a pore diameter of 0.03 μm (a second step), and hexane as the liquid was volatilized to prepare the monomer 10.

[Preparation of Monomers for Comparative Examples]

<Preparation Example 11: Monomer 1>

As a monomer 1 for Comparative Examples, the commercially available product (manufactured by Hybrid Plastics Inc.) of the monomer 1 (with regard to the chemical structural formula thereof, refer to the formula below) was used as received.

<Preparation Example 12: Monomer 5>

A 10%-by-mass ethyl acetate solution of a commercially available product (manufactured by Hybrid Plastics Inc.) of a monomer 5 (with regard to the chemical structural formula thereof, refer to the formula below) was filtered through a polyethylene filter with a pore diameter of 1.5 μm, and ethyl acetate as the liquid was volatilized to prepare the monomer 5 for Comparative Examples.

<Monomer 1>

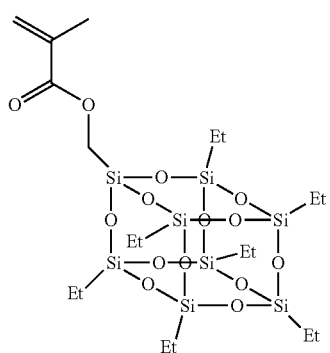

<Monomer 2>

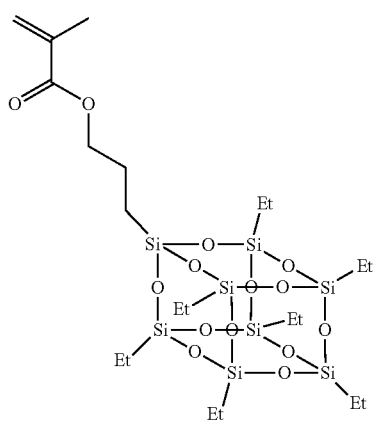

<Monomer 3>

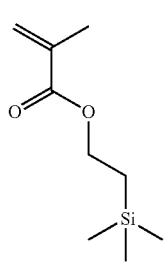

<Monomer 4>

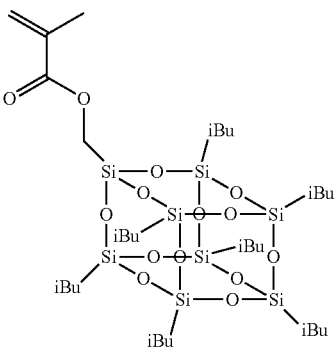

<Monomer 5>

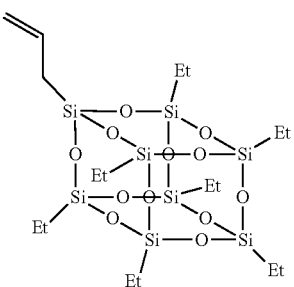

<Monomer 6>

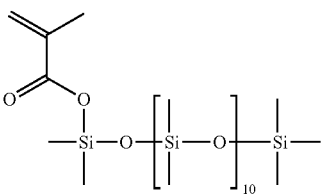

<Mononmer 7>

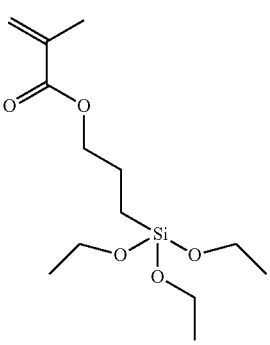

<Monomer 8>

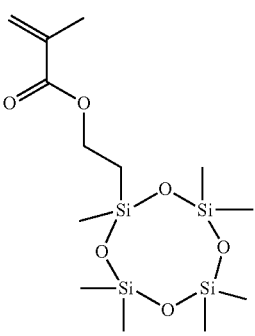

-continued

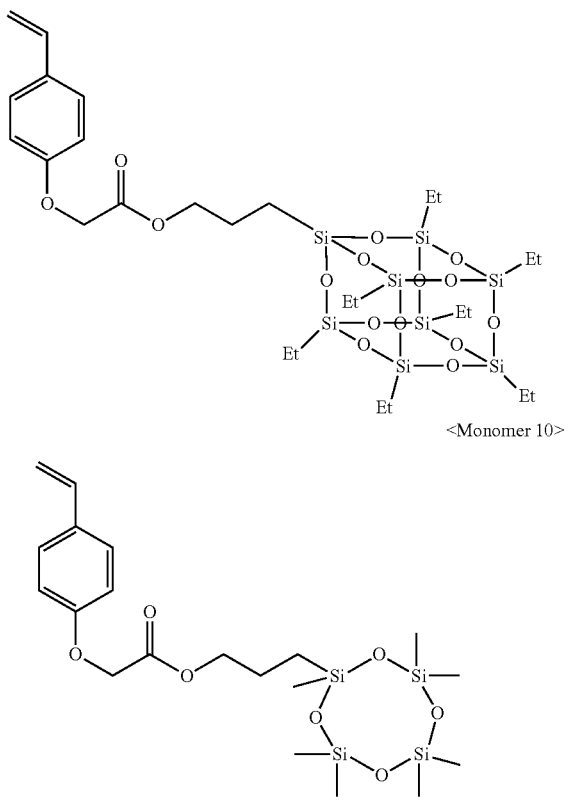

<Monomer 9>

<Monomer 10>

<Measurement of Turbidity>

For each of the monomers 1 to 10 for Examples obtained as described above, and the monomers 1 and 5 for Comparative Examples, the turbidity was measured.

Specifically, the turbidity was measured by firstly performing calibration of an integrating sphere type turbid meter "SEP-PT-706D type" (manufactured by Mitsubishi Chemical Corporation) at 25° C., using a standard plate including formazin as a reference material, preparing a 15%-by-mass ethyl acetate solution of a sample (monomer having a silicon atom), putting 5 g of the solution into a cell with a thickness of 10 mm, leaving it to stand as it was for 3 minutes, and measuring the turbidity at 25° C., using the calibrated turbid meter.

The turbidity was evaluated according to the following standard.

S: 0.1 ppm or less
A: more than 0.1 ppm and 0.8 ppm or less
B: more than 0.8 ppm and 1 ppm or less
C: more than 1 ppm and 5 ppm or less
D: more than 5 ppm and 10 ppm or less
E: more than 10 ppm <Regarding GPC Purity>

For each of the monomers 1 to 10 for Examples obtained as described above, and the monomers 1 and 5 for Comparative Examples, the GPC purity was measured.

Method for measuring GPC purity: The measurement was performed gel permeation chromatography (GPC). As columns, a connection of TSKgel SuperHZ 2000 (4.6 mm I.D×15 cm, manufactured by Tosoh Corporation) and TSK-gel SuperHZ 1000 (4.6 mm I.D×15 cm, manufactured by Tosoh Corporation) was used, the eluent was tetrahydrofuran, the flow rate was 0.4 mL/min, the column temperature was 40° C., a differential refractometer detector was used as the detector, the sample was a tetrahydrofuran solution at a concentration of 5.0% by weight, and the injection amount as 20 µL. In the obtained chromatogram, in a case where peaks are separated, the area is vertically divided from the minimum value among the peaks, and in a case where peaks are overlapped, the area is vertically divided from the inflection point among the peaks, and the area percentage of the main peak is calculated from the area values of the obtained respective peaks.

The GPC purity was evaluated according to the following standard.

S: 99% or more
A: 97% or more and less than 99%
B: 95% or more and less than 97%
C: 93% or more and less than 95%
D: 90% or more and less than 93%
E: less than 90%

The measurement results of the turbidity and the GPC purity are shown in Table 1.

<Synthesis Example of Resin 1>

60.7 g of a mixed solvent of PGMEA/cyclohexanone 6/4 (mass ratio) was put into a three-necked flask under a nitrogen stream, and heated at 80° C. A solution in which 6.14 g, 14.0 g, and 10.24 g of the monomers corresponding to the repeating units of the above-described resin 1 from the left side, and a polymerization initiator V-601 (manufactured by Wako Pure Chemical Industries, Ltd., 0.532 g) had been dissolved in a mixed solvent of PGMEA/cyclohexanone at 6/4 (mass ratio) was added dropwise thereto for 6 hours. After the dropwise addition, the mixture was further allowed to undergo a reaction for 2 hours at 80° C. The reaction solution was left to be cooled and added dropwise to a mixed liquid of 1,286 g of methanol/143 g of water for 20 min, and the precipitated powder was collected by filtration and dried to obtain the following resin 1 (24.6 g) which is an acid-decomposable resin. NMR compositional ratio of the repeating units obtained from (nuclear magnetic resonance) method (molar ratio) was 7/50/43. The weight-average molecular weight and the dispersity (Mw/Mn), in terms of standard polystyrene, of the obtained resin 1 were 18,000 and 1.6, respectively.

In the same manner as in Synthesis Example 1 except that the monomers corresponding to the repeating units of the resins set forth below were used at the compositional ratios (the molar ratios; corresponding to the repeating units in order from the left side) described in Table 1, resins for Examples 2 to 10 and resins 1 and 5 for Comparative Examples were synthesized.

The structures of the resins 1 to 10 are set forth below. Further, Et represents an ethyl group and iBu represents an isobutyl group.

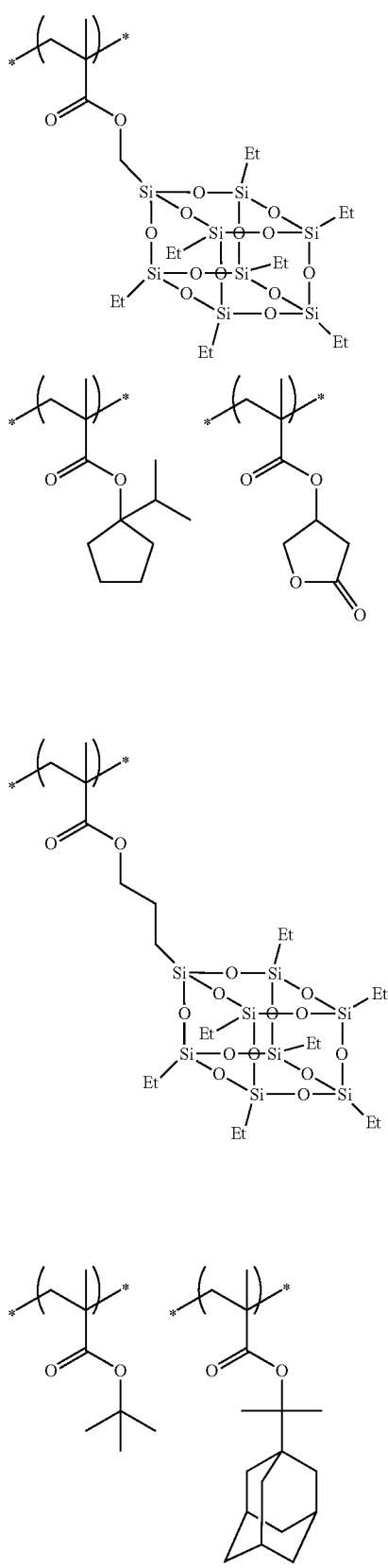
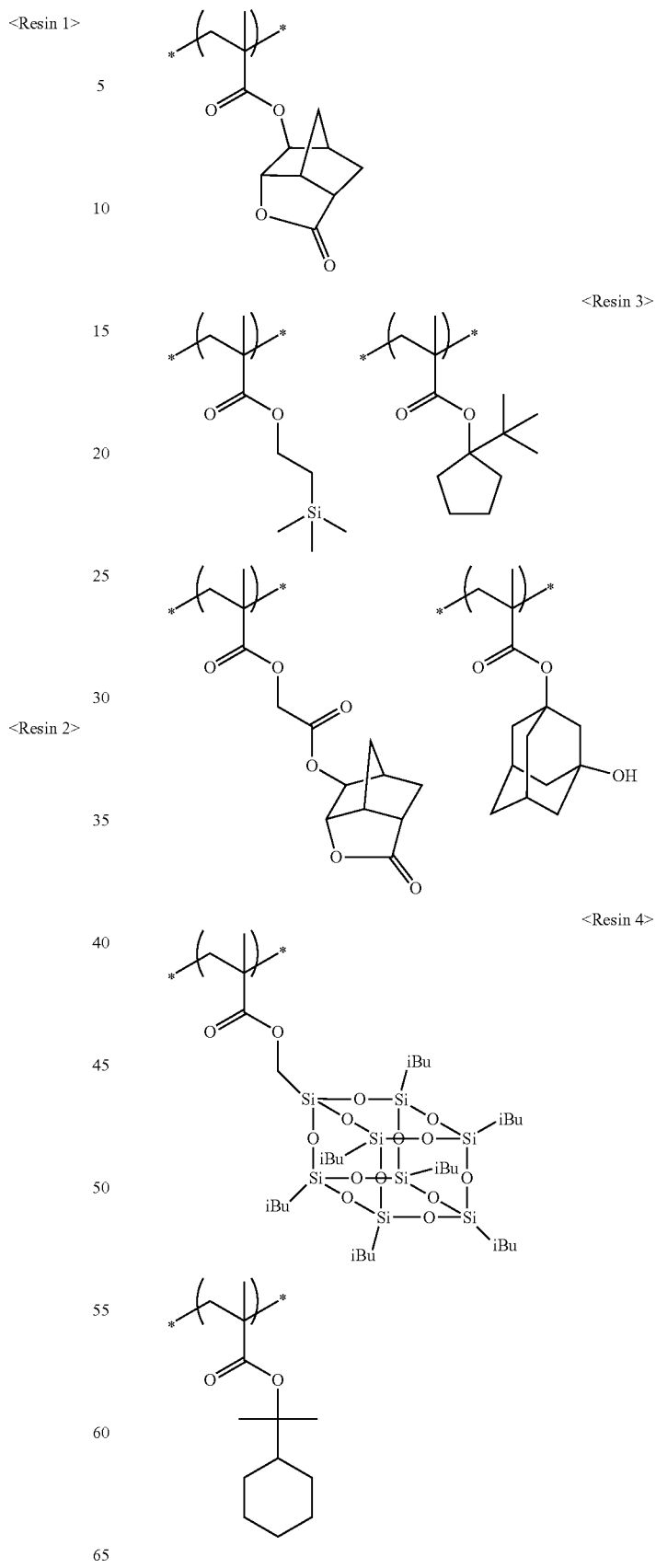

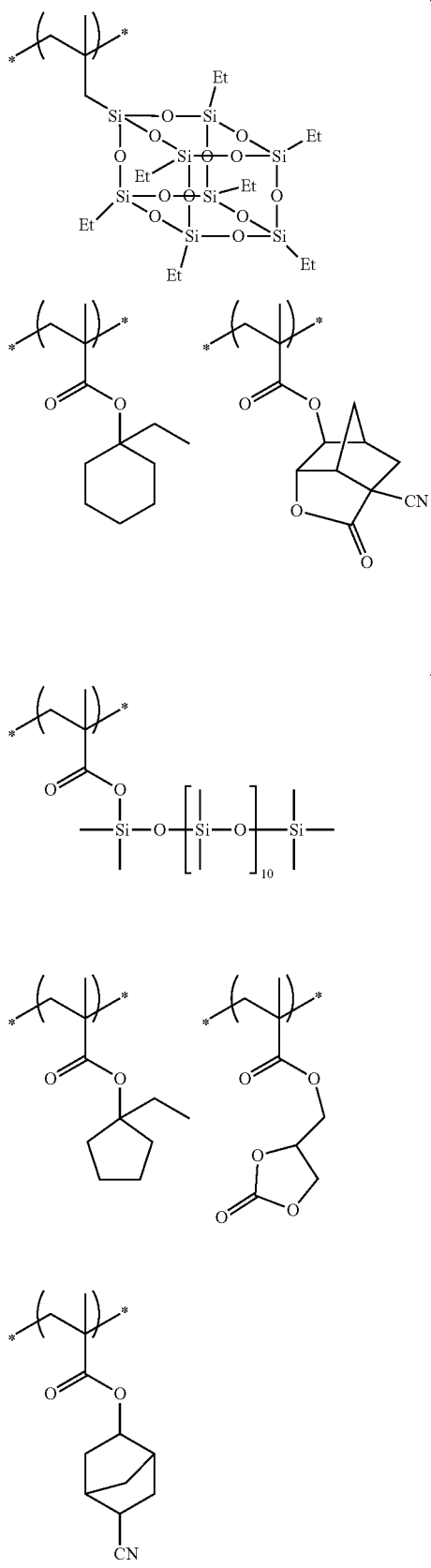
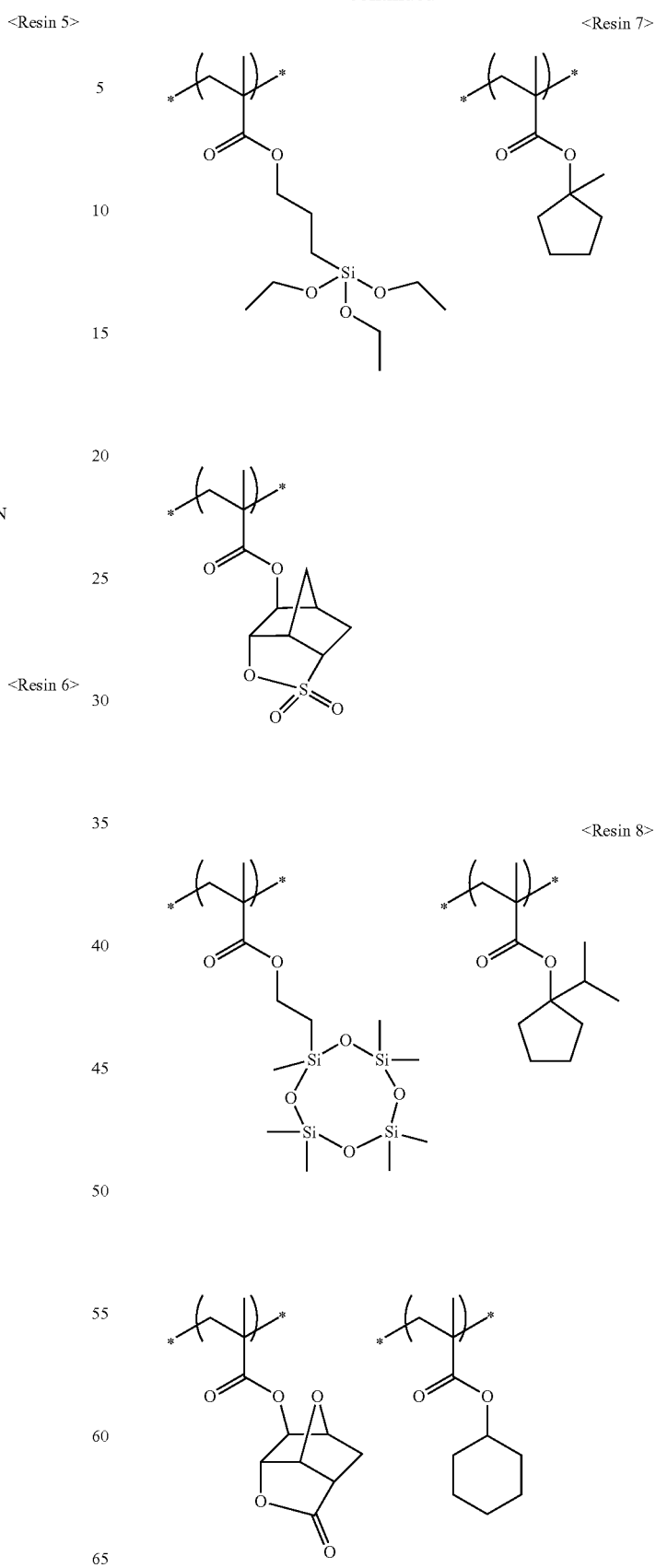

-continued

<Resin 9>

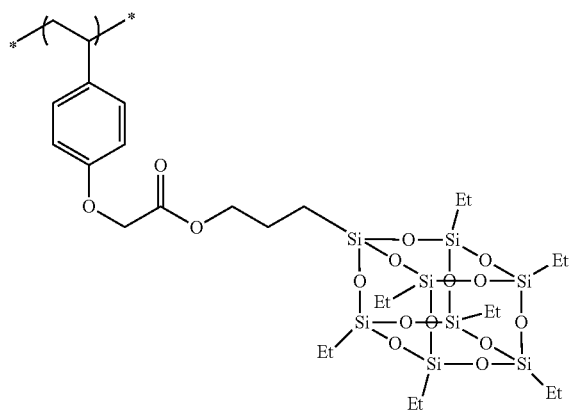

<Resin 10>

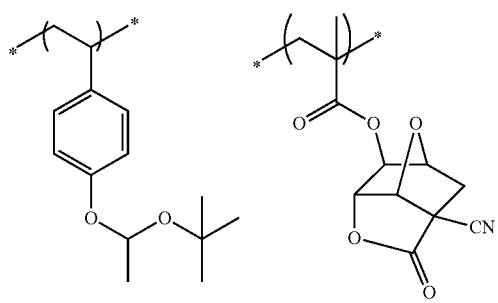

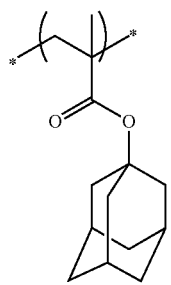

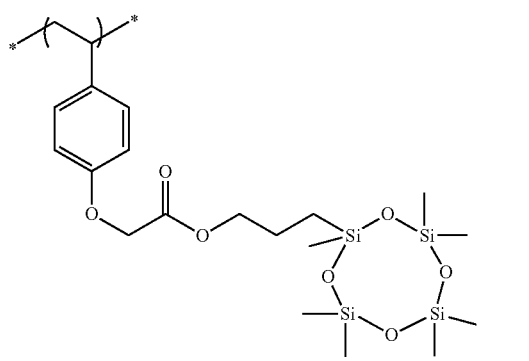

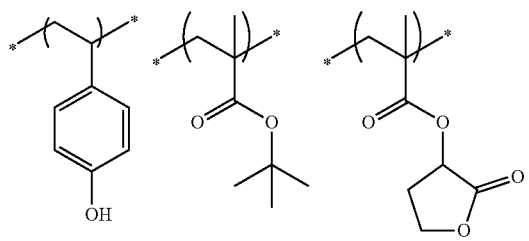

[Examples 1 to 10 and Comparative Examples 1 and 2]

<Preparation of Resist Composition>

The resin (84.0% by mass with respect to the total solid content of the composition) shown in Table 1, the following acid generator A-1 (11.3% by mass with respect to the total solid content of the composition), the following acid generator A-2 (2.5% by mass with respect to the total solid content of the composition), and the following basic compound B-1 (2.2% by mass with respect to the total solid content of the composition) were dissolved in a mixed solvent of propylene glycol monomethyl ether acetate (PGMEA)/cyclohexanone (CyHx)=70/30 (mass ratio) such that the total solid content became 4.9% by mass. The dissolution liquid was filtered through a polyethylene filter with a pore size of 0.1 μm to prepare an actinic ray-sensitive or radiation-sensitive resin composition (resist composition).

Acid generator

A-1

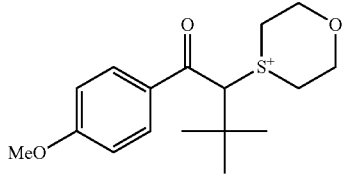

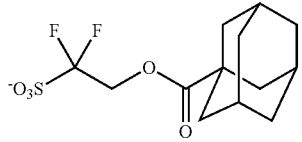

A-2

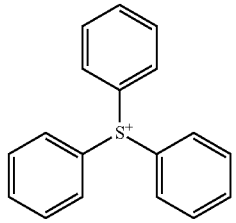

Basic compound

B-1

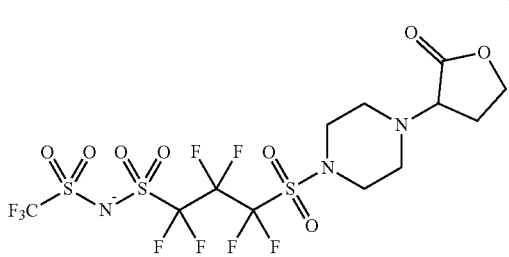

-continued

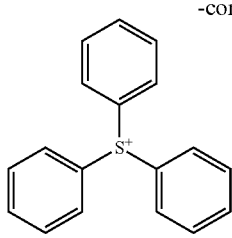

<Formation of Resist Film>

The actinic ray-sensitive or radiation-sensitive resin composition solution was applied onto an Si wafer having an organic antireflection film (ARC29A, manufactured by Brewer Science Ltd.) applied thereon, using a spin coater RF3S manufactured by SOKUDO, and dried on a hot plate at 100° C. for 60 seconds to obtain a resist film with a film thickness of 75 nm.

<Formation of Resist Pattern (ArF Liquid Immersion Exposure)>

(Examples 1 to 8 and Comparative Examples 1 and 2)

The wafer having the resist film applied thereon was subjected to pattern exposure, using an ArF excimer laser liquid immersion scanner (manufactured by ASML, XT1700i, NA1.20, Dipole, outer sigma 0.900, inner sigma 0.700, and Y deflection). Further, as the reticle, a 6% halftone mask with a line size=50 nm and line:space=1:1 was used. Further, as the immersion liquid, ultrapure water was used. After exposure, the wafer was heated on a hot plate at 90° C. for 60 seconds, and then developed with a developer shown in the following table to obtain a line-and-space pattern with a pitch of 100 nm, a space width of 35 nm (corresponding to "a desired space width dimension" which will be described later), and a line width of 65 nm.

<Formation of Resist Pattern (Electron Beam (EB) Exposure)>

(Example 9)

The wafer having the resist film applied thereon was subjected to pattern irradiation, using an electron beam lithography apparatus (manufactured by Hitachi Ltd., HL750, an accelerating voltage of 50 keV). At this time, lithography was performed such that a 1:1 line-and-space was formed. After exposure, the wafer was heated on a hot plate at 90° C. for 60 seconds, and then developed with a developer shown in the following table to obtain a line-and-space pattern with a pitch of 100 nm, a space width of 50 nm (corresponding to "a desired space width dimension" which will be described later), and a line width of 50 nm.

<Formation of Resist Pattern (EUV Exposure)>

(Example 10)

The wafer having the resist film applied thereon was subjected to pattern irradiation, using an EUV exposure apparatus (manufactured by Exitech, Micro Exposure Tool, NA 0.3, Quadrupol, outer sigma 0.68, inner sigma 0.36). Further, as the reticle, a mask with line:space=1:1 was used. After exposure, the wafer was heated on a hot plate at 90° C. for 60 seconds, and then developed with a developer shown in the following table to obtain a line-and-space pattern with a pitch of 100 nm, a space width of 50 nm (corresponding to "a desired space width dimension" which will be described later), and a line width of 50 nm.

<Evaluation of Resist Pattern>

[Evaluation of Development Defects]

For the silicon wafer having the pattern with a desired space width thereon, the number of development defects was measured by a defect inspection apparatus KLA 2360 (manufactured by KLA Tencor Co.), and the number of development defects per unit area [1 $cm^2$] was counted. A smaller value thereof indicates better results.

Scum defects were evaluated according to the following standard.

S: 1 defect/$cm^2$ or less
A: more than 1 defect/$cm^2$ or less and 4 defects/$cm^2$ or less
B: more than 4 defects/$cm^2$ and 7 defects/$cm^2$ or less
C: more than 7 defects/$cm^2$ and 10 defects/$cm^2$ or less
D: more than 10 defects/$cm^2$ and 13 defects/$cm^2$ or less
E: more than 13 defects/$cm^2$

TABLE 1

| | Monomer having silicon atom | Purification method | | Turbidity | GPC purity | Resin | Compositional ratio | Mw | Mw/Mn | Light source | Developer | Scum defect |
| | | First step | Second step | | | | | | | | | |
|---|---|---|---|---|---|---|---|---|---|---|---|---|
| Example 1 | Monomer 1 | Alumina | PTFE filter (0.01 μm) | S | S | Resin 1 | 7/50/43 | 18,000 | 1.6 | ArF | D-1 | S |
| Example 2 | Monomer 2 | Activated carbon | Liquid separation | S | A | Resin 2 | 10/45/7/38 | 17,000 | 1.5 | ArF | D-1 | S |
| Example 3 | Monomer 3 | Distillation | — | B | B | Resin 3 | 18/40/32/10 | 8,000 | 1.7 | ArF | D-1 | B |
| Example 4 | Monomer 4 | Sublimation | — | A | A | Resin 4 | 20/80 | 15,000 | 1.5 | ArF | D-1 | A |
| Example 5 | Monomer 5 | Crystallization | IonKleen filter | A | A | Resin 5 | 8/52/40 | 10,000 | 1.6 | ArF | D-1 | S |
| Example 6 | Monomer 6 | PE (0.1 μm) | — | B | B | Resin 6 | 20/40/30/10 | 12,000 | 1.4 | ArF | D-1 | B |
| Example 7 | Monomer 7 | Silica gel | PVDF filter (0.03 μm) | B | B | Resin 7 | 10/50/40 | 6,000 | 1.9 | ArF | D-1 | A |
| Example 8 | Monomer 8 | Nylon (0.1 μm) | — | B | B | Resin 8 | 15/45/35/5 | 16,000 | 1.5 | ArF | D-1 | B |
| Example 9 | Monomer 9 | Centrifugation | Polysulfone filter (0.1 μm) | S | B | Resin 9 | 25/35/30/10 | 10,000 | 1.8 | EB | D-2 | S |
| Example 10 | Monomer 10 | FLORISIL | Nylon (0.3 μm) | B | B | Resin 10 | 30/20/40/10 | 5,000 | 1.7 | EUV | D-1 | A |
| Comparative Example 1 | Monomer 1 | No treatment | — | E | E | Resin 1 | 7/50/43 | 18,000 | 1.6 | ArF | D-1 | E |

TABLE 1-continued

| | Monomer having silicon atom | Purification method | | Turbidity | GPC purity Resin | Compositional ratio | Mw | Mw/Mn | Light source | Developer | Scum defect |
| --- | --- | --- | --- | --- | --- | --- | --- | --- | --- | --- | --- |
| | | First step | Second step | | | | | | | | |
| Comparative Example 2 | Monomer 5 | PE (1.5 μm) | — | D | E Resin 5 | 15/50/35 | 10,000 | 1.6 | ArF | D-1 | D |

D-1: Butyl acetate
D-2: 2.38%-by-mass Aqueous tetramethylammonium hydroxide solution As can be seen from Table 1, in Examples 1 to 10 in which the monomers having a silicon atom as defined in the present invention were used, the scum defect performance was very excellent, as compared with Comparative Examples 1 and 2 in which the monomers were not used. In particular, in Examples 1, 2, 5, and 9 in which the monomers having a silsesquioxane structure were used and the purification method was carried out through a 2-stage step, superior results were exhibited.

Furthermore, in Example 9 in which alkali development and electron beams (EB) exposure were used as well as Example 10 in which EUV exposure was used, excellent scum defect performance was expressed.

In addition, in Examples in which the GPC purity was higher, the scum defect performance tended to be superior.

According to the present invention, it is possible to provide a pattern forming method which is capable of remarkably improving scum defect performance, particularly in formation of an ultrafine pattern (for example, a line-and-space pattern having a line width of 50 nm or less, or a hole pattern having a hole diameter of 50 nm or less), a method for manufacturing an electronic device, a monomer for producing a resin for a semiconductor device manufacturing process, a resin, a method for producing a resin, an actinic ray-sensitive or radiation-sensitive resin composition, and an actinic ray-sensitive or radiation-sensitive film.

Although the present invention has been described in detail and with reference to specific embodiments, it is obvious to those skilled in the art that various changes or modifications can be made without departing from the spirit and scope of the present invention.

What is claimed is:

1. A pattern forming method comprising a film forming step of forming a film using a resin composition containing a resin (A) obtained from a monomer having a silicon atom, the monomer having a turbidity of 1 ppm or less based on JIS K0101:1998 using formazin as a reference material and an integrating sphere measurement system as a measurement system, and
   wherein the resin (A) includes a repeating unit having an acid-decomposable group.

2. The pattern forming method according to claim 1, wherein the resin composition contains the resin (A) and a compound generating an acid upon irradiation with actinic rays or radiation,
   the monomer having a silicon atom and a turbidity of 1 ppm or less has a silsesquioxane structure, and
   the resin (A) has a repeating unit represented by General Formula (AI) as the repeating unit having an acid-decomposable group:

General Formula (AI)

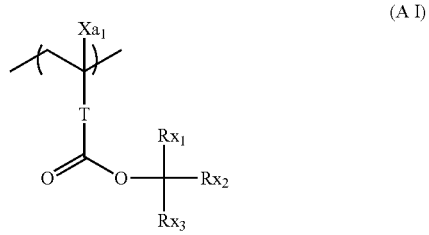

wherein in General Formula (AI), $X_{a1}$ represents a hydrogen atom, an alkyl group, a cyano group, or a halogen atom; T represents a single bond or a divalent linking group; $R_{x1}$ to $R_{x3}$ each independently represents an alkyl group or a cycloalkyl group; and two of $R_{x1}$ to $R_{x3}$ may be bonded to each other to form a ring structure.

3. The pattern forming method according to claim 1, wherein the resin composition contains the resin (A) and a compound generating an acid upon irradiation with actinic rays or radiation, and
   the monomer having a silicon atom is purified by filtration with a filter of which the pore diameter is 1.0 μm or less, centrifugation, adsorption, liquid separation, distillation, sublimation, crystallization, or a combination of two or more thereof.

4. A pattern forming method comprising:
   a film forming step of forming a film using an actinic ray-sensitive or radiation-sensitive resin composition containing a resin (A);
   an exposing step of irradiating the film with actinic rays or radiation; and
   a developing step of developing the film irradiated with actinic rays or radiation,
   wherein the resin (A) is a resin obtained from a monomer having a silicon atom, the monomer having a turbidity of 1 ppm or less based on JIS K0101:1998 using formazin as a reference material and an integrating sphere measurement system as a measurement system, and
   the resin (A) includes a repeating unit having an acid-decomposable group.

5. The pattern forming method according to claim 4, wherein the monomer having a silicon atom and a turbidity of 1 ppm or less has a silsesquioxane structure.

6. The pattern forming method according to claim 5, wherein the silsesquioxane structure is a cage type silsesquioxane structure.

7. The pattern forming method according to claim 4, wherein the resin (A) includes a repeating unit having at least one of a lactone structure, a sultone structure, or a carbonate structure.

8. The pattern forming method according to claim 4,
wherein the developing step is a step of carrying out development using a developer including an organic solvent.

9. A method for manufacturing an electronic device, comprising the pattern forming method according to claim 4.

10. A resin which is a polymer of a monomer for producing a resin for a semiconductor manufacturing process, said monomer having a silicon atom,
wherein the monomer has a turbidity of 1 ppm or less based on JIS K0101:1998 using formazin as a reference material and an integrating sphere measurement system as a measurement system, and
the resin includes a repeating unit having an acid-decomposable group.

11. A method for producing the resin including a repeating unit having an acid-decomposable group according to claim 10, comprising polymerizing a monomer for producing a resin for a semiconductor manufacturing process, said monomer having a silicon atom,
wherein the monomer has a turbidity of 1 ppm or less based on JIS K0101:1998 using formazin as a reference material and an integrating sphere measurement system as a measurement system.

12. An actinic ray-sensitive or radiation-sensitive resin composition comprising the resin according to claim 10.

13. An actinic ray-sensitive or radiation-sensitive film formed using the actinic ray-sensitive or radiation-sensitive resin composition according to claim 12.

* * * * *